United States Patent
Muto et al.

(10) Patent No.: US 10,141,248 B2
(45) Date of Patent: Nov. 27, 2018

(54) SEMICONDUCTOR DEVICE AND MANUFACTURING METHOD THEREOF

(71) Applicant: Renesas Electronics Corporation, Koutou-ku, Tokyo (JP)

(72) Inventors: Akira Muto, Tokyo (JP); Koji Bando, Tokyo (JP); Yukihiro Sato, Tokyo (JP); Kazuhiro Mitamura, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/385,637

(22) Filed: Dec. 20, 2016

(65) Prior Publication Data

US 2017/0103940 A1    Apr. 13, 2017

Related U.S. Application Data

(63) Continuation of application No. 14/862,102, filed on Sep. 22, 2015, now Pat. No. 9,530,723.

(30) Foreign Application Priority Data

Sep. 25, 2014   (JP) ................................. 2014-194648

(51) Int. Cl.
| | |
|---|---|
| *H01L 23/495* | (2006.01) |
| *H01L 23/00* | (2006.01) |
| *H01L 23/544* | (2006.01) |
| *H01L 23/31* | (2006.01) |

(52) U.S. Cl.
CPC .... *H01L 23/49575* (2013.01); *H01L 23/3107* (2013.01); *H01L 23/49513* (2013.01); *H01L 23/49524* (2013.01); *H01L 23/49537* (2013.01); *H01L 23/49555* (2013.01);
(Continued)

(58) Field of Classification Search
CPC .......... H01L 23/49555; H01L 2224/90; H01L 24/33
See application file for complete search history.

(56) References Cited

U.S. PATENT DOCUMENTS

| | | | |
|---|---|---|---|
| 8,884,420 B1 * | 11/2014 | Hosseini | ........... H01L 23/49575 257/676 |
| 2011/0227205 A1 | 9/2011 | Lu et al. | |
| 2014/0084436 A1 | 3/2014 | Funatsu et al. | |

(Continued)

FOREIGN PATENT DOCUMENTS

| | | |
|---|---|---|
| JP | 2005-277231 A | 10/2005 |
| JP | 2013-004943 A | 1/2013 |

(Continued)

OTHER PUBLICATIONS

Extended European search report for European Patent Application No. 15184643.3, dated Mar. 8, 2016.

*Primary Examiner* — Moazzam Hossain
*Assistant Examiner* — Farun Lu
(74) *Attorney, Agent, or Firm* — Shapiro, Gabor and Rosenberger, PLLC

(57) ABSTRACT

On the assumption that a pair of hanging parts is provided in a lead frame and a clip includes a main body part and a pair of extension parts, the pair of the extension parts is mounted and supported on the pair of the hanging parts. Accordingly, the clip is mounted on a lead (one point) and the pair of the hanging parts (two points), and the clip is supported by the three points.

11 Claims, 48 Drawing Sheets

(52) U.S. Cl.
CPC .. *H01L 23/49562* (2013.01); *H01L 23/49565* (2013.01); *H01L 23/544* (2013.01); *H01L 24/33* (2013.01)

(56) References Cited

U.S. PATENT DOCUMENTS

2014/0367739 A1   12/2014   Muto et al.
2015/0145111 A1   5/2015    Mengel

FOREIGN PATENT DOCUMENTS

| JP | 2013004943 A | * | 1/2013 | ............. H01L 24/33 |
| JP | 2014-067880 A | | 4/2014 | |
| JP | 2015-002229 A | | 1/2015 | |

* cited by examiner

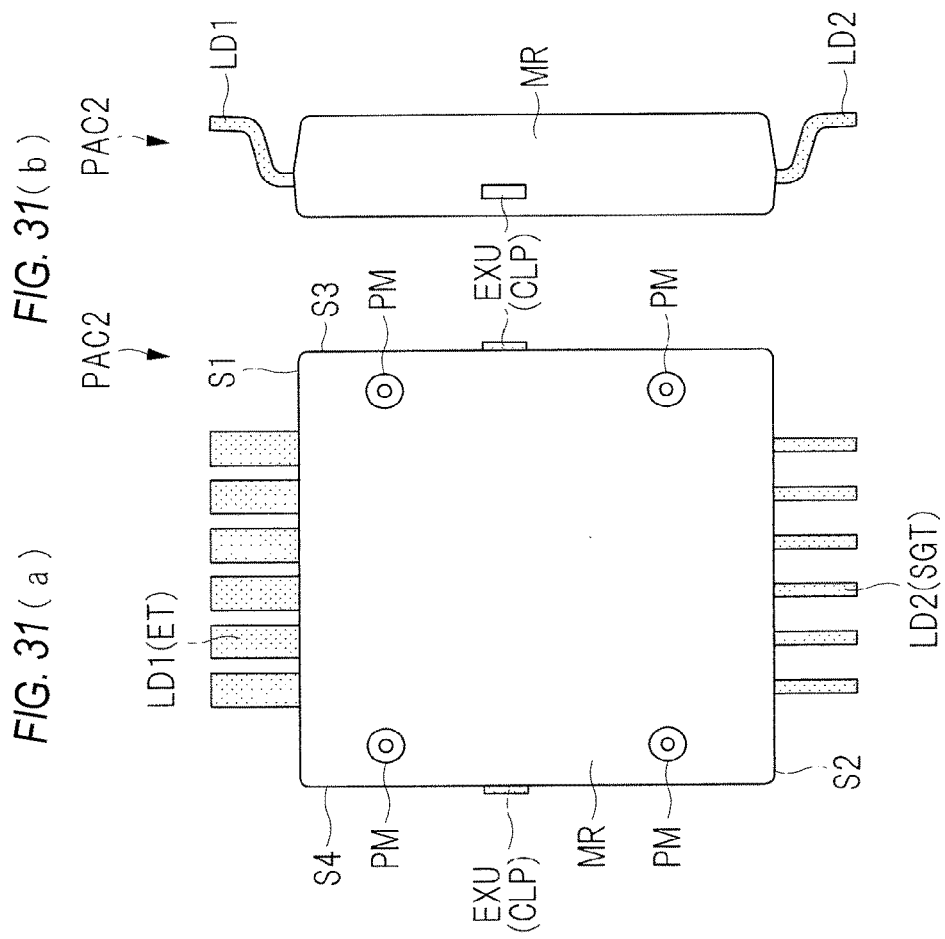

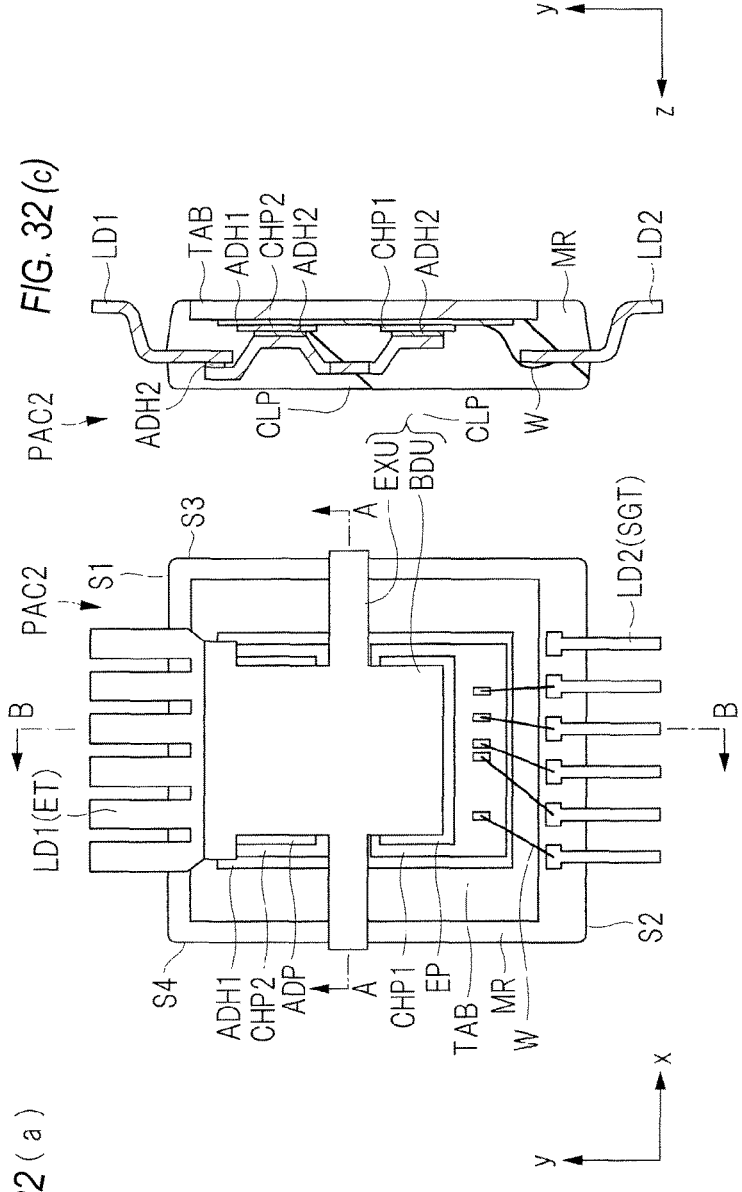
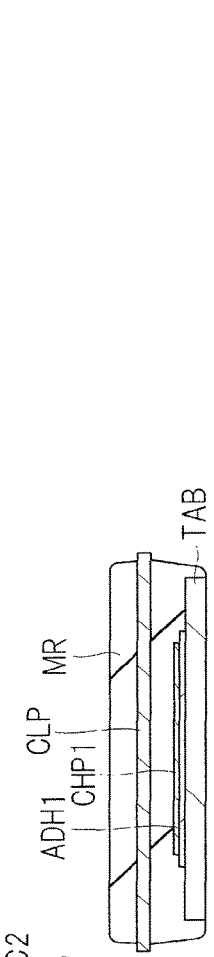
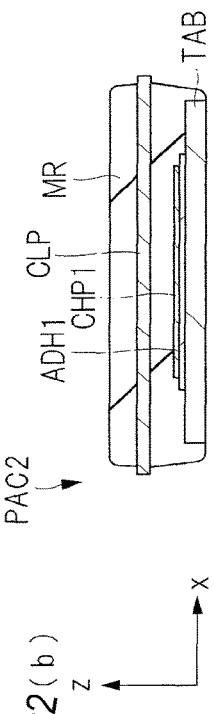
FIG. 32 (a)
FIG. 32 (b)
FIG. 32 (c)

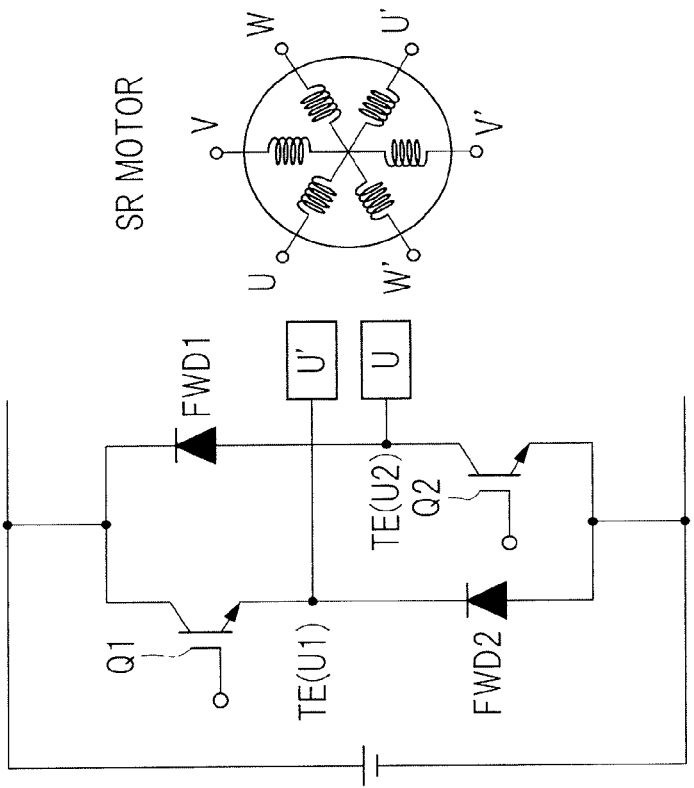
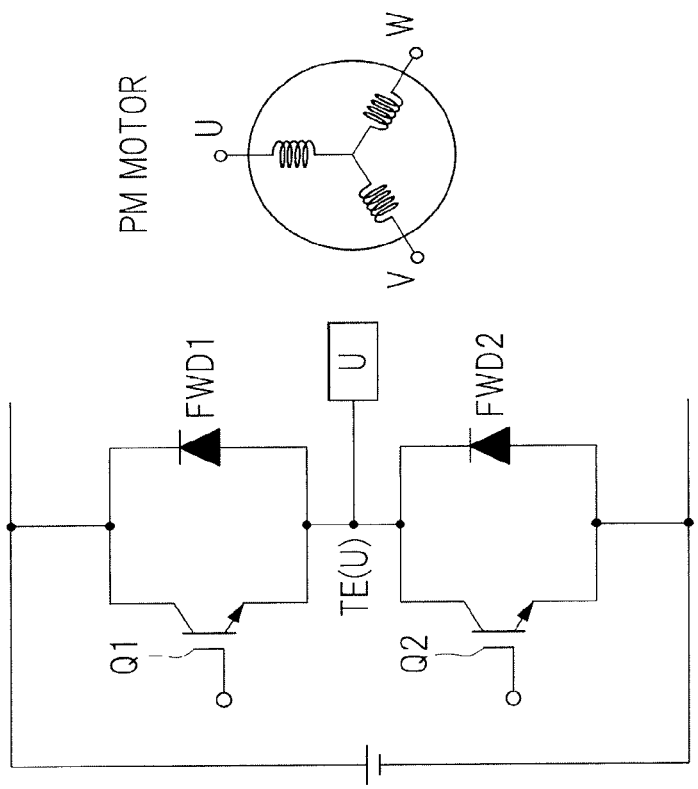
FIG. 39(a) INVERTER CIRCUIT FOR PM MOTOR (PART)
FIG. 39(b) INVERTER CIRCUIT FOR SR MOTOR (PART)

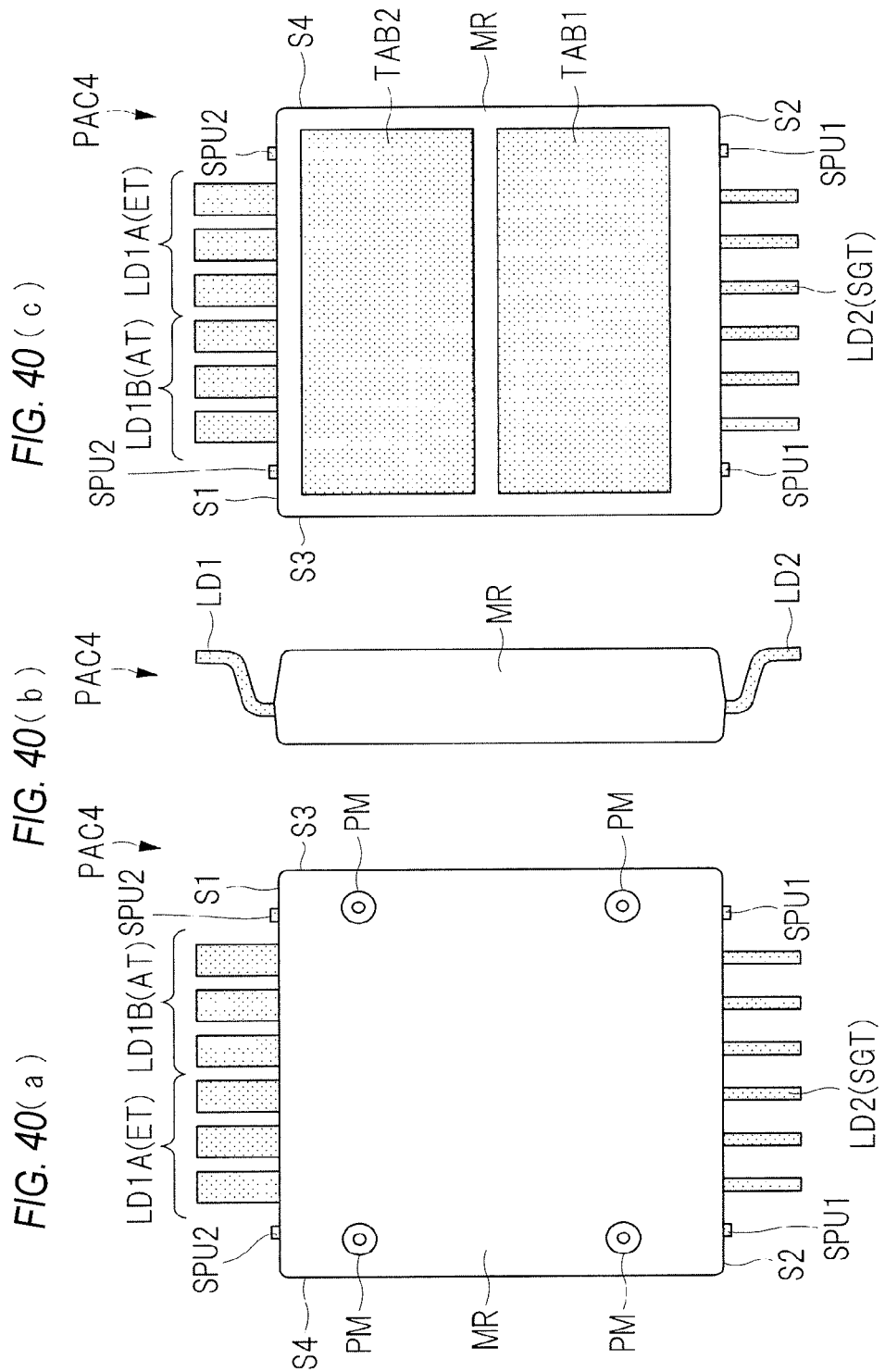

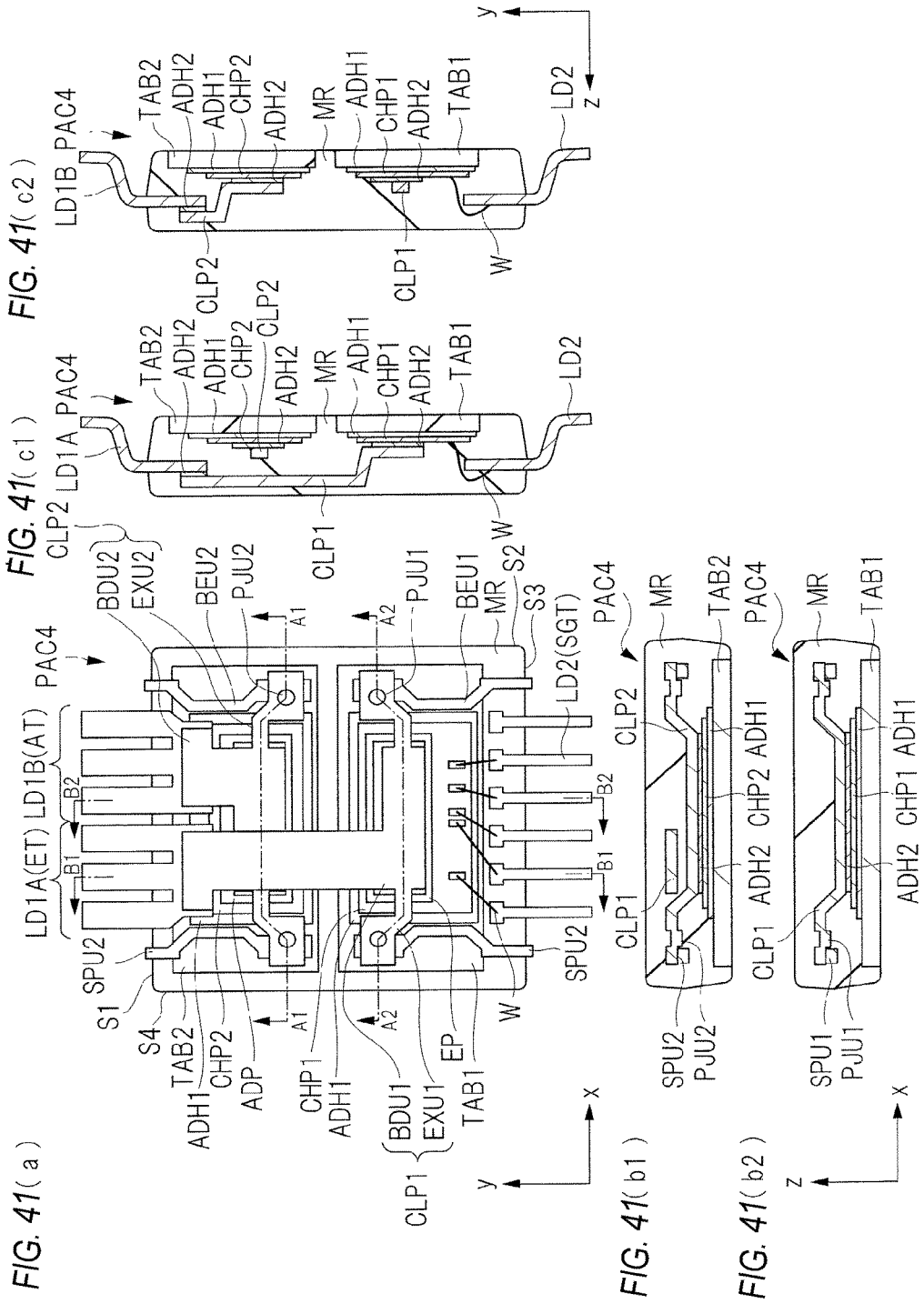

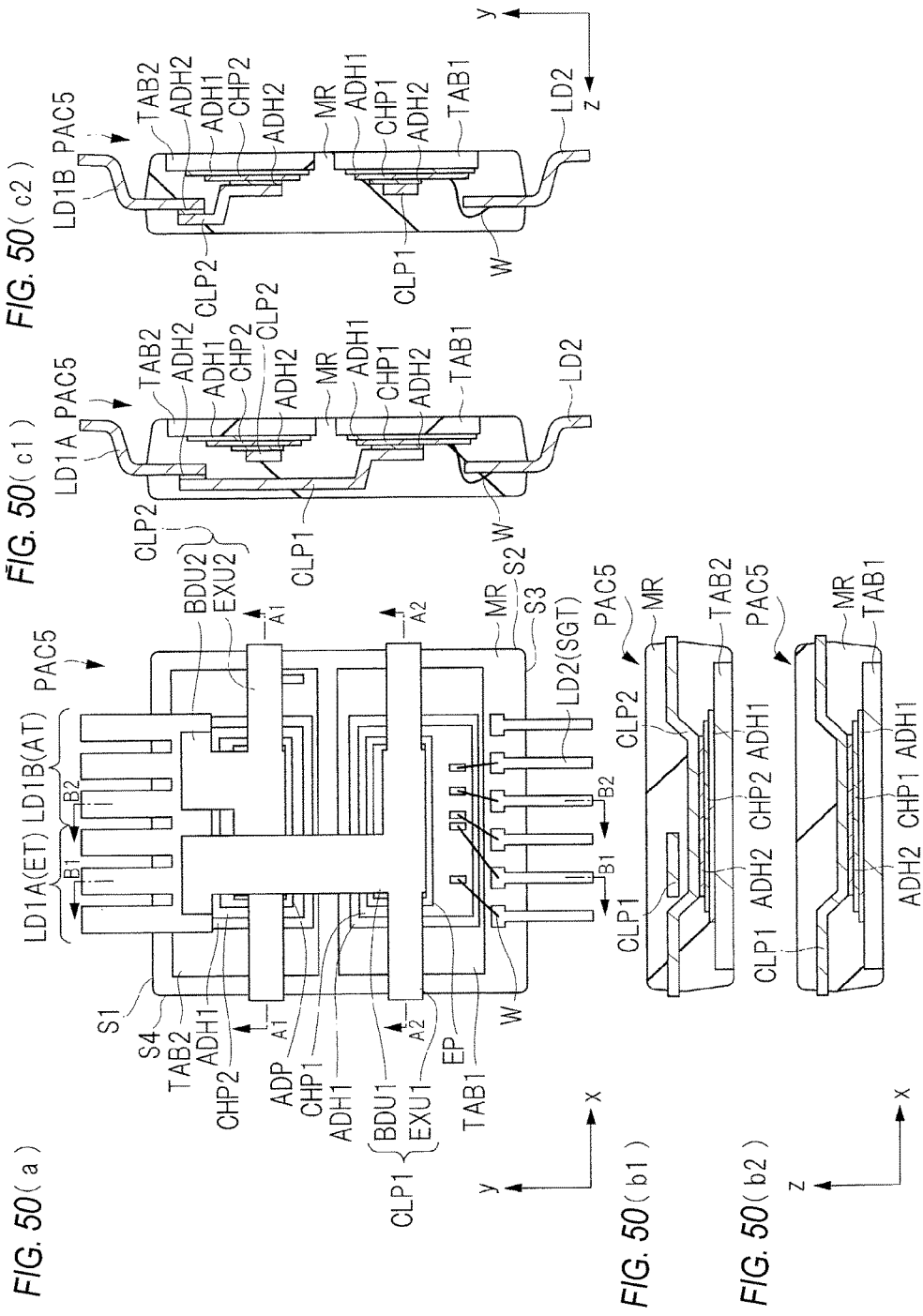

SEMICONDUCTOR DEVICE AND MANUFACTURING METHOD THEREOF

CROSS-REFERENCE TO RELATED APPLICATION

The present application claims priority from Japanese Patent Application No. 2014-194648 filed on Sep. 25, 2014, the content of which is hereby incorporated by reference into this application.

TECHNICAL FIELD OF THE INVENTION

The present invention relates to a semiconductor device and a manufacturing technique thereof, for example, a technique effectively applied to a semiconductor device functioning as a constituent element of an inverter and a manufacturing technique thereof.

BACKGROUND OF THE INVENTION

Japanese Patent Application Laid-Open Publication No. 2014-67880 (Patent Document 1) discloses a technique for improving a connection reliability of a semiconductor chip and a metal plate by sufficiently ensuring a thickness of a conductive material interposed between the semiconductor chip and the metal plate. Specifically, the Patent Document 1 discloses that a lead frame is disposed on a jig and a clip frame is disposed on a projection part provided in the jig. Thus, according to the technique disclosed in the Patent Document 1, it is possible to secure a sufficient space between the semiconductor chip and the metal plate.

SUMMARY OF THE INVENTION

For example, in a manufacturing process of a semiconductor device in which a chip mounting part for mounting a semiconductor chip is separated from a lead frame, the semiconductor device is sometimes conveyed in a state where the chip mounting part and the lead frame are connected by only a clip (metal plate) that connects the semiconductor chip mounted on the chip mounting part and the lead formed in the lead frame. In this case, there are concerns about damage to the semiconductor chip itself, damage to a connection portion between the semiconductor chip and the clip and a connection portion between the lead and the clip, deformation of the clip itself, and the like due to an impact and a vibration during the conveyance. Therefore, in a manufacturing process of a semiconductor device in which a chip mounting part for mounting a semiconductor chip is separated from a lead frame, it is desired to improve the reliability of a semiconductor device.

The other problems and novel characteristics will be apparent from the description of the present specification and the accompanying drawings.

A manufacturing method of a semiconductor device according to one embodiment includes: a step of arranging a main body part of a metal plate via a conductive adhesive so as to lie astride an electrode pad of a semiconductor chip and a lead and arranging a second hanging part of the metal plate on a first hanging part of a lead frame.

In addition, in a semiconductor device according to one embodiment, when seen in a plan view, a region where a support part which supports a metal plate overlaps an extension part of the metal plate is enclosed in a sealing member.

According to an embodiment, the reliability of the semiconductor device can be improved.

BRIEF DESCRIPTIONS OF THE DRAWINGS

Figure 20:
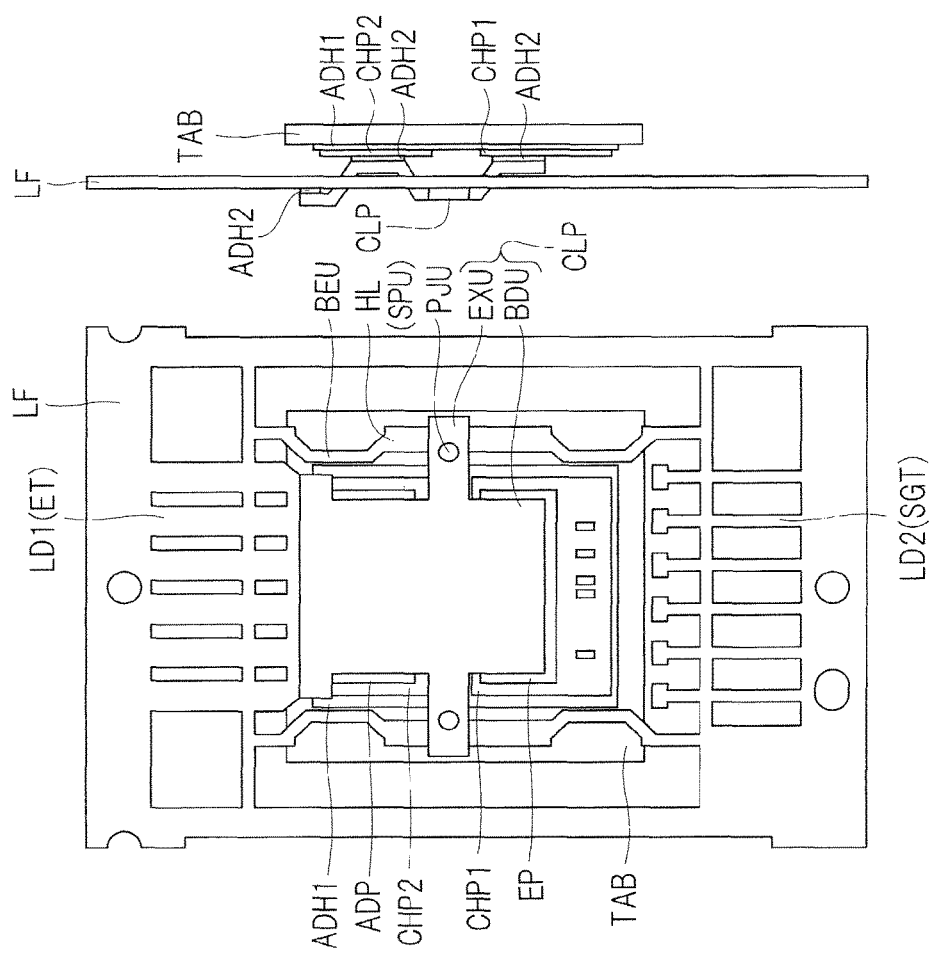
FIG. 20 is a diagram illustrating the manufacturing process of a semiconductor device continued from FIG. 19.
Figures 24A, 24B:
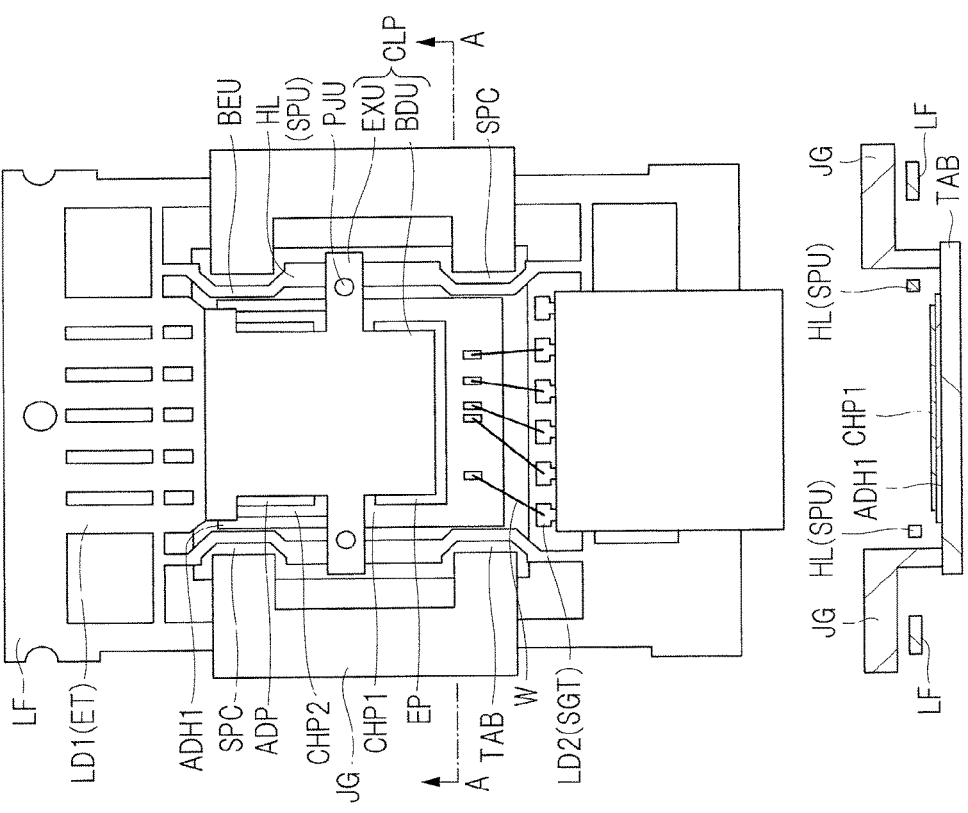
Figure 25:
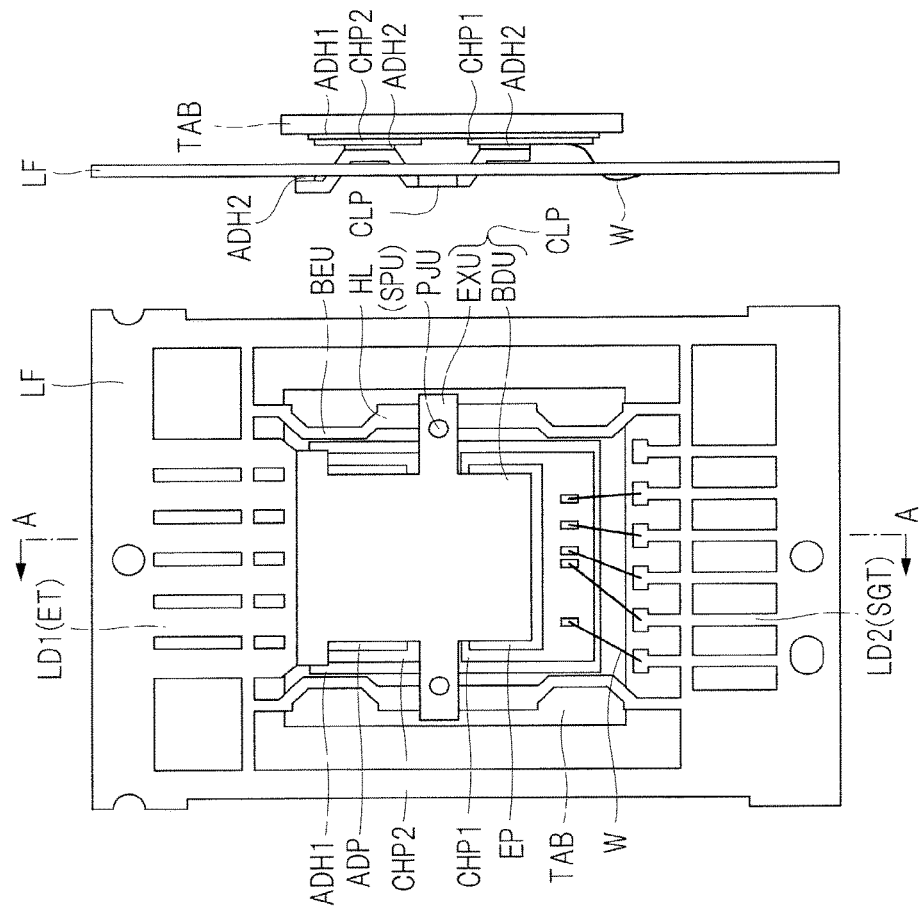
Figure 26:
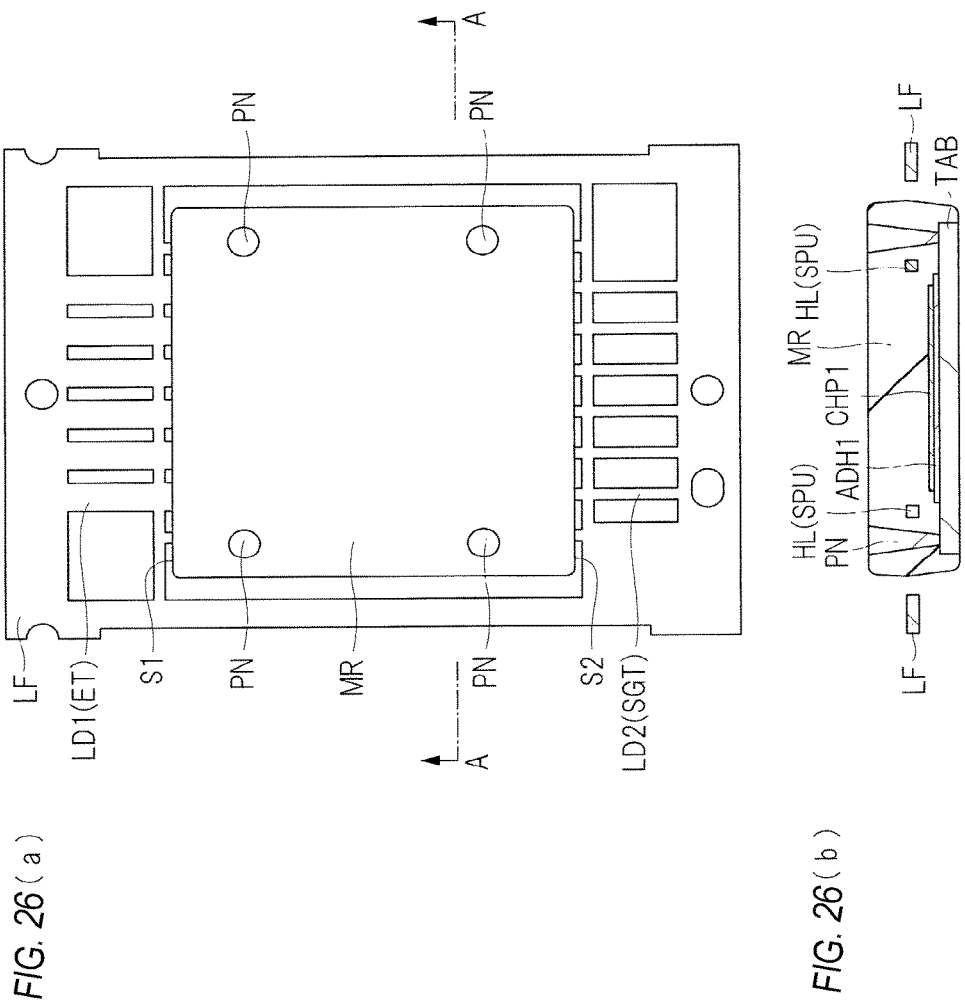
Figure 27:
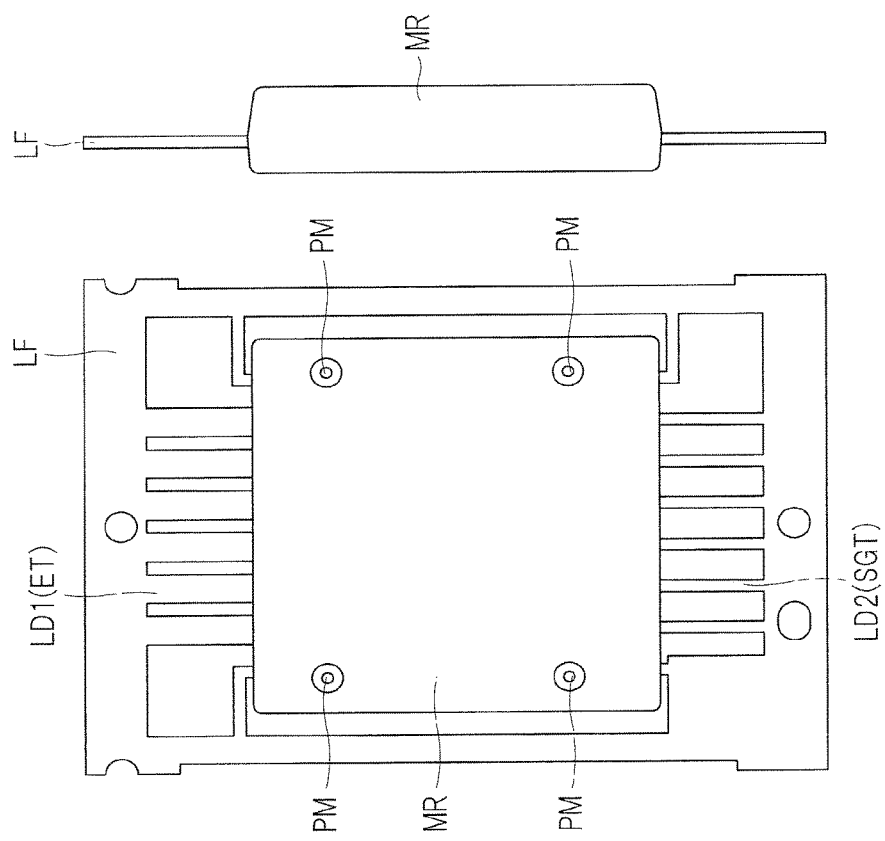
Figure 28:
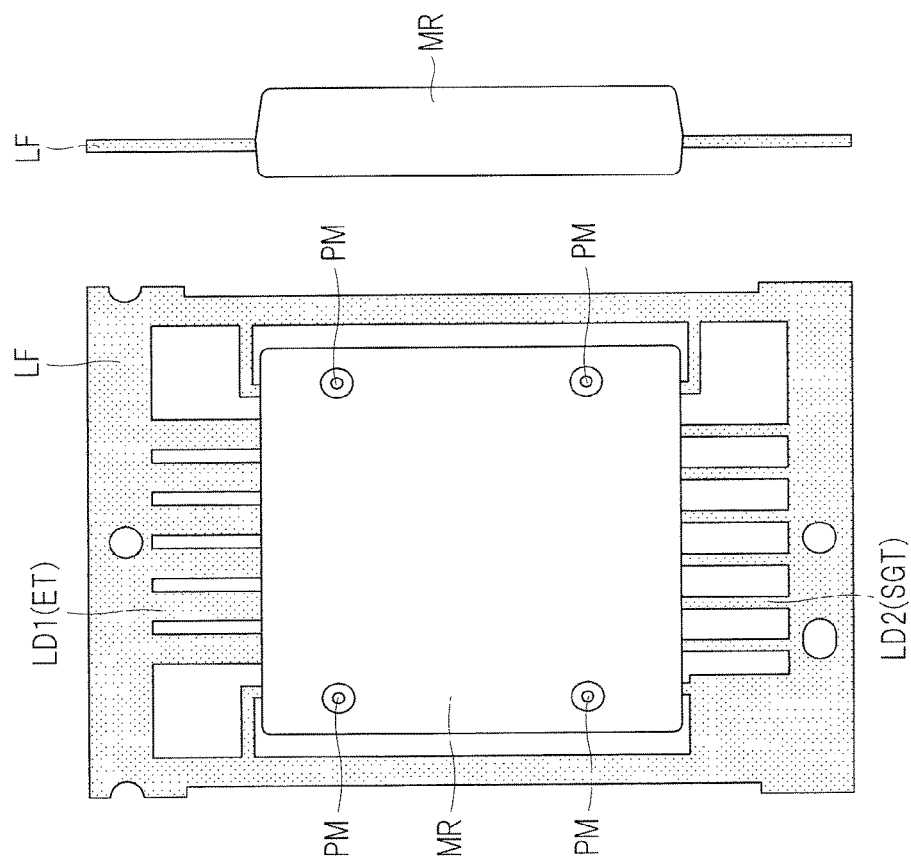
Figure 29:
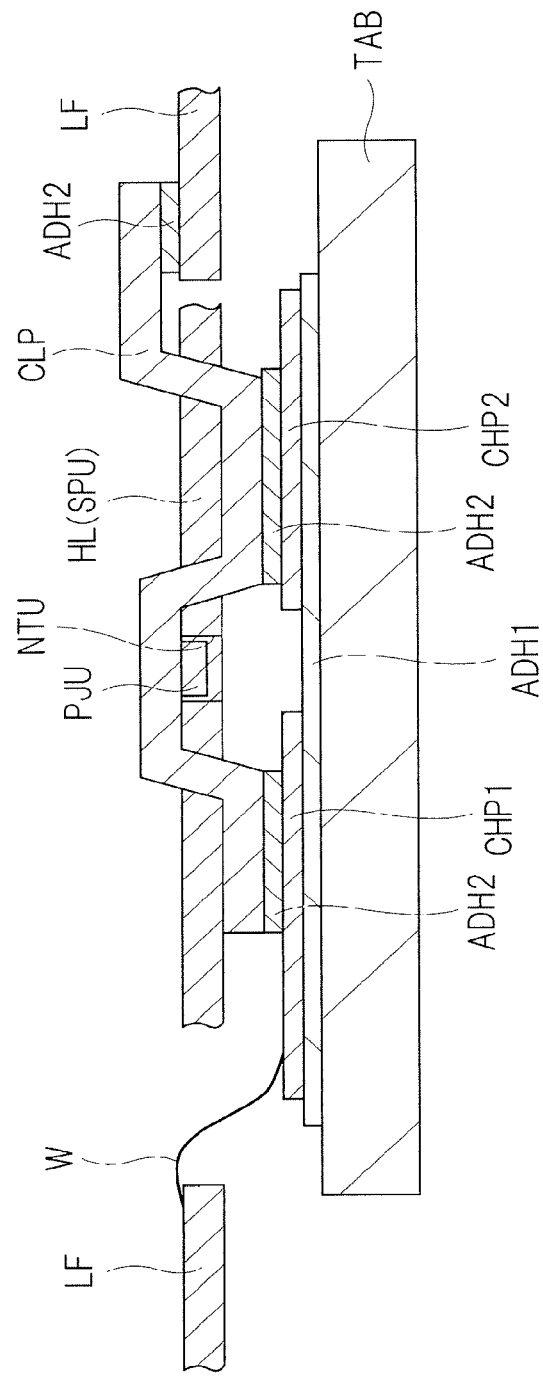
Figure 30A:
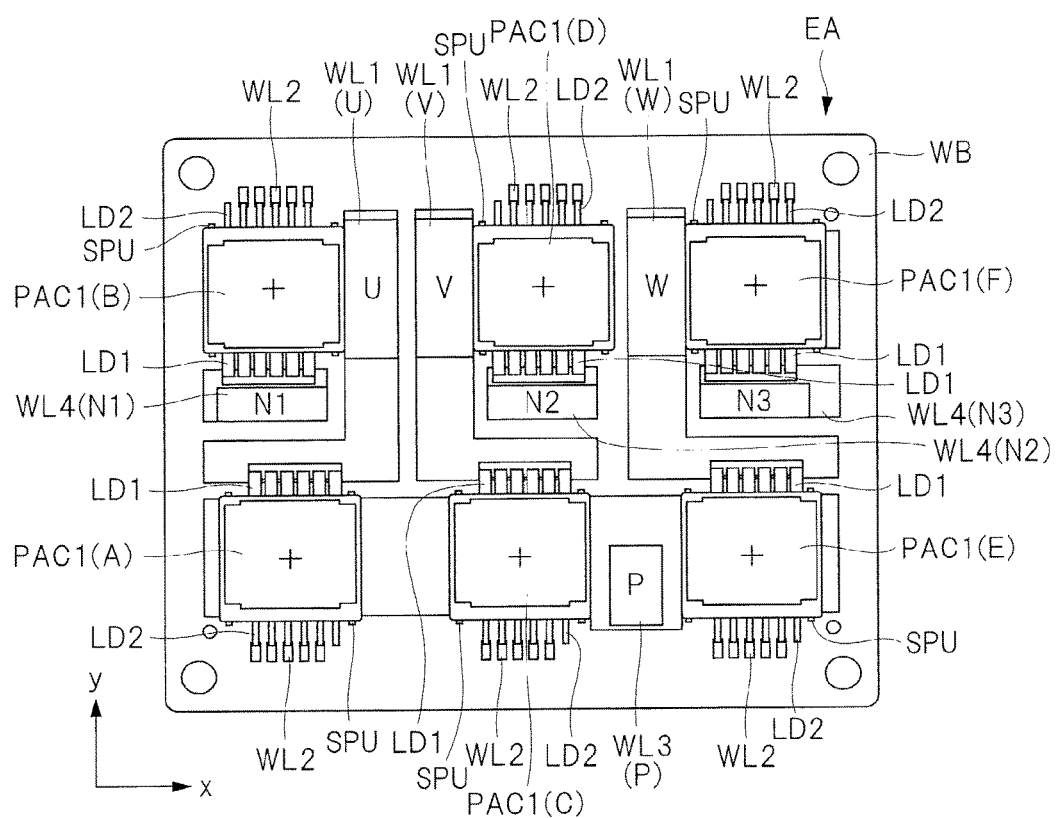
Figure 30B:
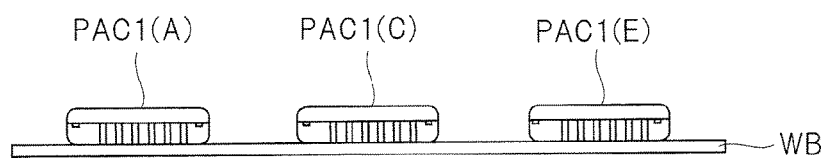
Figure 33:
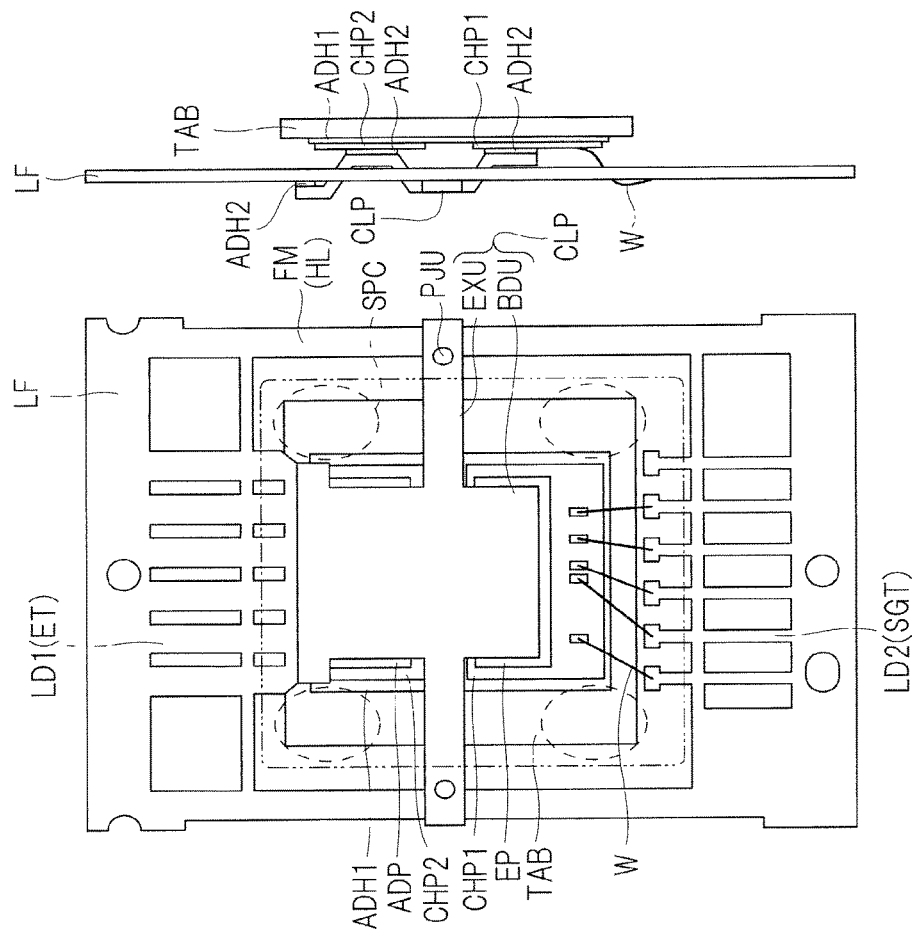
Figure 34:
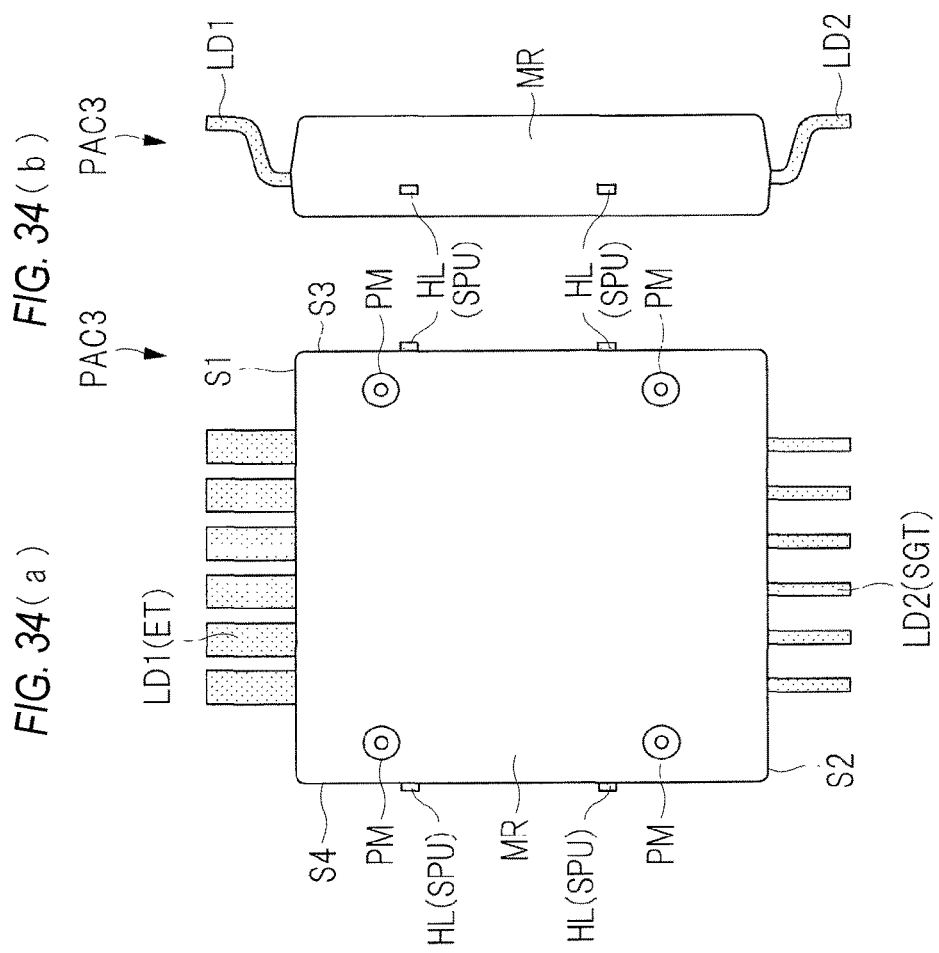
Figure 35:
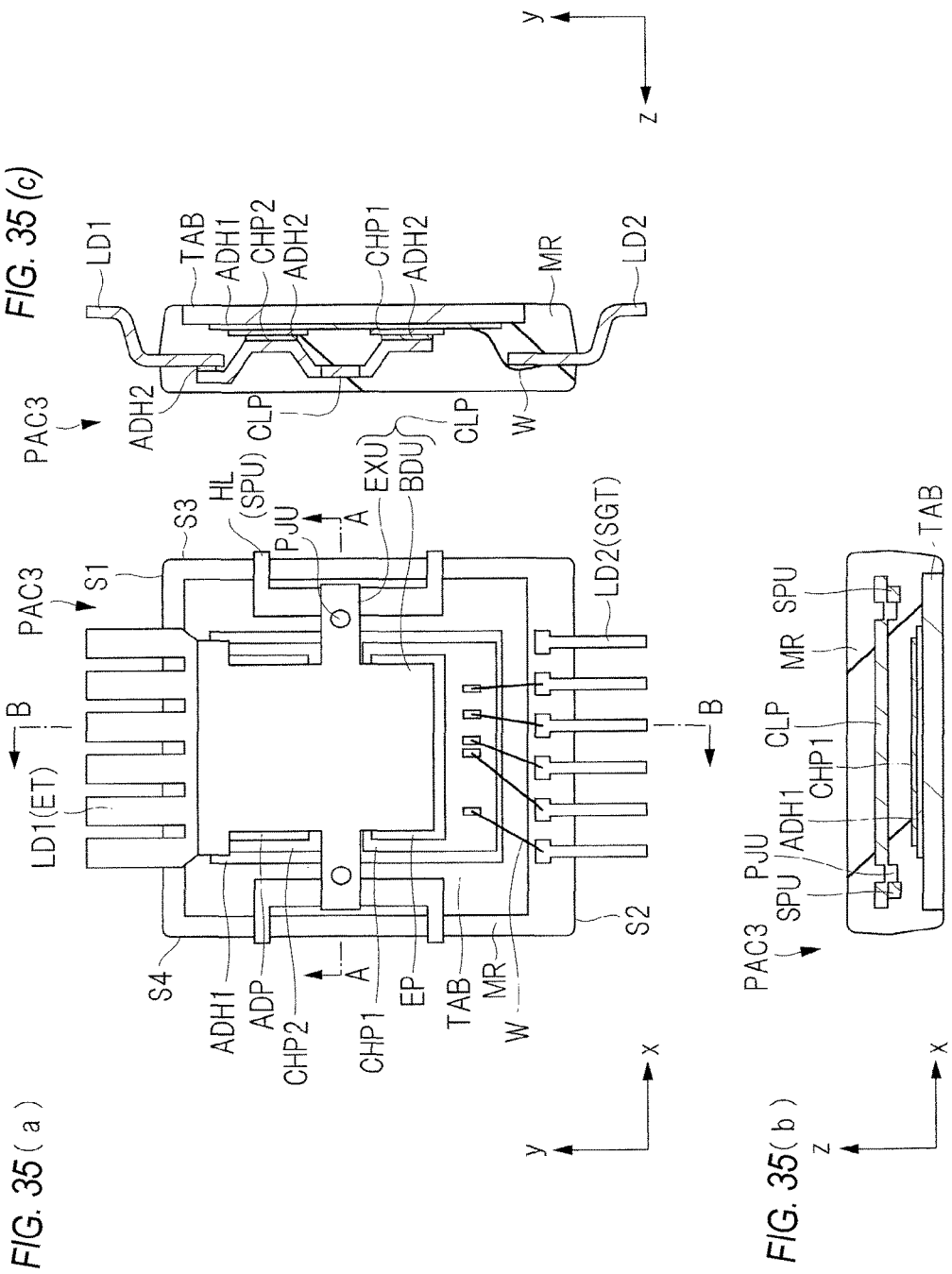
Figure 36:
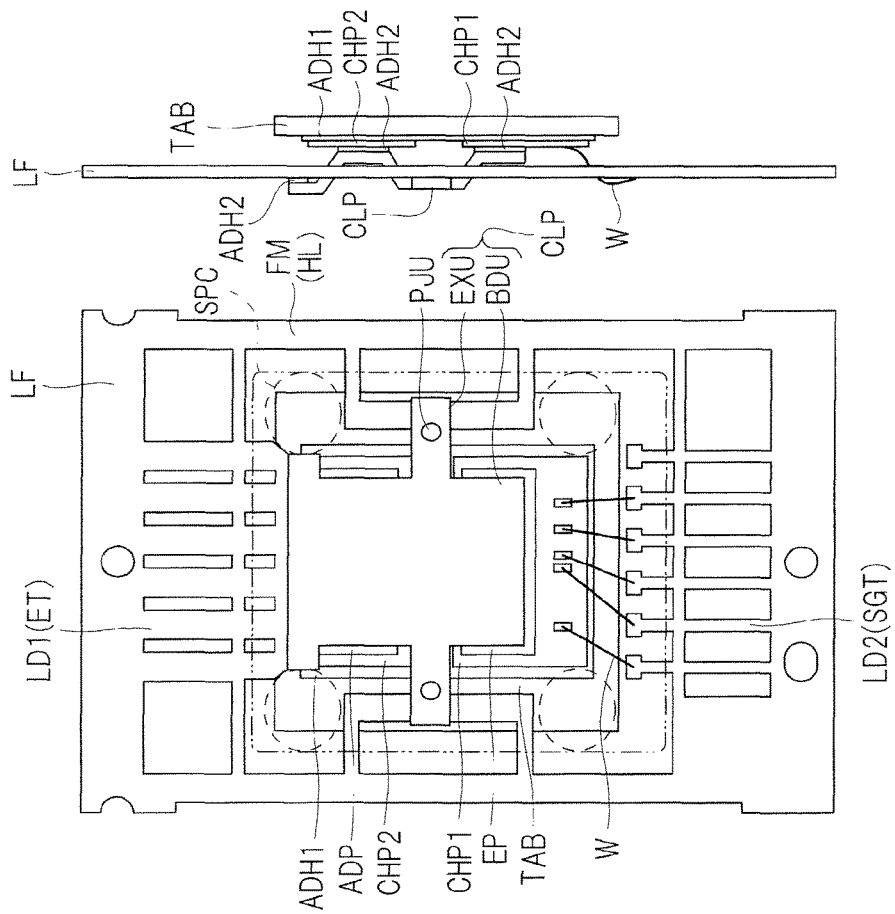
Figure 37:
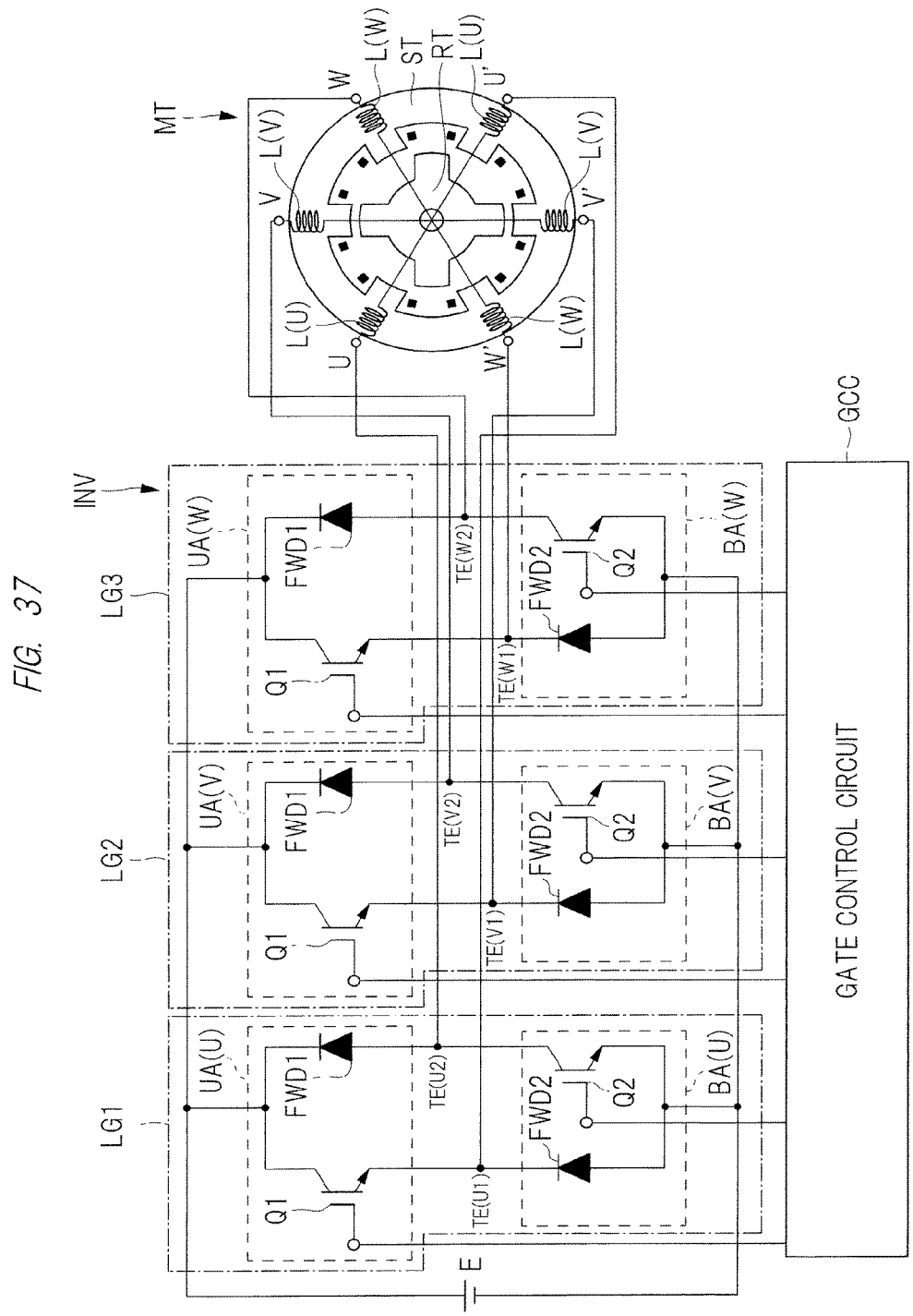
Figure 38:
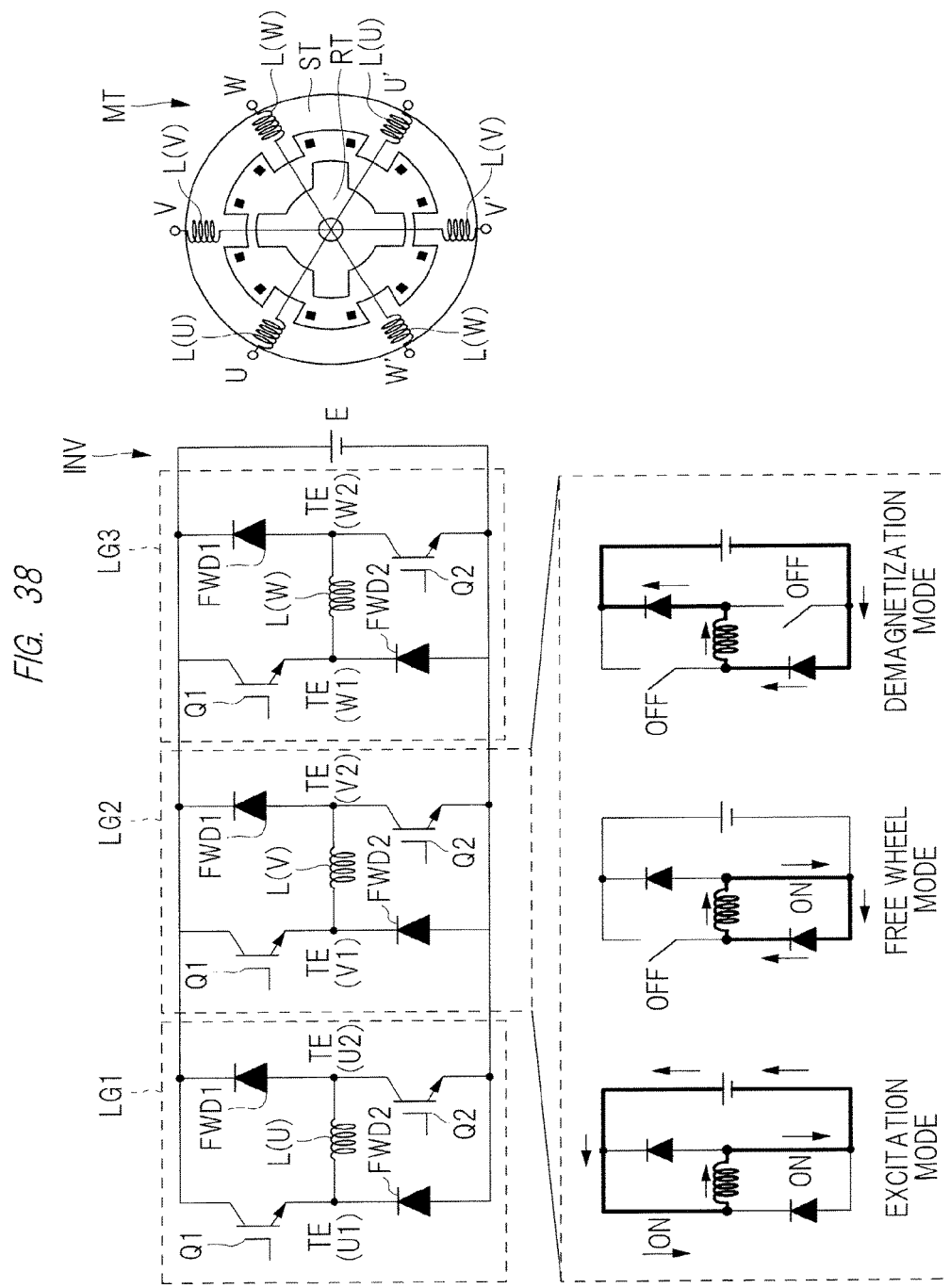
Figure 42:
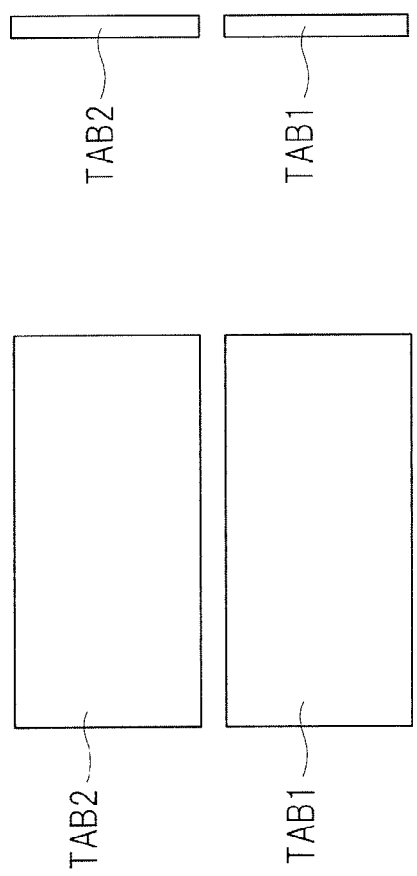
Figure 43:
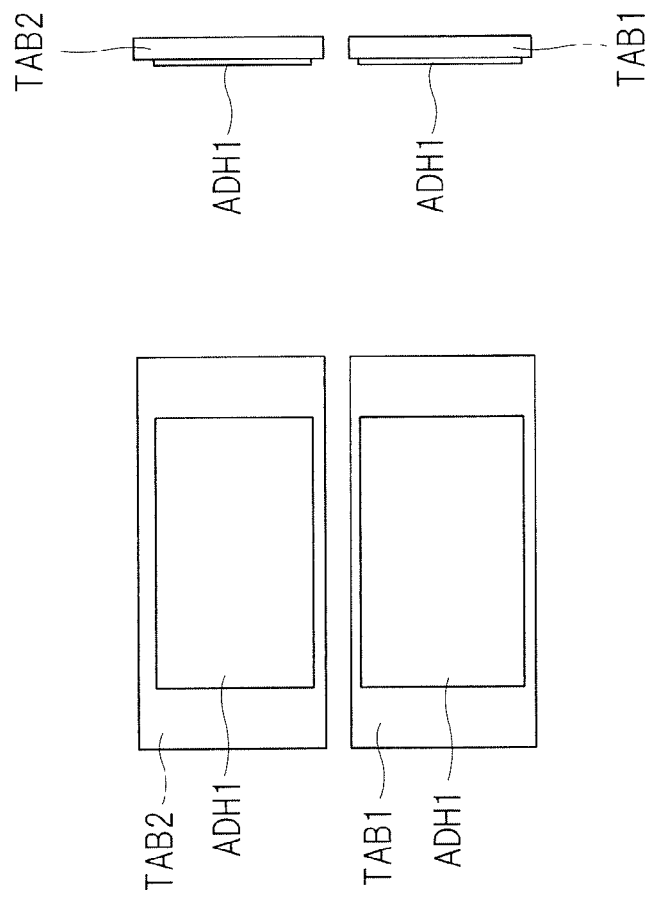
Figure 44:
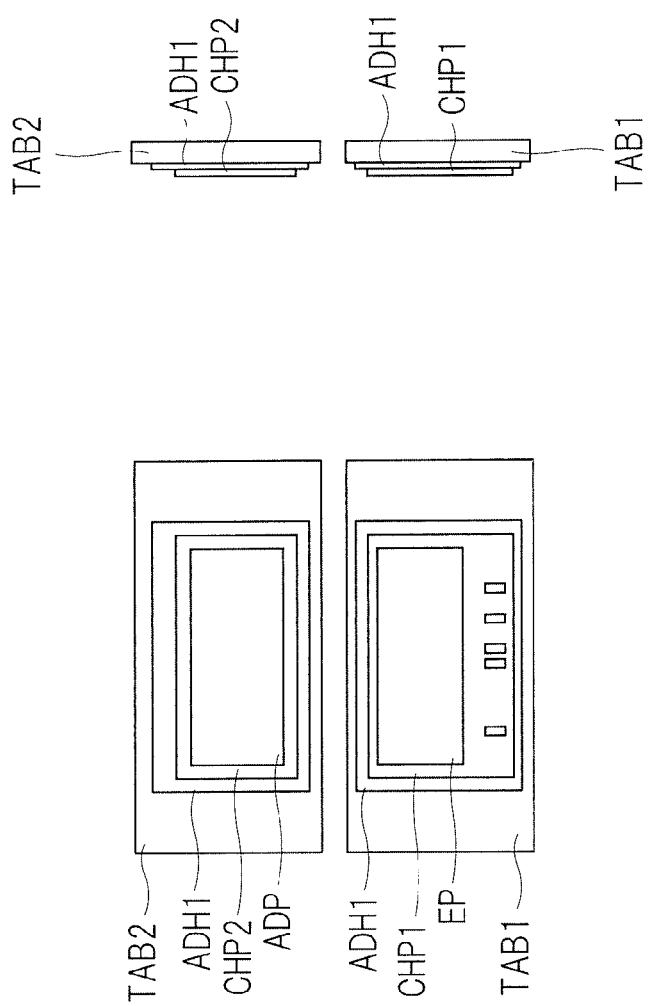
Figure 45:
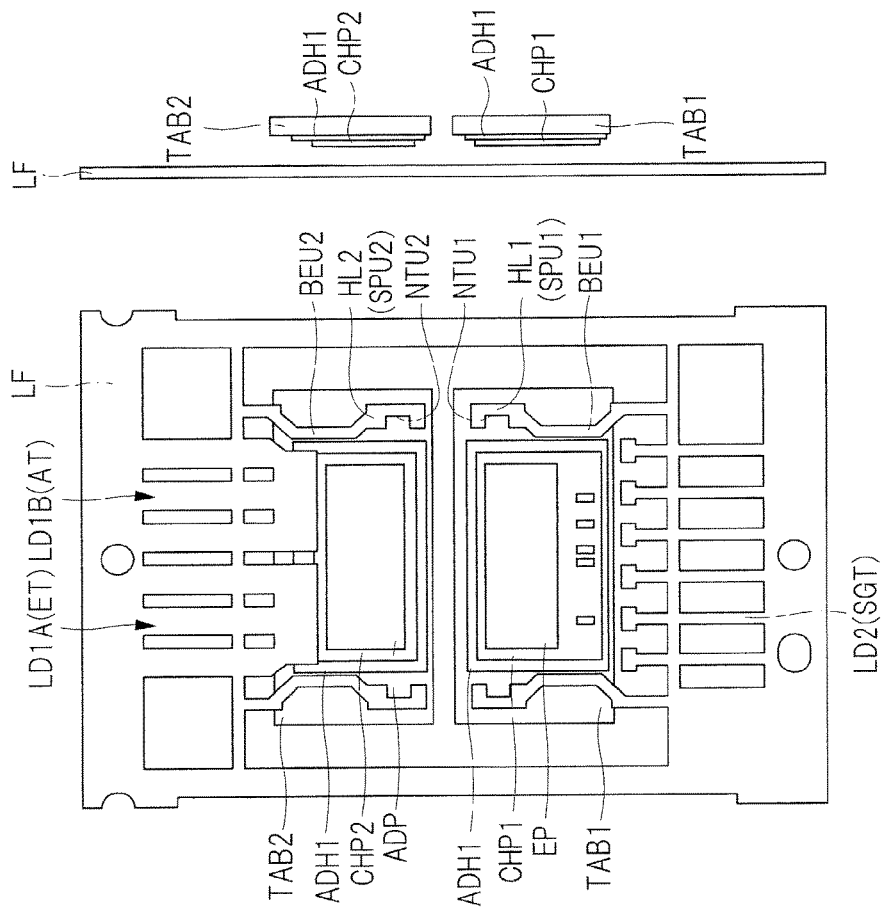
Figure 46:
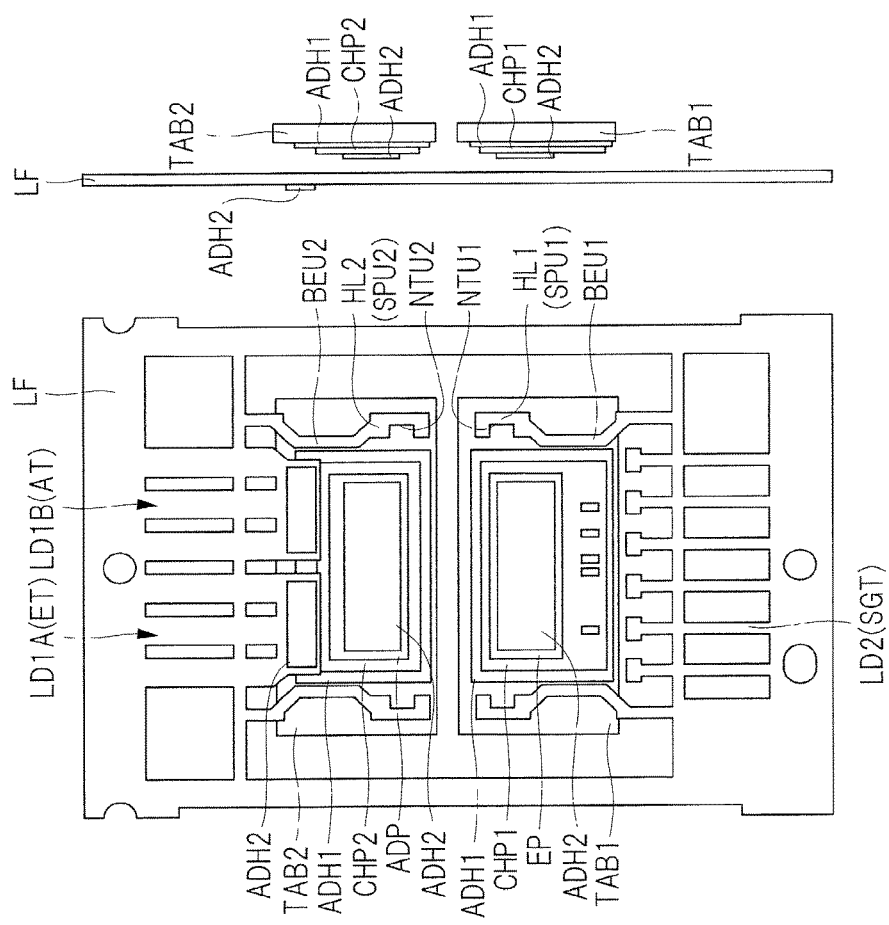
Figure 47:
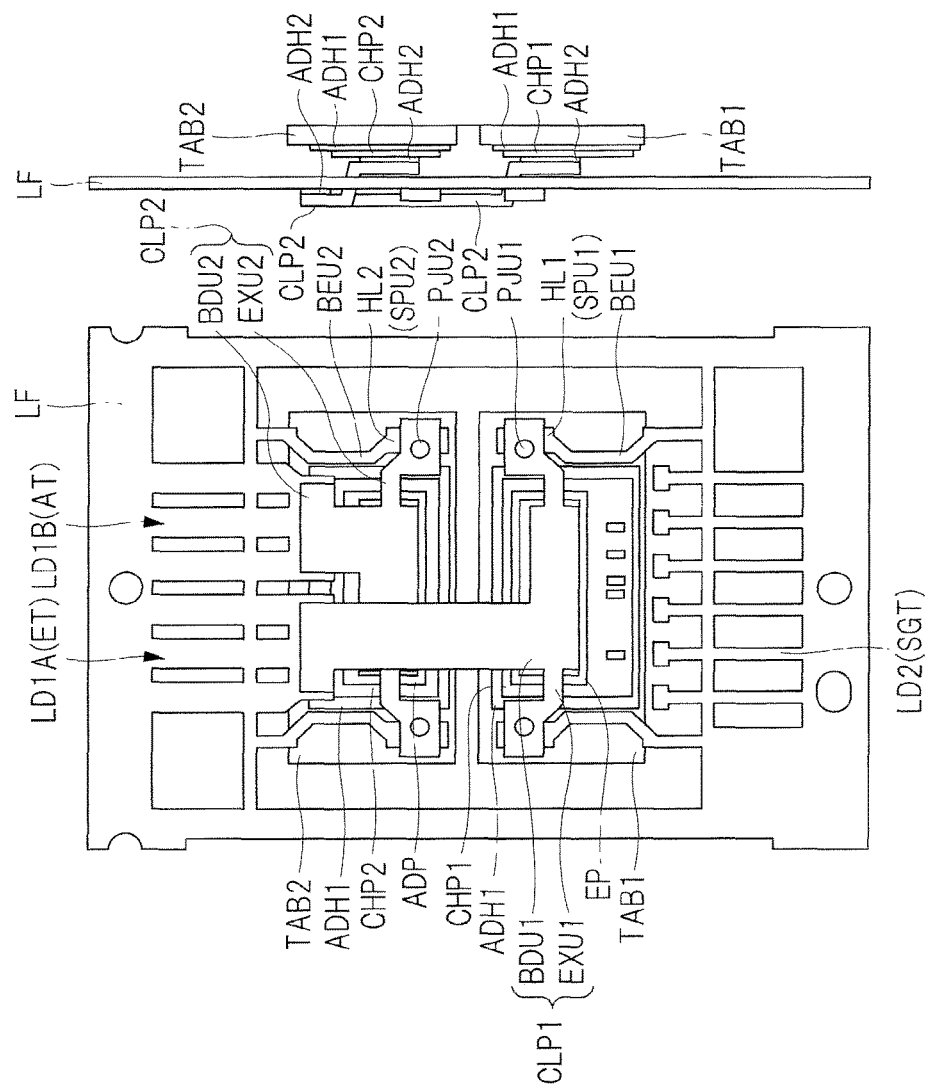
Figure 48:
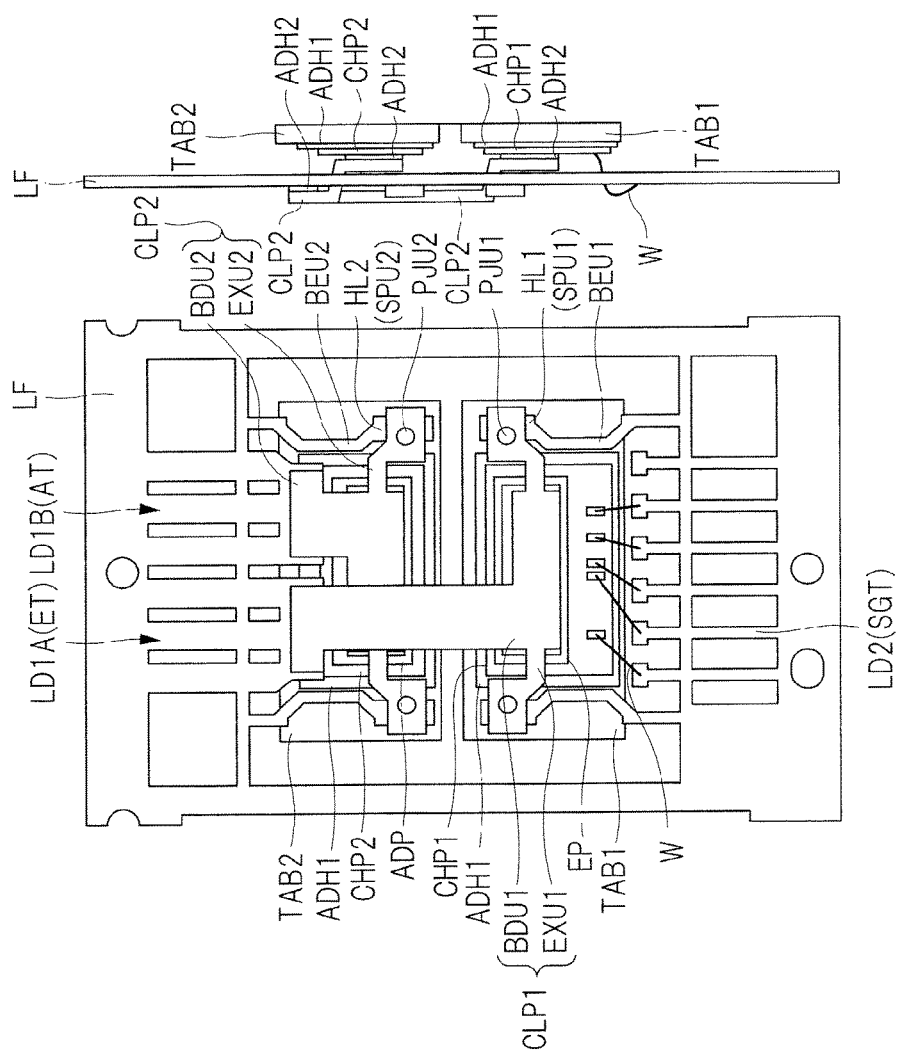
Figures 49A, 49B:
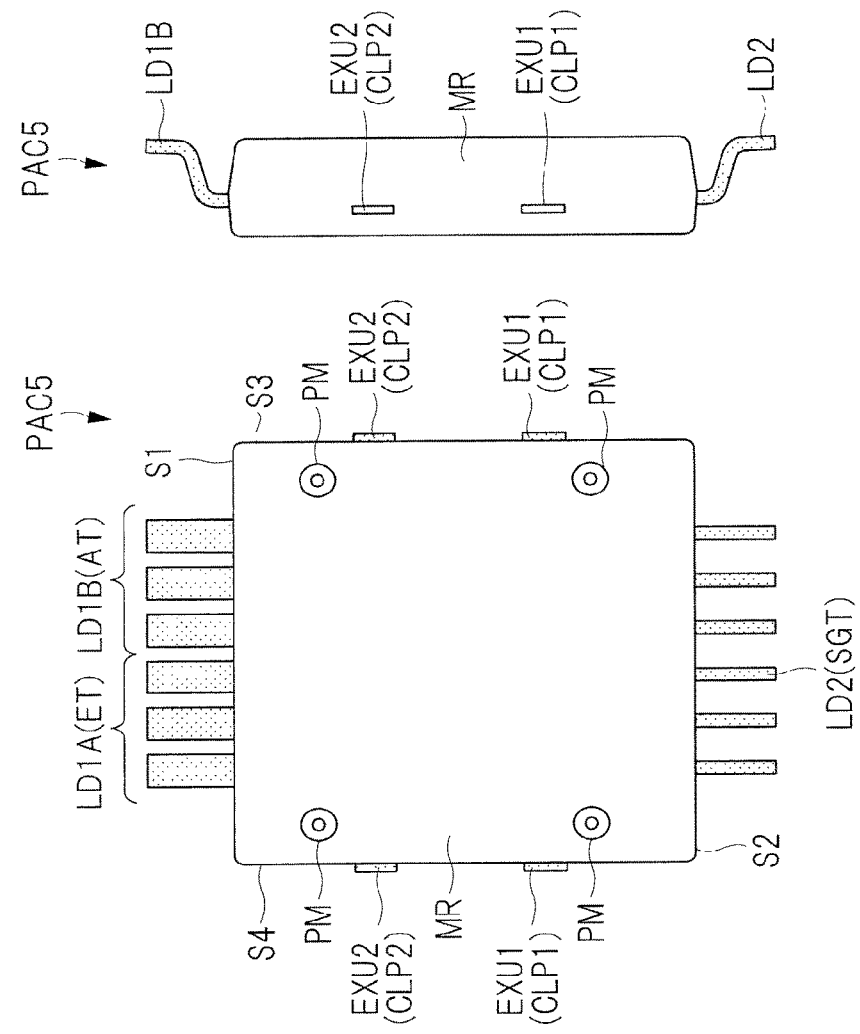
Figure 51:
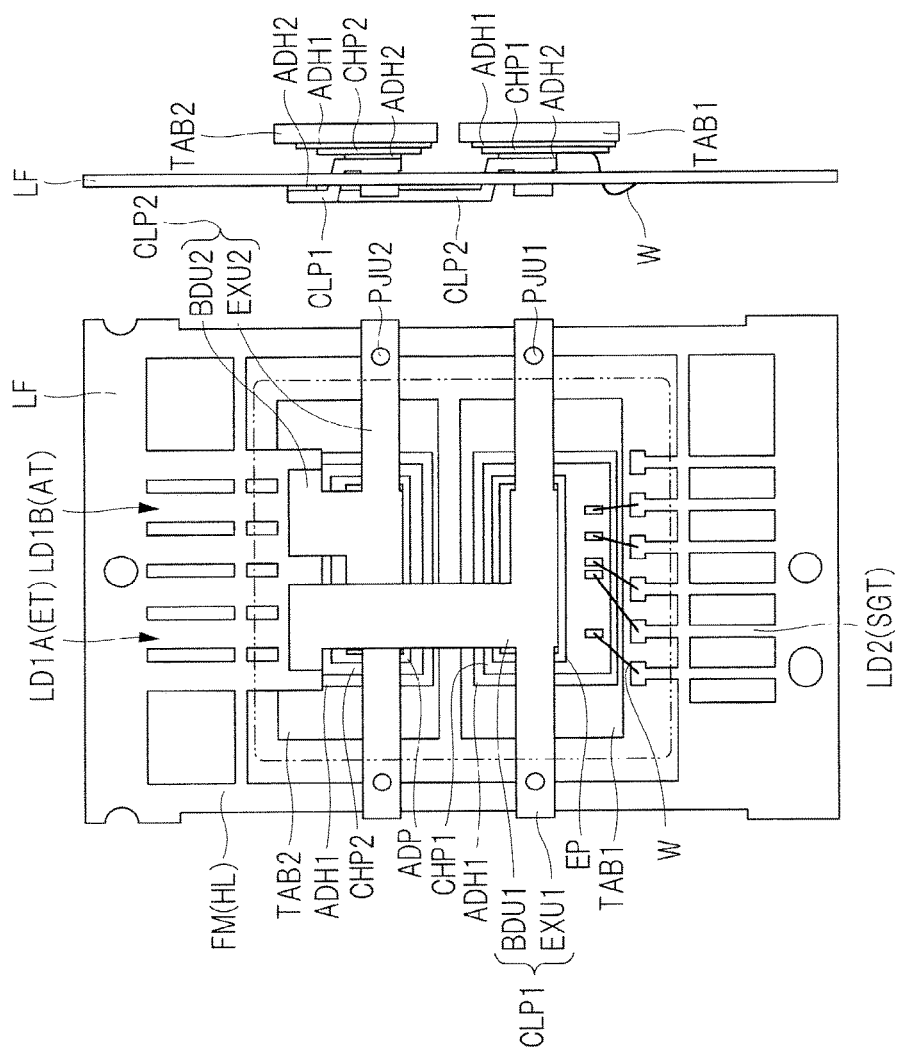

FIGS. 24(a) and 24(b) are diagrams to illustrate the manufacturing process of a semiconductor device continued from FIG. 20;

FIG. 25 is a diagram illustrating the manufacturing process of a semiconductor device continued from FIGS. 24(a) and 24(b);

FIGS. 26(a) and 26(b) are diagrams to illustrate the manufacturing process of a semiconductor device continued from FIG. 25;

FIG. 27 is a diagram illustrating the manufacturing process of a semiconductor device continued from FIGS. 26(a) and 26(b);

FIG. 28 is a diagram illustrating the manufacturing process of a semiconductor device continued from FIG. 27;

FIG. 29 is a cross-sectional view taken along a line A-A of FIG. 25;

FIGS. 30(a) and 30(b) are diagrams to illustrate a configuration of an electronic device according to the first embodiment;

FIG. 31(a) is a top view illustrating an external configuration of a semiconductor device according to a modification example 1, and FIG. 31(b) is a side view;

FIG. 32(a) is a plan view illustrating an internal structure of a sealing member of the semiconductor device according to the modification example 1, FIG. 32(b) is a cross-sectional view taken along a line A-A of FIG. 32(a), and FIG. 32(c) is a cross-sectional view taken along a line B-B of FIG. 32(a);

FIG. 33 is a diagram illustrating a state after a clip mounting process and a wire bonding process are performed in a manufacturing method of a semiconductor device according to the modification example 1;

FIG. 34(a) is a top view illustrating an external configuration of a semiconductor device according to a modification example 2, and FIG. 34(b) is a side view;

FIG. 35(a) is a plan view illustrating an internal structure of a sealing member of the semiconductor device according to the modification example 2, FIG. 35(b) is a cross-sectional view taken along a line A-A of FIG. 35(a), and FIG. 35(c) is a cross-sectional view taken along a line B-B of FIG. 35(a);

FIG. 36 is a diagram illustrating a state after a clip mounting process and a wire bonding process are performed in a manufacturing method of a semiconductor device according to the modification example 2;

FIG. 37 is a circuit diagram in which an inverter circuit is disposed between a DC power source and an SR motor;

FIG. 38 is a diagram for describing an operation of an inverter circuit according to the second embodiment;

FIG. 39(a) is a diagram illustrating a part of an inverter circuit for a PM motor, and FIG. 39(b) is a diagram illustrating a part of an inverter circuit for an SR motor;

FIG. 40(a) is a top view illustrating an external configuration of the semiconductor device according to the second embodiment, FIG. 40(b) is a side view, and FIG. 40(c) is a bottom view;

FIG. 41(a) is a plan view illustrating an internal structure of the semiconductor device according to the second embodiment, FIG. 41(b1) is a cross-sectional view taken along a line A1-A1 of FIG. 41(a), FIG. 41(b2) is a cross-sectional view taken along a line A2-A2 of FIG. 41(a), FIG. 41(c1) is a cross-sectional view taken along a line B1-B1 of FIG. 41(a), and FIG. 41(c2) is a cross-sectional view taken along a line B2-B2 of FIG. 41(a);

FIG. 42 is a diagram illustrating a manufacturing process of a semiconductor device according to the second embodiment;

FIG. 43 is a diagram illustrating the manufacturing process of a semiconductor device continued from FIG. 42;

FIG. 44 is a diagram illustrating the manufacturing process of a semiconductor device continued from FIG. 43;

FIG. 45 is a diagram illustrating the manufacturing process of a semiconductor device continued from FIG. 44;

FIG. 46 is a diagram illustrating the manufacturing process of a semiconductor device continued from FIG. 45;

FIG. 47 is a diagram illustrating the manufacturing process of a semiconductor device continued from FIG. 46;

FIG. 48 is a diagram illustrating the manufacturing process of a semiconductor device continued from FIG. 47;

FIG. 49(a) is a top view illustrating an external configuration of a semiconductor device according to a modification example, and FIG. 49(b) is a side view;

FIG. 50(a) is a plan view illustrating an internal structure of a sealing member of the semiconductor device according to the modification example, FIG. 50(b1) is a cross-sectional view taken along a line A1-A1 of FIG. 50(a), FIG. 50(b2) is a cross-sectional view taken along a line A2-A2 of FIG. 50(a), FIG. 50(c1) is a cross-sectional view taken along a line B1-B1 of FIG. 50(a), and FIG. 50(c2) is a cross-sectional view taken along a line B2-B2 of FIG. 50(a); and FIG. 51 is a diagram illustrating a state after a clip mounting process and a wire bonding process are performed in a manufacturing method of a semiconductor device according to the modification example.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, the same components are denoted by the same reference characters throughout the drawings for describing the embodiments, and the repetitive description thereof is omitted. Note that hatching is sometimes used even in a plan view so as to make the drawings easy to see.

First Embodiment

An inverter circuit is a circuit that converts DC power into AC power. For example, when plus and minus of a DC power source are alternately output, a direction of a current is reversed accordingly. In this case, since the direction of the current is alternately reversed, the output can be considered as AC power. This is the principle of the inverter circuit. Here, as the AC power, there are various forms such as those represented by single-phase AC power and three-phase AC power. Thus, in the description of the first embodiment, in particular, a three-phase inverter circuit that converts DC power into three-phase AC power is taken as an example. However, the technical idea of the first embodiment is not limited to the application to the three-phase inverter circuit and can be widely applied to, for example, a single-phase inverter circuit and others.

<Configuration of Three-Phase Inverter Circuit>

Figure 1:
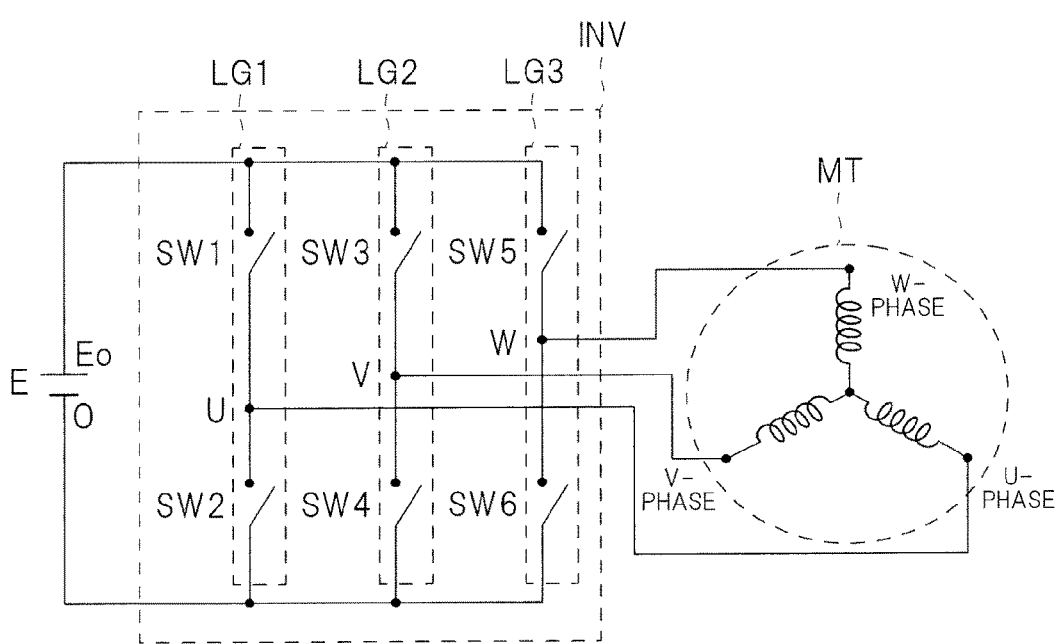
FIG. 1 is a circuit diagram in which a three-phase inverter circuit is disposed between a DC power source and a three-phase induction motor.

FIG. 1 is a circuit diagram in which a three-phase inverter circuit INV is disposed between a DC power source E and a three-phase induction motor MT. In the first embodiment, a permanent magnet synchronous motor (hereinafter, simply referred to as a PM motor) will be described as an example of the three-phase induction motor MT. As illustrated in FIG. 1, the three-phase inverter circuit INV made up of six switches SW1 to SW6 is used for converting DC power from the DC power source E into three-phase AC power. Specifically, as illustrated in FIG. 1, the three-phase inverter circuit INV includes a first leg LG1 in which the switch SW1 and the switch SW2 are connected in series, a second leg LG2 in which the switch SW3 and the switch SW4 are connected in series, and a third leg LG3 in which the switch SW5 and the switch SW6 are connected in series, and the first to third legs LG1 to LG3 are connected in parallel. At this time, the switch SW1, the switch SW3 and the switch SW5 constitute an upper arm, and the switch SW2, the switch SW4 and the switch SW6 constitute a lower arm.

Also, a point U between the switch SW1 and the switch SW2 is connected to a U-phase of the three-phase induction motor MT. Similarly, a point V between the switch SW3 and the switch SW4 is connected to a V-phase of the three-phase induction motor MT, and a point W between the switch SW5 and the switch SW6 is connected to a W-phase of the three-phase induction motor MT. In this way, the three-phase inverter circuit INV is configured.

<Operation of Three-Phase Inverter Circuit>

Figure 2:
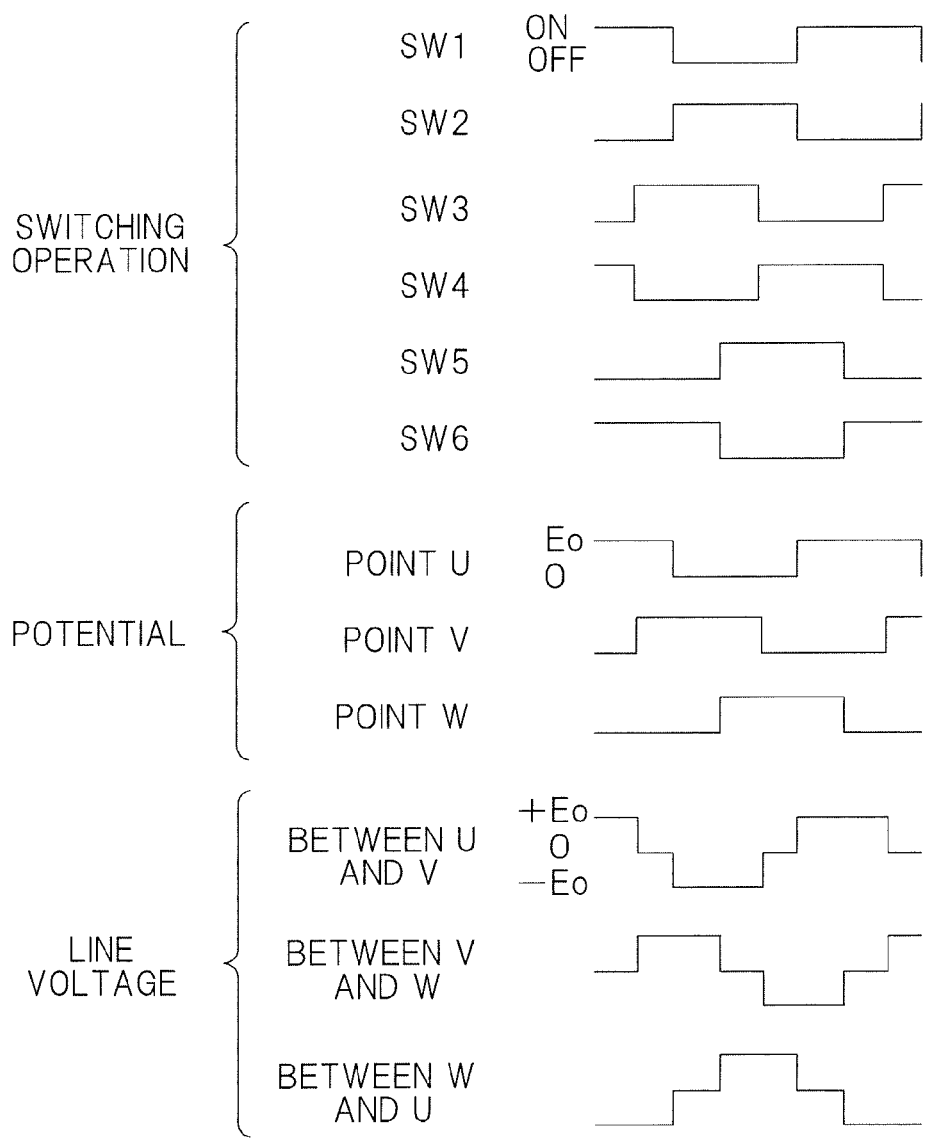
FIG. 2 is a timing chart for describing an operation of the three-phase inverter circuit.

Next, the operation of the three-phase inverter circuit INV having the above-described configuration will be described. FIG. 2 is a timing chart for describing the operation of the three-phase inverter circuit INV. In FIG. 2, the switching operation of the switch SW1 and the switch SW2 in the three-phase inverter circuit INV is performed in such a manner that the switch SW2 is turned off when the switch SW1 is turned on, while the switch SW2 is turned on when the switch SW1 is turned off. Similarly, the switching operation of the switch SW3 and the switch SW4 in the three-phase inverter circuit INV is performed in such a manner that the switch SW4 is turned off when the switch SW3 is turned on, while the switch SW4 is turned on when the switch SW3 is turned off. In addition, the switching operation of the switch SW5 and the switch SW6 in the three-phase inverter circuit INV is performed in such a manner that the switch SW6 is turned off when the switch SW5 is turned on, while the switch SW6 is turned on when the switch SW5 is turned off.

Also, as illustrated in FIG. 2, the switching operations of the three sets of the switch pairs are performed so as to have a phase difference of 120 degrees. At this time, a potential of each of the point U, the point V and the point W changes to 0 and Eo in accordance with the switching operations of the three sets of the switch pairs. Thus, a line voltage between, for example, the U-phase and the V-phase changes to +Eo, 0 and −Eo because the line voltage is obtained by subtracting the potential of the V-phase from the potential of the U-phase. Meanwhile, a line voltage between the V-phase and the W-phase has a voltage waveform in which a phase is shifted by 120 degrees with respect to the line voltage between the U-phase and the V-phase, and a line voltage between the W-phase and the U-phase has a voltage waveform in which a phase is shifted by 120 degrees with respect to the line voltage between the V-phase and the W-phase. By switching the switch SW1 to the switch SW6 in the above-described manner, each line voltage has a stepped AC voltage waveform and the AC voltage waveforms of the respective line voltages have a phase difference of 120 degrees. Accordingly, the three-phase inverter circuit INV can convert the DC power supplied from the DC power source E into the three-phase AC power.

<Actual Configuration Example of Three-Phase Inverter Circuit>

Figure 3:
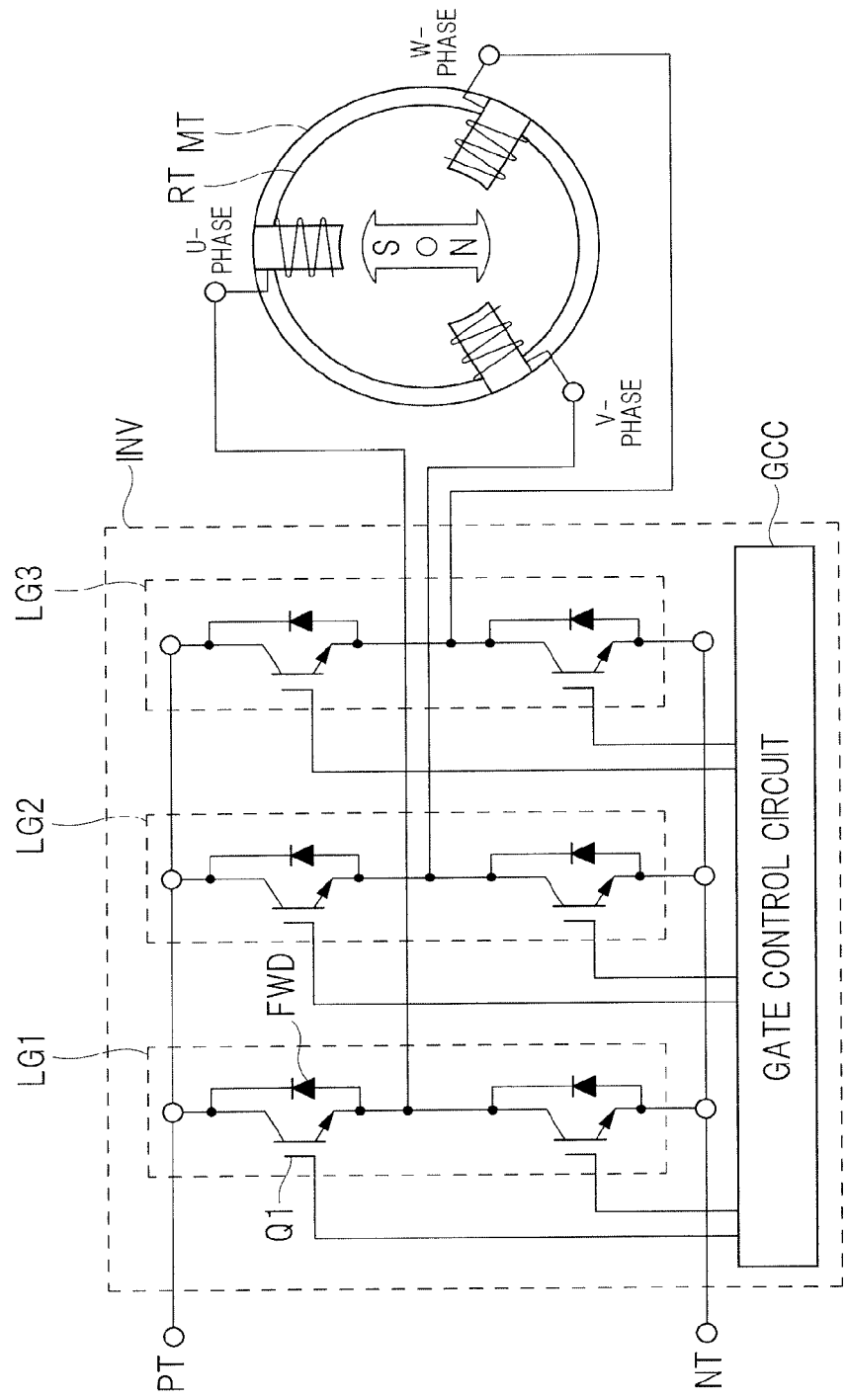
FIG. 3 is a circuit diagram illustrating a configuration of a motor circuit including an inverter circuit and a three-phase induction motor according to the first embodiment.

A semiconductor device according to the first embodiment is used in, for example, a driving circuit of a three-phase induction motor for use in an electric vehicle or a hybrid vehicle. Specifically, this driving circuit includes an inverter circuit, and the inverter circuit has a function of converting DC power into AC power. FIG. 3 is a circuit diagram illustrating a configuration of a motor circuit including an inverter circuit and a three-phase induction motor according to the first embodiment.

In FIG. 3, the motor circuit includes the three-phase induction motor MT and the inverter circuit INV. The three-phase induction motor MT is configured to be driven by three-phase voltages having different phases. Specifically, the three-phase induction motor MT generates a rotating magnetic field around a rotor RT, which is a conductor, by using three-phase AC called a U-phase, a V-phase and a W-phase whose phases are shifted by 120 degrees. In this case, the magnetic field rotates around the rotor RT. This means that a magnetic flux across the rotor RT that is the conductor changes. As a result, an electromagnetic induction occurs in the rotor RT that is the conductor, and an induced current flows through the rotor RT. Then, the state where the induced current flows in the rotating magnetic field means that a force is applied to the rotor RT by the Fleming's left-hand rule, and the rotor RT is rotated by this force. As described above, it can be understood that the three-phase induction motor MT can rotate the rotor RT by using the three-phase AC. Namely, the three-phase induction motor MT requires the three-phase AC. Thus, in the motor circuit, the three-phase AC is supplied to the three-phase induction motor by using the inverter circuit INV that produces AC from DC.

In the following, an actual configuration example of the inverter circuit INV will be described. As illustrated in FIG. 3, for example, in the inverter circuit INV according to the first embodiment, an IGBT Q1 and a diode FWD are provided so as to correspond to the three phases. Namely, in the actual inverter circuit INV, for example, each of the switches SW1 to SW6 illustrated in FIG. 1 is configured of a constituent element in which the IGBT Q1 and the diode FWD are connected in antiparallel as illustrated in FIG. 3. More specifically, in FIG. 3, each of an upper arm and a lower arm of the first leg LG1, an upper arm and a lower arm of the second leg LG2, and an upper arm and a lower arm of the third leg LG3 is configured of a constituent element in which the IGBT Q1 and the diode FWD are connected in antiparallel.

Here, for example, it is conceivable that a power MOSFET (Metal Oxide Semiconductor Field Effect Transistor) is used as a switching element of the inverter circuit INV. Since the power MOSFET is of a voltage-driven type that controls an on/off operation by a voltage applied to a gate electrode, the power MOSFET has an advantage of being able to perform high-speed switching. On the other hand, in the power MOSFET, the on-resistance and the amount of heat generation increase along with the increase in breakdown voltage. This is because the power MOSFET ensures a breakdown voltage by increasing a thickness of a low-concentration epitaxial layer (drift layer), but the increase in the thickness of the low-concentration epitaxial layer increases a resistance as a side effect.

Also, a bipolar transistor capable of handling large power may be used as the switching element. However, since the bipolar transistor is of a current-driven type that controls an on/off operation by a base current, the bipolar transistor is generally slower in a switching speed in comparison with the above-described power MOSFET.

Therefore, for the applications to a motor of an electric vehicle or a hybrid vehicle in which high-power and high-speed switching is required, the power MOSFET and the bipolar transistor are difficult to cope with the requirements. Thus, the IGBT is used for the above-described applications in which the high-power and high-speed switching is required. The IGBT is a semiconductor element that is configured by a combination of a power MOSFET and a bipolar transistor and has both of the high-speed switching characteristic of the power MOSFET and the high breakdown voltage characteristic of the bipolar transistor. From this fact, since the IGBT can perform the high-power and high-speed switching, the IGBT is a semiconductor element suitable for the applications in which the high-power and high-speed switching is required. As described above, the inverter circuit INV according to the first embodiment adopts the IGBT as the switching element.

In addition, in the inverter circuit INV according to the first embodiment, the IGBT Q1 and the diode FWD are connected in antiparallel between a positive potential terminal PT and each phase (U-phase, V-phase and W-phase) of the three-phase induction motor MT, and the IGBT Q1 and the diode FWD are connected in antiparallel between each phase of the three-phase induction motor MT and a negative potential terminal NT. Namely, two IGBTs Q1 and two diodes FWD are provided for each single phase, and six IGBTs Q1 and six diodes FWD are provided for three phases. Also, a gate control circuit GC is connected to a gate electrode of each of the IGBTs Q1, and the switching operation of the IGBT Q1 is controlled by the gate control circuit GC. In the inverter circuit INV configured as described above, by controlling the switching operation of the IGBT Q1 by the gate control circuit GC, DC power is converted into three-phase AC power, and the three-phase AC power is supplied to the three-phase induction motor MT.

<Necessity of Diode>

As described above, in the inverter circuit INV according to the first embodiment, the IGBT Q1 is used as the switching element, and the diode FWD is provided so as to be connected in antiparallel to the IGBT Q1. Simply, from the viewpoint of realizing the switching function by the switching element, the IGBT Q1 as the switching element is necessary, but it appears that it is unnecessary to provide the diode FWD. In this regard, when an inductance is included in a load connected to the inverter circuit INV, it is necessary to provide the diode FWD. The reasons therefor will be described below.

In the case where the load is a pure resistance that includes no inductance, the diode FWD is unnecessary because there is no reflux energy. However, when a circuit including the inductance such as a motor is connected to the load, there is a mode in which a load current flows in a reverse direction to a switch in an ON state. Namely, when the inductance is included in the load, energy returns from the inductance of the load to the inverter circuit INV in some cases (current may flow back).

At this time, since the IGBT Q1 alone does not have a function to allow the reflux current to flow, it is necessary to connect the diode FWD in antiparallel to the IGBT Q1. Namely, in the inverter circuit INV, in the case where the inductance is included in the load like in a motor control, the energy ($\frac{1}{2}LI^2$) accumulated in the inductance must be released when the IGBT Q1 is turned off. However, the IGBT Q1 alone cannot make the reflux current flow so as to release the energy accumulated in the inductance. Thus, in order to reflux the electrical energy accumulated in the inductance, the diode FWD is connected in antiparallel to the IGBT Q1. In other words, the diode FWD has a function to allow the reflux current to flow so as to release the electrical energy accumulated in the inductance. From the above, it can be understood that it is necessary to provide the diode FWD in antiparallel to the IGBT Q1 serving as the switching element in the inverter circuit connected to the load including the inductance. This diode FWD is referred to as a free wheel diode.

<Structure of IGBT>

The structures of the IGBT Q1 and the diode FWD constituting the inverter circuit INV according to the first embodiment will be described with reference to the drawings. The inverter circuit INV according to the first embodiment includes the IGBT Q1 and the diode FWD.

Figure 4:
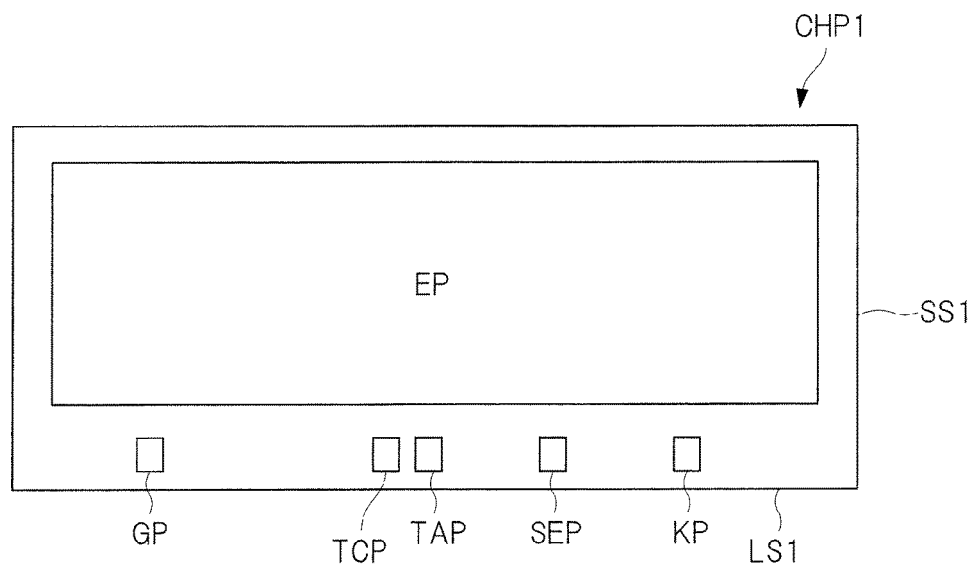
FIG. 4 is a plan view illustrating an outer shape of a semiconductor chip in which an IGBT is formed.

FIG. 4 is a plan view illustrating an outer shape of a semiconductor chip CHP1 in which the IGBT Q1 is formed. In FIG. 4, a main surface (front surface) of the semiconductor chip CHP1 is illustrated. As illustrated in FIG. 4, a planar shape of the semiconductor chip CHP1 according to the first embodiment is a rectangular shape having long sides LS1 and short sides SS1. Also, a rectangular emitter electrode pad EP is formed on the front surface of the rectangular semiconductor chip CHP1. In addition, a plurality of electrode pads are formed along a long side of the semiconductor chip CHP1. Specifically, as these electrode pads, a gate electrode pad GP, a temperature detection electrode pad TCP, a temperature detection electrode pad TAP, a current detection electrode pad SEP and a Kelvin detection electrode pad KP are disposed from the left side of FIG. 4. In this way, on the front surface of the rectangular semiconductor chip CHP1, the emitter electrode pad EP and the electrode pad are disposed along a short side and the plurality of electrode pads are formed along a long side. At this time, a size (plane area) of the emitter electrode pad EP is much larger than a size of each of the plurality of electrode pads.

Figure 5:
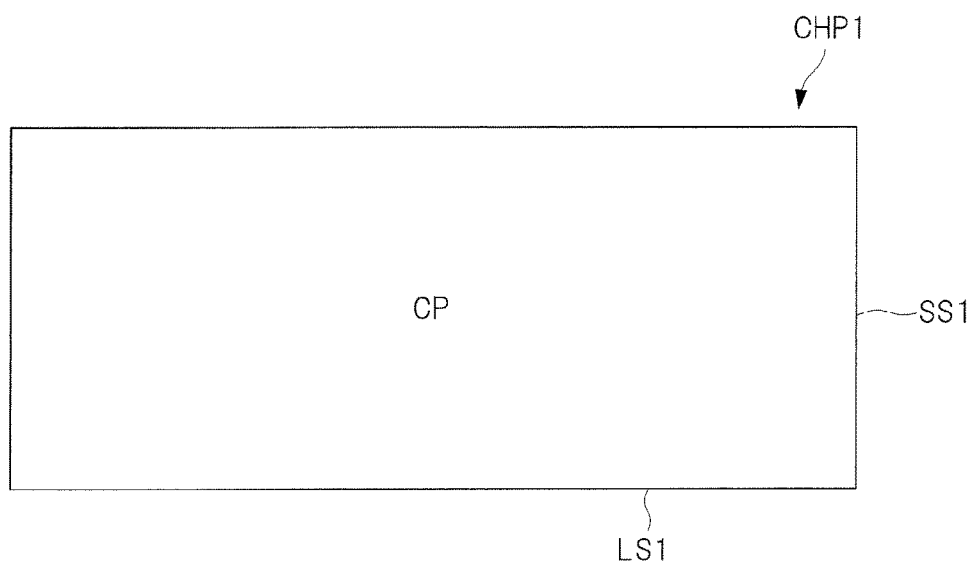
FIG. 5 is a plan view illustrating a rear surface on an opposite side of a front surface of the semiconductor chip.

FIG. 5 is a plan view illustrating a rear surface on an opposite side of the front surface of the semiconductor chip CHP1. As illustrated in FIG. 5, it can be understood that a rectangular collector electrode pad CP is formed over the entire rear surface of the semiconductor chip CHP1.

Figure 6:
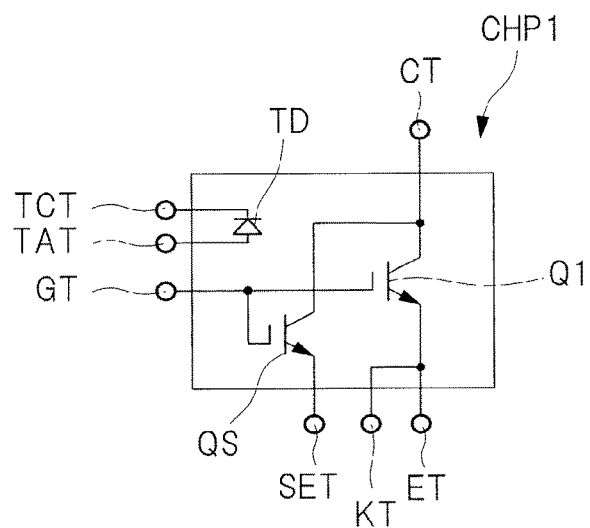
FIG. 6 is a circuit diagram illustrating an example of a circuit formed in the semiconductor chip.

Next, the circuit configuration formed in the semiconductor chip CHP1 will be described. FIG. 6 is a circuit diagram illustrating an example of a circuit formed in the semiconductor chip CHP1. As illustrated in FIG. 6, the IGBT Q1, a detection IGBT QS and a temperature detection diode TD are formed in the semiconductor chip CHP1. The IGBT Q1 serves as a main IGBT and is used to control the driving of the three-phase induction motor MT illustrated in FIG. 3. In the IGBT Q1, an emitter electrode, a collector electrode and a gate electrode are formed. The emitter electrode of the IGBT Q1 is electrically connected to the emitter terminal ET through the emitter electrode pad EP illustrated in FIG. 4, and the collector electrode of the IGBT Q1 is electrically connected to the collector terminal CT through the collector electrode pad CP illustrated in FIG. 5. In addition, the gate electrode of the IGBT Q1 is electrically connected to the gate terminal GT through the gate electrode pad GP illustrated in FIG. 4.

The gate electrode of the IGBT Q1 is connected to the gate control circuit GCC illustrated in FIG. 3. At this time, a signal from the gate control circuit GCC is applied to the gate electrode of the IGBT Q1 through the gate terminal GT, so that the switching operation of the IGBT Q1 can be controlled by the gate control circuit GCC.

The detection IGBT QS is provided for detecting an overcurrent flowing between the collector and the emitter of the IGBT Q1. Namely, the IGBT QS is provided for detecting an overcurrent flowing between the collector and the emitter of the IGBT Q1 as the inverter circuit INV and protecting the IGBT Q1 from the breakage due to the overcurrent. In the detection IGBT QS, the collector electrode of the detection IGBT QS is electrically connected to the collector electrode of the IGBT Q1 and the gate electrode of the detection IGBT QS is electrically connected to the gate electrode of the IGBT Q1. In addition, the emitter electrode of the detection IGBT QS is electrically connected through the current detection electrode pad SEP illustrated in FIG. 4 to a current detection terminal SET different from the emitter electrode of the IGBT Q1. The current detection terminal SET is connected to a current detection circuit provided in the outside. This current detection circuit detects a current between the collector and the emitter of the IGBT Q1 based on the output of the emitter electrode of the detection IGBT QS and blocks a gate signal applied to the gate electrode of the IGBT Q1 when the overcurrent flows, thereby protecting the IGBT Q1.

Specifically, the detection IGBT QS is used as a current detection element for preventing an overcurrent from flowing through the IGBT Q1 due to a load short-circuit or the like. For example, a current ratio of the current flowing through the main IGBT Q1 to the current flowing through the detection IGBT QS is designed to be IGBT Q1:detection IGBT QS=1000:1. In short, when a current of 200 A flows through the main IGBT Q1, a current of 200 mA flows through the detection IGBT QS.

In the actual applications, a sense resistor electrically connected to the emitter electrode of the detection IGBT QS is externally attached and voltages at both ends of the sense resistor are fed back to the control circuit. Then, the control circuit cuts off the power source when the voltages at both ends of the sense resistor become equal to or higher than a set voltage. In other words, when the current flowing through the main IGBT Q1 becomes an overcurrent, the current flowing through the detection IGBT QS also increases. As a result, since the current flowing through the sense resistor also increases, the voltages at both ends of the sense resistor increase, and when the voltages become equal to or higher than a set voltage, it is possible to grasp that the current flowing through the main IGBT Q1 is in the overcurrent state.

The temperature detection diode TD is provided for detecting a temperature of the IGBT Q1 (broadly speaking, a temperature of the semiconductor chip CHP1). Namely, the voltage of the temperature detection diode TD is changed by the temperature of the IGBT Q1, so that the temperature of the IGBT Q1 is detected. The temperature detection diode TD has a pn junction formed by introducing impurities of different conductivity types into polysilicon and has a cathode electrode (negative electrode) and an anode electrode (positive electrode). The cathode electrode is electrically connected to a temperature detection terminal TCT illustrated in FIG. 6 through the temperature detection electrode pad TCP (see FIG. 4) formed on an upper surface of the semiconductor chip CHP1 by an internal wiring. Similarly, the anode electrode is electrically connected to a temperature detection terminal TAT illustrated in FIG. 6 through the temperature detection electrode pad TAP (see FIG. 4) formed on the upper surface of the semiconductor chip CHP1 by an internal wiring.

The temperature detection terminal TCT and the temperature detection terminal TAT are connected to the current detection circuit provided in the outside. The current detection circuit indirectly detects the temperature of the IGBT Q1 based on the output between the temperature detection terminal TCT and the temperature detection terminal TAT respectively connected to the cathode electrode and the anode electrode of the temperature detection diode TD, and blocks a gate signal applied to the gate electrode of the IGBT Q1 when the detected temperature becomes equal to or higher than a predetermined temperature, thereby protecting the IGBT Q1.

As described above, the temperature detection diode TD configured of the pn junction diode has such a characteristic that a forward current flowing through the temperature detection diode TD rapidly increases when a forward voltage of a certain value or more is applied. Also, the voltage value at which the forward current starts to rapidly flow is changed depending on the temperature, and the voltage value decreases when the temperature increases. Therefore, the characteristic of the temperature detection diode TD is utilized in the first embodiment. More specifically, by making a constant current flow through the temperature detection diode and measuring voltage values at both ends of the temperature detection diode TD, the temperature can be monitored indirectly. In the actual applications, by feeding back the voltage value (temperature signal) of the temperature detection diode TD thus measured to the control circuit, the element operation temperature is controlled so as not to exceed a guaranteed value (for example, 150° C. to 175° C.)

Next, in FIG. 6, the emitter electrode of the IGBT Q1 is electrically connected to the emitter terminal ET and is electrically connected also to the Kelvin terminal KT different from the emitter terminal ET. The Kelvin terminal KT is electrically connected to the Kelvin detection electrode pad KP (see FIG. 4) formed on the upper surface of the semiconductor chip CHP1 by the internal wiring. Therefore, the emitter electrode of the IGBT Q1 is electrically connected to the Kelvin terminal KT through the Kelvin detection electrode pad KP. The Kelvin terminal KT is used as an inspection terminal of the main IGBT Q1. Namely, when the voltage sense is taken from the emitter terminal ET of the IGBT Q1 at the time of the inspection in which a large current is made to flow through the main IGBT Q1, a large current flows through the emitter terminal ET, and thus, a voltage drop caused by a wiring resistance cannot be ignored and it is difficult to accurately measure an on-voltage. Therefore, in the first embodiment, the Kelvin terminal KT is provided as a voltage sense terminal which is electrically connected to the emitter terminal ET of the IGBT Q1, but through which a large current does not flow. More specifically, at the time of the inspection to make a large current flow, by measuring the voltage of the emitter electrode from the Kelvin terminal KT, the on-voltage of the IGBT Q1 can be measured without being affected by the large current. Furthermore, the Kelvin terminal KT is used also as an electrically independent reference pin for a gate driving output.

From the above, since the semiconductor chip CHP1 according to the first embodiment is configured to be connected to the control circuit including the current detection circuit and the temperature detection circuit, it is possible to improve the operation reliability of the IGBT Q1 included in the semiconductor chip CHP1.

<Device Structure of IGBT>

Figure 7:
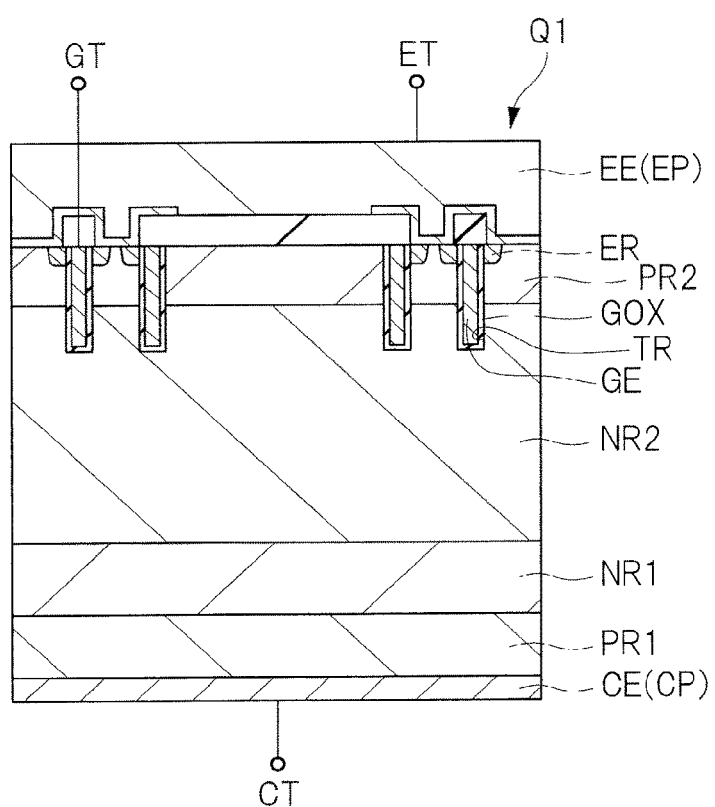
FIG. 7 is a cross-sectional view illustrating a device structure of an IGBT according to the first embodiment.

Next, the device structure of the IGBT Q1 will be described. FIG. 7 is a cross-sectional view illustrating the device structure of the IGBT Q1 according to the first embodiment. In FIG. 7, the IGBT Q1 has a collector electrode CE (collector electrode pad CP) formed on a rear surface of a semiconductor chip, and a p$^+$-type semiconductor region PR1 is formed on the collector electrode CE. An n$^+$-type semiconductor region NR1 is formed on the p$^+$-type semiconductor region PR1, and an n$^-$-type semiconductor region NR2 is formed on the n$^+$-type semiconductor region NR1. Further, a p-type semiconductor region PR2 is formed on the n$^-$-type semiconductor region NR2, and a trench TR that penetrates through the p-type semiconductor region PR2 and reaches the n$^-$-type semiconductor region NR2 is formed. Furthermore, an n$^+$-type semiconductor region ER serving as an emitter region is formed in alignment with the trench TR. A gate insulating film GOX made of, for example, a silicon oxide film is formed in the trench TR, and a gate electrode GE is formed via the gate insulating film GOX. The gate electrode GE is made of, for example, a polysilicon film and is formed so as to fill the trench TR. In addition, although the trench gate structure is illustrated in FIG. 7, the present invention is not limited thereto. For example, though not illustrated, an IGBT using a planar gate structure formed on a silicon substrate may also be used.

In the IGBT Q1 configured as described above, the gate electrode GE is connected to the gate terminal GT through the gate electrode pad GP illustrated in FIG. 4. Similarly, the n$^+$-type semiconductor region ER to be the emitter region is electrically connected to the emitter terminal ET through an emitter electrode EE (emitter electrode pad EP). The p$^+$-type semiconductor region PR1 to be the collector region is electrically connected to the collector electrode CE formed on the rear surface of the semiconductor chip.

The IGBT Q1 configured as described above has both of the high-speed switching characteristic and the voltage driving characteristic of the power MOSFET and the low on-voltage characteristic of the bipolar transistor.

Note that the n$^+$-type semiconductor region NR1 is referred to as a buffer layer. The n$^+$-type semiconductor region NR1 is provided for preventing a punch-through phenomenon in which a depletion layer growing from the p-type semiconductor region PR2 to the n$^-$-type semiconductor region NR2 comes into contact with the p$^+$-type semiconductor region PR1 formed below the n$^-$-type semiconductor region NR2 when the IGBT Q1 is turned off. In addition, the n$^+$-type semiconductor region NR1 is provided for the purpose of limiting the implantation amount of holes from the p$^+$-type semiconductor region PR1 to the n$^-$-type semiconductor region NR2.

<Operation of IGBT>

Next, the operation of the IGBT Q1 according to the first embodiment will be described. First, the turn-on operation of the IGBT Q1 will be described. In FIG. 7, the MOSFET having the trench gate structure is turned on by applying a sufficient positive voltage between the gate electrode GE and the n$^+$-type semiconductor region ER to be the emitter region. In this case, a region between the p$^+$-type semiconductor region PR1 constituting the collector region and the n$^-$-type semiconductor region NR2 is forward-biased, and hole implantation occurs from the p$^+$-type semiconductor region PR1 to the n$^-$-type semiconductor region NR2. Subsequently, as many electrons as the positive charges of the implanted holes are collected in the n$^-$-type semiconductor region NR2. In this manner, a resistance of the n$^-$-type semiconductor region NR2 is reduced (conductivity modulation), and the IGBT Q1 becomes an ON state.

A junction voltage of the p$^+$-type semiconductor region PR1 and the n$^-$-type semiconductor region NR2 is added to the on-voltage. However, since the resistance value of the n$^-$-type semiconductor region NR2 is reduced by one order of magnitude or more due to the conductivity modulation, the on-voltage is lower in the IGBT Q1 than in the power MOSFET at a high breakdown voltage occupying most of an on-resistance. Therefore, it can be understood that the IGBT Q1 is a device effective for increasing the breakdown voltage. More specifically, it is necessary to increase a thickness of an epitaxial layer serving as a drift layer so as to achieve the high breakdown voltage in the power MOSFET, but in this case, the on-resistance also increases. On the other hand, in the IGBT Q1, even when the thickness of the n$^-$-type semiconductor region NR2 is increased so as to achieve the high breakdown voltage, the conductivity modulation occurs at the time of the turn-on operation of the IGBT Q1. Therefore, the on-resistance can be more lowered than that of the power MOSFET. In short, in comparison with the power MOSFET, the IGBT Q1 can realize a device having a low on-resistance even when the breakdown voltage is increased.

Next, the turn-off operation of the IGBT Q1 will be described. When a voltage between the gate electrode GE and the n$^+$-type semiconductor region ER to be the emitter region is reduced, the MOS FET having the trench gate structure is turned off. In this case, the hole implantation from the p$^+$-type semiconductor region PR1 to the n$^-$-type semiconductor region NR2 is stopped, and the already implanted holes also reach their end of life and decrease. The remaining holes directly flow out to the emitter electrode EE (tail current), and when the outflow has been completed, the IGBT Q1 becomes an OFF state. In this way, the IGBT Q1 can be turned on/off.

<Structure of Diode>

Figure 8:
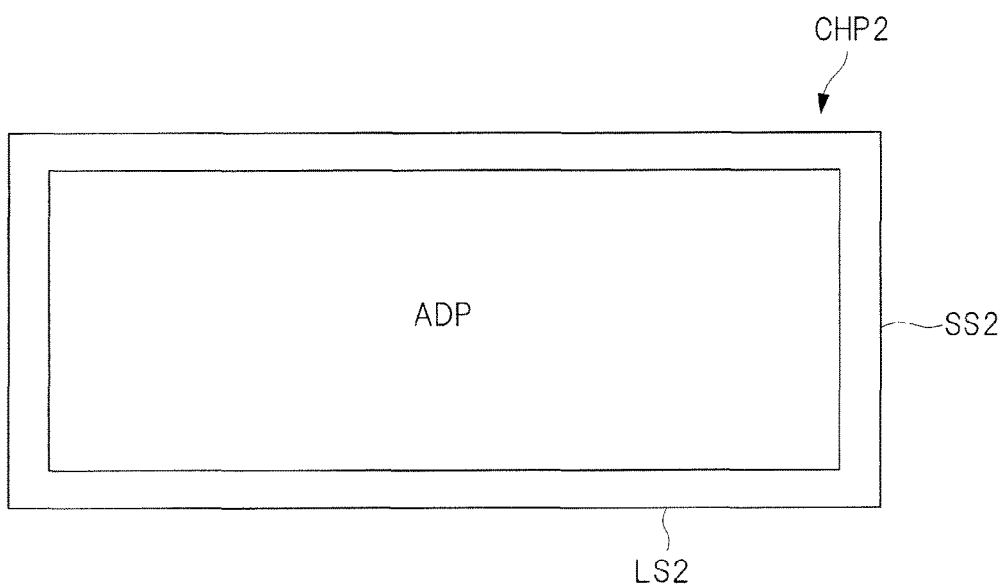
FIG. 8 is a plan view illustrating an outer shape of a semiconductor chip in which a diode is formed.

Next, FIG. 8 is a plan view illustrating an outer shape of a semiconductor chip CHP2 in which the diode FWD is formed. In FIG. 8, a main surface (front surface) of the semiconductor chip CHP2 is illustrated. As illustrated in FIG. 8, a planar shape of the semiconductor chip CHP2 according to the first embodiment is a rectangular shape having long sides LS2 and short sides SS2. Also, a rectangular anode electrode pad ADP is formed on the front surface of the rectangular semiconductor chip CHP2. Meanwhile, though not illustrated, a rectangular cathode electrode pad is formed on an entire rear surface on an opposite side of the front surface of the semiconductor chip CHP2.

Figure 9:
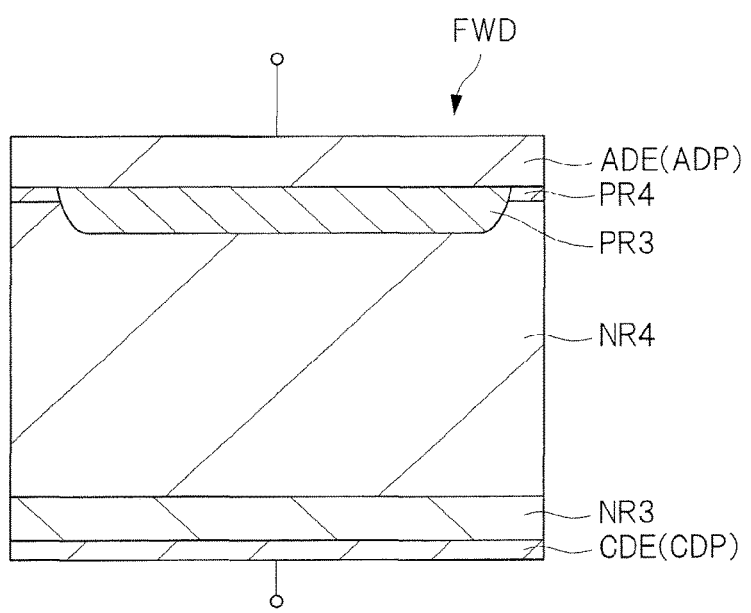
FIG. 9 is a cross-sectional view illustrating a device structure of a diode.

Next, the device structure of the diode FWD will be described. FIG. 9 is a cross-sectional view illustrating the device structure of the diode FWD. In FIG. 9, a cathode electrode CDE (cathode electrode pad CDP) is formed on the rear surface of a semiconductor chip, and an n$^+$-type semiconductor region NR3 is formed on the cathode electrode CDE. Further, an n$^-$-type semiconductor region NR4 is formed on the n$^+$-type semiconductor region NR3, and a p-type semiconductor region PR3 is formed on the n$^-$-type semiconductor region NR4. An anode electrode ADE (anode electrode pad ADP) is formed on the p-type semiconductor region PR3 and a p$^-$-type semiconductor region PR4. The anode electrode ADE is made of, for example, aluminum-silicon.

<Operation of Diode>

According to the diode FWD configured as described above, when a positive voltage is applied to the anode electrode ADE and a negative voltage is applied to the cathode electrode CDE, a pn junction between the n$^-$-type semiconductor region NR4 and the p-type semiconductor region PR3 is forward-biased and a current flows therethrough. On the other hand, when a negative voltage is applied to the anode electrode ADE and a positive voltage is applied to the cathode electrode CDE, the pn junction between the n$^-$-type semiconductor region NR4 and the p-type semiconductor region PR3 is reverse-biased and no current flows therethrough. In this way, the diode FWD having a rectifying function can be operated.

<Room for Improvement>

The above-described inverter circuit INV illustrated in FIG. 3 is embodied by using six semiconductor devices in each of which the semiconductor chip CHP1 having the IGBT Q1 formed therein and the semiconductor chip CHP2 having the diode FWD formed therein are provided in a single package. Here, in the manufacturing process of the semiconductor device in which the semiconductor chip CHP1 having the IGBT Q1 formed therein and the semiconductor chip CHP2 having the diode FWD formed therein are provided in a single package (related art), there is room for improvement from the viewpoint of improving the reliability of the semiconductor device.

Figure 10:
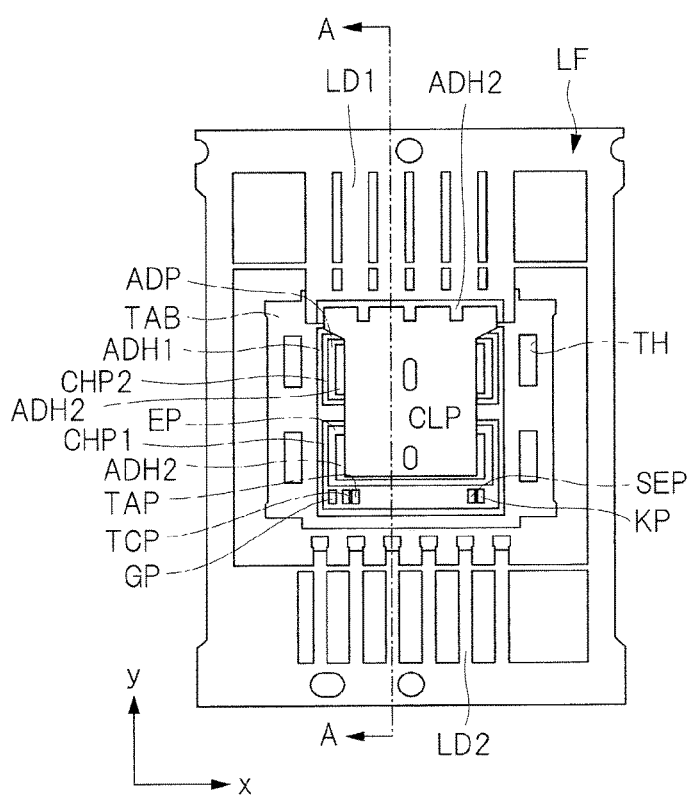
FIG. 10(a) is a plan view illustrating a part of a manufacturing process of a semiconductor device (clip mounting process) according to the related art.
FIG. 10(b) is a cross-sectional view taken along a line A-A of FIG. 10(a)
Figure 10:
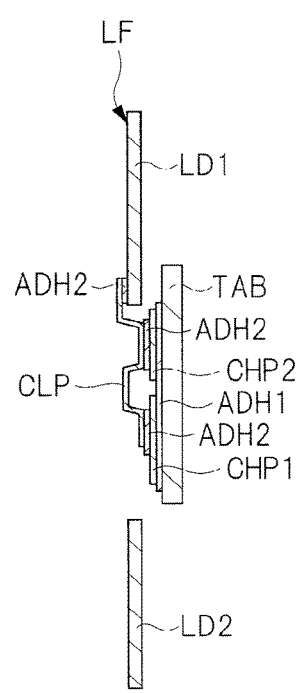

In the following, the room for improvement will be described. FIG. 10 is a diagram illustrating a part of a manufacturing process of a semiconductor device to be a constituent element of the inverter circuit INV according to the related art. FIG. 10(a) is a plan view illustrating a part of the manufacturing process of a semiconductor device (clip mounting process) according to the related art, and FIG. 10(b) is a cross-sectional view taken along a line A-A of FIG. 10(a).

As illustrated in FIGS. 10(a) and 10(b), the semiconductor chip CHP1 in which an IGBT is formed and the semiconductor chip CHP2 in which a diode is formed are mounted on a chip mounting part TAB via a conductive adhesive ADH1. Then, a conductive adhesive ADH2 is formed on an emitter electrode pad EP of the semiconductor chip CHP1 and an anode electrode pad ADP of the semiconductor chip CHP2, and a clip CLP is disposed over the semiconductor chip CHP1, the semiconductor chip CHP2 and a lead LD1 via the conductive adhesive ADH2. FIGS. 10(a) and 10(b) illustrate the clip mounting process of mounting the clip CLP electrically connecting the semiconductor chip CHP1, the semiconductor chip CHP2 and the lead LD1. The processes up to the clip mounting process are performed in a state of, for example, being accommodated in a jig. This is because the lead frame LF and the chip mounting part TAB are in a separated state in the processes prior to the clip mounting process. Thereafter, through the clip mounting process, the chip mounting part TAB on which the semiconductor chip CHP1 and the semiconductor chip CHP2 have been mounted and the lead frame LF are connected to each other by the clip CLP, so that an integrated structure is formed. After the clip mounting process is performed, for example, the above-described integrated structure is taken out from the jig, and a wire bonding process in which the semiconductor chip CHP1 and a lead LD2 are connected by wires W is performed.

Figures 11A, 11B:
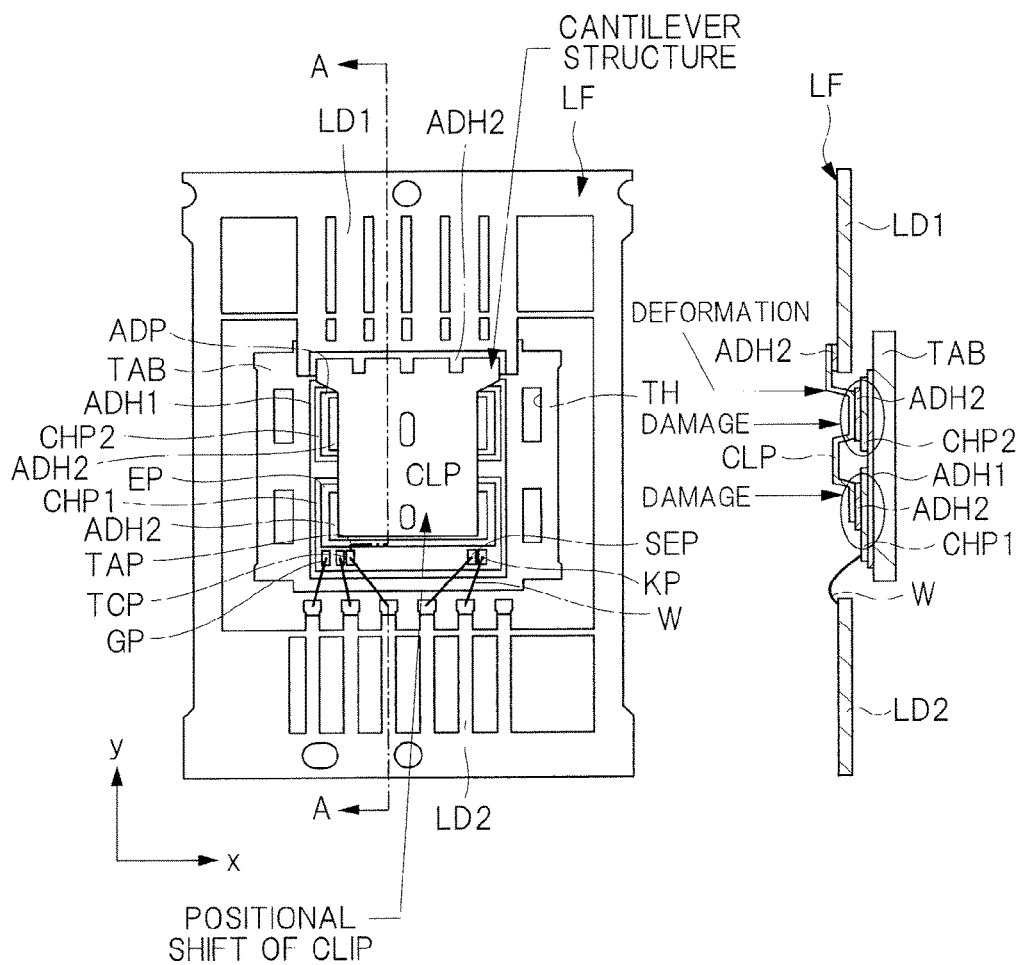
FIG. 11(a) is a plan view illustrating a part of the manufacturing process of a semiconductor device (wire bonding process) according to the related art.
FIG. 11(b) is a cross-sectional view taken along a line A-A of FIG. 11(a)

FIG. 11(a) is a plan view illustrating a part of the manufacturing process of a semiconductor device (wire bonding process) according to the related art, and FIG. 11(b) is a cross-sectional view taken along a line A-A of FIG. 11(a). For the wire bonding process illustrated in FIGS. 11(a) and 11(b), it is inevitably necessary to perform a conveyance process of taking out the integrated structure formed by the clip mounting process from the jig and conveying the integrated structure.

Here, as illustrated in FIGS. 11(a) and 11(b), in the integrated structure, the chip mounting part TAB on which the semiconductor chip CHP1 and the semiconductor chip CHP2 are mounted and the lead frame LF are connected to each other by only the clip CLP, and the clip CLP has a cantilever structure having a weak connection strength. As a result, there are concerns about damage applied to a joint portion between the clip CLP and the semiconductor chip CHP1 and a joint portion between the clip CLP and the semiconductor chip CHP2 and deformation of the clip CLP itself due to the impact and vibration during the above-described conveyance process (first room for improvement).

In addition, in the cantilever structure of the clip CLP, it is difficult to fix the position of the clip CLP. Consequently, positional shift of the clip CLP is likely to occur, and there is a concern about the occurrence of electrical connection failure due to the positional shift. In particular, when a solder connection is used for the connection between the clip CLP and the semiconductor chip CHP1 and the connection between the clip CLP and the semiconductor chip CHP2, the positional shift of the clip CLP is likely to occur because the clip CLP slides in a predetermined direction in accordance with a spread state of the solder. More specifically, in the related art, the positional shift of the clip CLP due to the cantilever structure of the clip CLP is likely to occur and there is a concern about the occurrence of the electrical connection failure in the semiconductor device to be manufactured. In other words, in the related art, there is a concern about a reduction in the manufacturing yield (second room for improvement).

Figure 12:
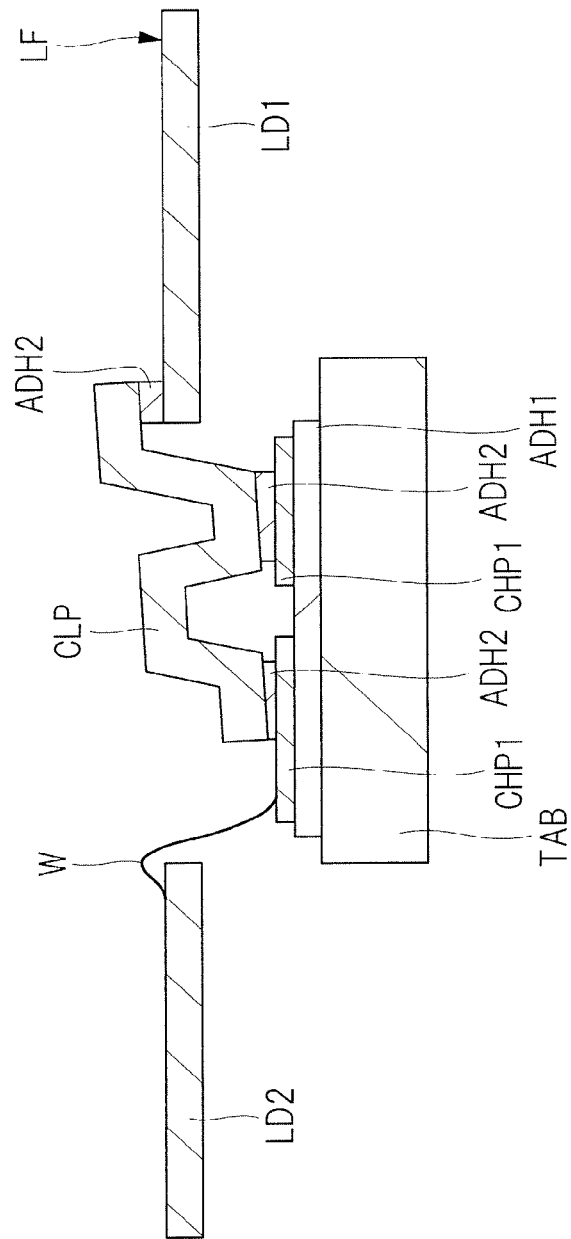
FIG. 12 is a diagram for describing room for improvement in the related art.

Furthermore, as illustrated in FIG. 12, in the cantilever structure of the clip CLP, sinking is likely to occur due to a load applied to the clip CLP and a weight of the clip CLP itself in the clip mounting process. As a result, as illustrated in FIG. 12, since the height of the clip CLP becomes uneven and the clip CLP is tilted, the thickness of the conductive adhesive ADH2 connecting the clip CLP and the semiconductor chip CHP1 and the conductive adhesive ADH2 connecting the clip CLP and the semiconductor chip CHP2 is reduced and becomes uneven. Therefore, in the semiconductor device manufactured according to the related art, there is a concern about the deterioration of a thermal fatigue resistance represented by a temperature cycle characteristic and a power cycle characteristic due to the reduced thickness and the uneven thickness of the conductive adhesive ADH2 (third room for improvement).

From the above, the first to third rooms for improvement described above exist in the related art, and it is desired to improve the reliability of the semiconductor device. Therefore, in the first embodiment, measures for the above-described rooms for improvement have been implemented. In the following, the technical idea according to the first embodiment on which the measures have been implemented will be described.

<Mounting Configuration of Semiconductor Device in First Embodiment>

The semiconductor device according to the first embodiment relates to the inverter circuit INV illustrated in FIG. 3, and one IGBT Q1 and one diode FWD to be constituent elements of the inverter circuit INV are provided in a single package. Namely, an electronic device (power module) serving as the three-phase inverter circuit INV to drive the three-phase motor is configured by using six semiconductor devices according to the first embodiment.

Figure 13:
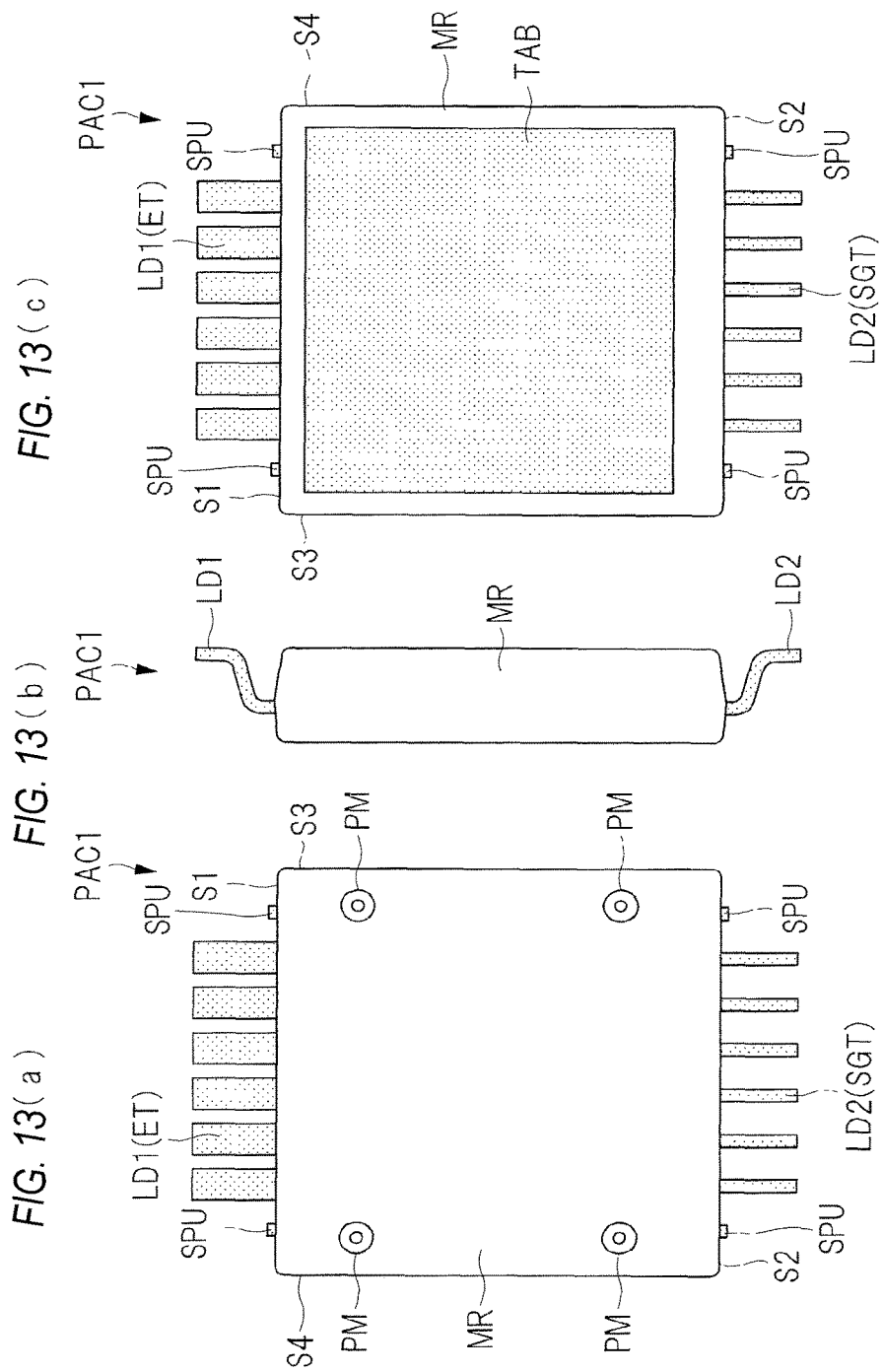
FIG. 13(a) is a top view illustrating an external configuration of the semiconductor device according to the first embodiment.
FIG. 13(b) is a side view.
FIG. 13(c) is a bottom view.

FIGS. 13(a) to 13(c) are diagrams to illustrate an external configuration of a semiconductor device PAC1 according to the first embodiment. Specifically, FIG. 13(a) is a top view illustrating an external configuration of the semiconductor device PAC1 according to the first embodiment, FIG. 13(b) is a side view, and FIG. 13(c) is a bottom view.

As illustrated in FIG. 13(a), the semiconductor device PAC1 according to the first embodiment has a rectangular sealing member MR made of a resin. The sealing member MR has an upper surface illustrated in FIG. 13(a), a bottom surface on an opposite side of the upper surface (FIG. 13(c)), a first side surface disposed between the upper surface and the bottom surface in a thickness direction thereof, and a second side surface facing the first side surface. In FIG. 13(a), a side S1 constituting the first side surface is illustrated and a side S2 constituting the second side surface is illustrated. Furthermore, the sealing member MR has a third side surface that intersects with the first side surface and the second side surface and a fourth side surface that intersects with the first side surface and the second side surface and faces the third side surface. In FIG. 13(a), a side S3 constituting the third side surface is illustrated and a side S4 constituting the fourth side surface is illustrated.

Here, as illustrated in FIG. 13(a), in the semiconductor device PAC1 according to the first embodiment, a part of each of a plurality of leads LD1 projects from the first side surface, and a part of each of a plurality of leads LD2 projects from the second side surface. At this time, the leads LD1 constitute emitter terminals ET and the leads LD2 constitute signal terminals SGT. A width of each of the plurality of leads LD1 constituting the emitter terminals ET is larger than a width of each of the plurality of leads LD2 constituting the signal terminals SGT. In other words, in the first embodiment, when the plurality of leads LD1 are collectively referred to as a first lead (first lead group) and the plurality of leads LD2 are collectively referred to as a second lead (second lead group), a part of the first lead exposed from the sealing member MR is configured of a plurality of portions (plurality of leads LD1), and a part of the second lead exposed from the sealing member MR is configured of a plurality of portions (plurality of leads LD2). At this time, when seen in a plan view, a width of each of the plurality of portions of the first leads is larger than a width of each of the plurality of leads LD2. This is because the resistance of the emitter terminal ET needs to be reduced as much as possible in consideration of a large current flowing through the emitter terminal ET, while only a slight current flows through the signal terminal SGT.

In the semiconductor device PAC1 according to the first embodiment, structural evidences reflecting the characteristics of a manufacturing method to be described below are observed on the outer appearance. Specifically, as illustrated in FIG. 13(a), an end portion of a support part SPU is exposed from the first side surface (side S1) and is exposed also from the second side surface (side S2). Furthermore, in the semiconductor device PAC1 according to the first embodiment, a plurality of pin marks PM are formed on the upper surface of the sealing member MR.

Subsequently, as illustrated in FIG. 13(b), in the semiconductor device PAC1 according to the first embodiment, the leads LD1 and the leads LD2 projecting from the sealing member MR are bent in a gull-wing shape. Thus, the mounting facilitation of the semiconductor device PAC1 is improved. Furthermore, as illustrated in FIG. 13(c), in the semiconductor device PAC1 according to the first embodiment, the bottom surface (rear surface) of the chip mounting part TAB is exposed from the bottom surface (rear surface) of the sealing member MR. This can improve the heat dissipation efficiency of the semiconductor device.

Next, the internal structure of the sealing member MR constituting the semiconductor device PAC1 according to the first embodiment will be described. FIGS. 14(a) to 14(c) are diagrams to illustrate the internal structure of the sealing member MR of the semiconductor device PAC1 according to the first embodiment. Specifically, FIG. 14(a) is a plan view, FIG. 14(b) is a cross-sectional view taken along a line A-A of FIG. 14(a), and FIG. 14(c) is a cross-sectional view taken along a line B-B of FIG. 14(a).

First, in FIG. 14(a), the rectangular chip mounting part TAB is disposed inside the sealing member MR. The chip mounting part TAB functions also as a heat spreader for increasing the heat dissipation efficiency and is made of, for example, a material containing copper having a high thermal conductivity as a main component. Here, the "main component" means a material component that is most contained among the constituent materials constituting a member. For example, the "material containing copper as a main component" means that copper is most contained in a material of a member. The term "main component" used in this specification is intended to represent that the member is basically made of copper, but a case of containing other impurities is not excluded.

The semiconductor chip CHP1 in which an IGBT is formed and the semiconductor chip CHP2 in which a diode is formed are mounted on the chip mounting part TAB via the conductive adhesive ADH1 made of, for example, a silver paste or a high-melting-point solder. At this time, the surface on which the semiconductor chip CHP1 and the semiconductor chip CHP2 are mounted is defined as an upper surface of the chip mounting part TAB, and the surface on an opposite side of the upper surface is defined as a bottom surface. In this case, the semiconductor chip CHP1 and the semiconductor chip CHP2 are mounted on the upper surface of the chip mounting part TAB. In particular, the semiconductor chip CHP2 in which the diode is formed is disposed so that a cathode electrode pad formed on the rear surface of the semiconductor chip CHP2 comes into contact with the upper surface of the chip mounting part TAB via the conductive adhesive ADH1. In this case, the anode electrode pad ADP formed on the front surface of the semiconductor chip CHP2 is directed upward. On the other hand, the semiconductor chip CHP1 in which the IGBT is formed is disposed so that the collector electrode CE (collector electrode pad CP) formed on the rear surface of the semiconductor chip CHP1 (see FIG. 5) comes into contact with the upper surface of the chip mounting part TAB via the conductive adhesive ADH1. In this case, the emitter electrode pad EP and a plurality of electrode pads formed on the front surface of the semiconductor chip CHP1 are directed upward. Therefore, the collector electrode pad CP of the semiconductor chip CHP1 and the cathode electrode pad of the semiconductor chip CHP2 are electrically connected through the chip mounting part TAB.

Subsequently, as illustrated in FIG. 14(a), the clip CLP which is a conductive member is disposed on the emitter electrode pad EP of the semiconductor chip CHP1 and the anode electrode pad ADP of the semiconductor chip CHP2 via the conductive adhesive ADH2 made of, for example, a silver paste or a high-melting-point solder. Then, the clip CLP is connected to the emitter terminal ET via the conductive adhesive ADH2. Therefore, the emitter electrode pad EP of the semiconductor chip CHP1 and the anode electrode pad ADP of the semiconductor chip CHP2 are electrically connected to the emitter terminal ET through the clip CLP. The clip CLP is made of, for example, a plate-shaped member containing copper as a main component. In short, in the first embodiment, since a large current flows from the emitter electrode pad EP of the semiconductor chip CHP1 across the emitter terminal ET, the clip CLP capable of securing a sufficiently large area is used so that a large current can flow.

In addition, as illustrated in FIG. 14(a), a plurality of electrode pads are formed on the front surface of the semiconductor chip CHP1 and each of the plurality of electrode pads is electrically connected to a signal terminal SGT by a wire W that is a conductive member. Specifically, the plurality of electrode pads include the gate electrode pad GP, the temperature detection electrode pad TCP, the temperature detection electrode pad TAP, the current detection electrode pad SEP and the Kelvin detection electrode pad KP. The gate electrode pad GP is electrically connected to a gate terminal GT, which is one of the signal terminals SGT, by a wire W. Similarly, the temperature detection electrode pad TCP is electrically connected to a temperature detection terminal TCT, which is one of the signal terminals SGT, by a wire W, and the temperature detection electrode pad TAP is electrically connected to a temperature detection terminal TAT, which is one of the signal terminals SGT, by a wire W. In addition, the current detection electrode pad SEP is electrically connected to a current detection terminal SET, which is one of the signal terminals SGT, by a wire W, and the Kelvin detection electrode pad KP is electrically connected to a Kelvin terminal KT by a wire W. At this time, the wire W is made of, for example, a conductive member containing gold, copper, or aluminum as a main component.

Here, as illustrated in FIG. 14(a), when seen in a plan view, the semiconductor chip CHP2 is mounted on the upper surface of the chip mounting part TAB so as to be disposed between the emitter terminal ET and the semiconductor chip CHP1, and the semiconductor chip CHP1 is mounted on the upper surface of the chip mounting part TAB so as to be disposed between the semiconductor chip CHP2 and the signal terminal SGT.

In other words, the emitter terminal ET, the semiconductor chip CHP2, the semiconductor chip CHP1 and the signal terminal SGT are disposed along a y direction that is a first direction. Specifically, when seen in a plan view, the semiconductor chip CHP2 is mounted on the upper surface of the chip mounting part TAB so as to be closer to the emitter terminal ET than the semiconductor chip CHP1, and the semiconductor chip CHP1 is mounted on the upper surface of the chip mounting part TAB so as to be closer to the signal terminal SGT than the semiconductor chip CHP2.

Further, when seen in a plan view, the semiconductor chip CHP1 is mounted on the upper surface of the chip mounting part TAB so that the gate electrode pad GP is closer to the signal terminal SGT than the emitter electrode pad EP. More concretely, when seen in a plan view, the semiconductor chip CHP1 is mounted on the upper surface of the chip mounting part TAB so that the plurality of electrode pads including the gate electrode pad GP, the temperature detection electrode pad TCP, the temperature detection electrode pad TAP, the current detection electrode pad SEP and the Kelvin detection electrode pad KP are closer to the signal terminal SGT than the emitter electrode pad EP. In other words, when seen in a plan view, the plurality of electrode pads of the semiconductor chip CHP1 are disposed along a side closest to the signal terminal SGT among the sides of the semiconductor chip CHP1. At this time, as illustrated in FIG. 14(a), when seen in a plan view, the clip CLP is disposed so as not to overlap the plurality of electrode pads including the gate electrode pad GP and the plurality of wires W.

In the semiconductor device PAC1 having the above-described internal configuration, the semiconductor chip CHP1, the semiconductor chip CHP2, a part of the chip mounting part TAB, a part of the emitter terminal ET, a part of each of the plurality of signal terminals SGT, the clip CLP and the wire W are sealed by, for example, a resin, thereby configuring the sealing member MR.

Subsequently, in FIG. 14(c), the semiconductor chip CHP1 in which the IGBT is formed and the semiconductor chip CHP2 in which the diode is formed are mounted on the upper surface of the chip mounting part TAB via the conductive adhesive ADH1. Then, the clip CLP is disposed from the front surface of the semiconductor chip CHP1 over the front surface of the semiconductor chip CHP2 via the conductive adhesive ADH2. The clip CLP is further connected to the emitter terminal ET by the conductive adhesive ADH2, and a part of the emitter terminal ET is exposed from the sealing member MR. In addition, the semiconductor chip CHP1 is connected by the wire W to the signal terminal SGT disposed on an opposite side of the emitter terminal ET (lead LD1), and a part of the signal terminal SGT (lead LD2) is also exposed from the sealing member MR.

Here, as illustrated in FIG. 14(b), the bottom surface of the chip mounting part TAB is exposed from the bottom surface of the sealing member MR, and the exposed bottom surface of the chip mounting part TAB serves as the collector terminal CT. Then, when the semiconductor device PAC1 is mounted on a wiring board, the bottom surface of the chip mounting part TAB serves as a surface that can be soldered with a wiring formed on the wiring board.

The semiconductor semiconductor chip CHP1 and the semiconductor chip CHP2 are mounted on the upper surface of the chip mounting part TAB, and the collector electrode pad of the semiconductor chip CHP1 and the cathode electrode pad of the semiconductor chip CHP2 come into contact with the chip mounting part TAB via the conductive adhesive ADH1. Accordingly, the collector electrode pad and the cathode electrode pad are electrically connected to each other through the chip mounting part TAB, and thus are electrically connected to the collector terminal CT. Furthermore, as illustrated in FIG. 14(c), a thickness of the chip mounting part TAB is larger than a thickness of the emitter terminal ET and the signal terminal SGT.

In the semiconductor device PAC1 according to the first embodiment, a silver paste containing, for example, a silver filler (Ag filler) with using a material such as an epoxy resin as a binder can be used for the conductive adhesive ADH1 and the conductive adhesive ADH2. Since the silver paste is a lead-free material that contains no lead component, the silver paste has an advantage of being good for the environment. In addition, the silver paste has an excellent temperature cycle characteristic and an excellent power cycle characteristic and can improve the reliability of the semiconductor device PAC1. Furthermore, in the case of using the silver paste, for example, since a thermal treatment on the silver paste can be performed in an inexpensive baking furnace, the cost for an assembly facility of the semiconductor device PAC1 can be reduced in comparison with a vacuum reflow apparatus used for a solder reflow process.

However, the conductive adhesive ADH1 and the conductive adhesive ADH2 are not limited to the silver paste, and for example, a solder can also be used. In the case where the solder is used as the conductive adhesive ADH1 and the conductive adhesive ADH2, the electrical conductivity of the solder is high, and thus, the advantage of reducing the on-resistance of the semiconductor device PAC1 can be obtained. Namely, the use of the solder can improve the performance of the semiconductor device PAC1 used for, for example, the inverter in which the reduction of the on-resistance is required.

Here, after the semiconductor device PAC1 according to the first embodiment is completed as a product, the semiconductor device PAC1 is mounted on a circuit board (mounting board). In this case, the solder is used to connect the semiconductor device PAC1 and the mounting board. In the case of the connection by the solder, a heat treatment (reflow) is required because the solder is melted for connection.

Therefore, when the solder used for connecting the semiconductor device PAC1 and the mounting board and the above-described solder used inside the semiconductor device PAC1 are the same material, the solder used inside the semiconductor device PAC1 is also melted by the heat treatment (reflow) applied when connecting the semiconductor device PAC1 and the mounting board. In this case, due to a volume expansion caused by the melting of the solder, cracks may occur in the resin sealing the semiconductor device PAC1, and the melted solder may leak out to the outside.

Consequently, a high-melting-point solder is used inside the semiconductor device PAC1. In this case, the high-melting-point solder used inside the semiconductor device PAC1 is not melted by the heat treatment (reflow) applied when connecting the semiconductor device PAC1 and the mounting board. As a result, it is possible to prevent the problems that cracks occur in the resin sealing the semiconductor device PAC1 due to the volume expansion caused by the melting of the solder and the melted solder leaks out to the outside.

As the solder used for connecting the semiconductor device PAC1 and the mounting board, a solder represented by tin (Sn)—silver (Ag)—copper (Cu) and having a melting point of about 220° C. is used, and the semiconductor device PAC1 is heated up to about 260° C. at the time of the reflow. Therefore, for example, the high-melting-point solder mentioned in this specification indicates a solder that is not melted even when heated to about 260° C. A representative example thereof is a solder that has a melting point of 300° C. or more and a reflow temperature of about 350° C. and contains 90 wt % or more of lead (Pb).

Basically, in the semiconductor device PAC1 according to the first embodiment, it is assumed that the conductive adhesive ADH1 and the conductive adhesive ADH2 are the same material component. However, the present invention is not limited thereto, and a material constituting the conductive adhesive ADH1 may be different from a material constituting the conductive adhesive ADH2.

<Characteristics of Semiconductor Device in First Embodiment>

Next, the characteristic points of the semiconductor device PAC1 according to the first embodiment will be described. In FIG. 14(a), the characteristic point of the first embodiment is that the support part SPU is provided inside the sealing member MR and the clip CLP is supported by the support part SPU. Specifically, as illustrated in FIG. 14(a), a pair of support parts SPU is provided so as to sandwich the semiconductor chip CHP1 and the semiconductor chip CHP2, and each of the pair of the support parts SPU extends in a y direction parallel to the projecting direction of the lead LD1 and the lead LD2. In the first embodiment, the clip CLP includes a main body part BDU and a pair of extension parts EXU. The main body part BDU connects the lead LD1, the semiconductor chip CHP1 and the semiconductor chip CHP2, and the pair of the extension parts EXU is connected to the main body part BDU and extends in an x direction. More specifically, the clip CLP includes the main body part BDU and the extension parts EXU continuous to the main body part BDU. At this time, as illustrated in FIG. 14(a), each of the pair of the extension parts EXU is mounted on each of the pair of the support parts SPU, so that the clip CLP is supported by the pair of the support parts SPU. Namely, in the first embodiment, the clip CLP is mounted on the lead LD1 (one point) and on the pair of the support parts SPU (two points), and the clip CLP is supported by these three points. In other words, when seen in a plan view, a part of the extension part EXU of the clip CLP is disposed so as to overlap the support part SPU.

Therefore, in the semiconductor device PAC1 according to the first embodiment, it is possible to disperse the weight of the clip CLP applied to the semiconductor chip CHP1 and the semiconductor chip CHP2. Specifically, according to the first embodiment, since the clip CLP is disposed on the pair of the support parts SPU as well as on the semiconductor chip CHP1 and the semiconductor chip CHP2, the weight of the clip CLP is dispersed also to the pair of the support parts SPU. This means that the load applied to the semiconductor chip CHP1 and the semiconductor chip CHP2 is reduced in comparison with the case where the pair of the support parts SPU is not provided, and it is thus possible to suppress the damage applied to the semiconductor chip CHP1 and the semiconductor chip CHP2 due to the weight of the clip CLP. For example, not a few distortions sometimes occur in the semiconductor chip CHP1 and the semiconductor chip CHP2 due to the weight of the clip CLP, and the device structure formed inside may be adversely affected. In this regard, according to the first embodiment, since the weight of the clip CLP is dispersed by the three-point support structure of the clip CLP, it is possible to reduce the adverse effects on the semiconductor chip CHP1 and the semiconductor chip CHP2. Therefore, according to the first embodiment, it is possible to improve the reliability of the semiconductor device PAC1.

Furthermore, by the three-point support structure of the clip CLP which is the characteristic point of the first embodiment, the following advantages can also be obtained. For example, the pair of the support parts SPU is made of a copper material having a high thermal conductivity like the lead LD1 and the lead LD2. As a result, heat generated from the semiconductor chip CHP1 and the semiconductor chip CHP2 is transferred to the clip CLP, and the heat is dissipated not only from the lead LD1 connected to the clip CLP but also from the extension parts EXU of the clip CLP through the pair of the support parts SPU because the clip CLP has the three-point support structure. In other words, in the semiconductor device PAC1 adopting the three-point support structure of the clip CLP according to the first embodiment, it is possible to efficiently dissipate the heat generated from the semiconductor chip CHP1 and the semiconductor chip CHP2. This means that the semiconductor device PAC1 according to the first embodiment can reduce the potential of thermal runaway, and this can also improve the reliability of the semiconductor device PAC1. For example, FIG. 14(a) illustrates an example in which the extension parts EXU extending from the main body part BDU of the clip CLP in the x direction are disposed at a position between the semiconductor chip CHP1 and the semiconductor chip CHP2 in the y direction. However, in consideration of the fact that the amount of heat generated from the semiconductor chip CHP1 in which the IGBT is formed is large, the arrangement position of the extension part EXU of the clip CLP may be shifted toward the semiconductor chip CHP1 from the viewpoint of efficiently dissipating the heat generated from the semiconductor chip CHP1. In this case, since the heat generated from the semiconductor chip CHP1 from which the large amount of heat is generated can be efficiently dissipated from the pair of the extension parts EXU of the clip CLP to the pair of the support parts SPU, it is possible to further improve the reliability of the semiconductor device PAC1.

As described above, from the viewpoint of improving the heat dissipation efficiency of the semiconductor device PAC1, the configuration in which the arrangement position of the extension part EXU is shifted toward the semiconductor chip CHP1 so as to overlap the emitter electrode pad EP formed on the front surface of the semiconductor chip CHP1 is more desirable than the configuration in which the extension part EXU is disposed at a position between the semiconductor chip CHP1 and the semiconductor chip CHP2.

On the other hand, from the viewpoint of preventing moisture from penetrating into the inside of the semiconductor device PAC1, the configuration in which the extension part EXU is disposed at a position between the semiconductor chip CHP1 and the semiconductor chip CHP2 has advantages over the configuration in which the extension parts EXU are disposed so as to overlap the emitter electrode pad EP formed on the front surface of the semiconductor chip CHP1. In the following, this point will be described.

As illustrated in FIG. 14(a), in the semiconductor device PAC1 according to the first embodiment, the end portions of the support parts SPU are exposed from the first side surface (side S1) and the second side surface (side S2) of the sealing member MR. Thus, in the first embodiment, there is the potential that moisture penetrates from the outside to the inside of the semiconductor device PAC1 through the exposed end portion of the support part SPU.

However, as illustrated in FIG. 14(a), in the semiconductor device PAC1 according to the first embodiment, the support part SPU and the extension part EXU of the clip CLP are separately configured (first point). In addition, the extending direction of the support part SPU (y direction) and the extending direction of the extension part EXU of the clip CLP (x direction) are perpendicular to each other, and thus a distance from the exposed end portion of the support part SPU to the semiconductor chip CHP1 (semiconductor chip CHP2) is long (second point). Accordingly, first, from the first point, a stepped barrier is formed at a joint portion between the support part SPU and the extension part EXU of the clip CLP in a moisture penetration path. Also, from the second point, the moisture penetration path to the semiconductor chip CHP1 or the semiconductor chip CHP2 becomes long. As a result, from the above-described first and second points, it is possible to sufficiently suppress the moisture penetrating from the outside of the semiconductor device PAC1 from reaching the semiconductor chip CHP1 or the semiconductor chip CHP2 in the semiconductor device PAC1 according to the first embodiment.

Furthermore, in the configuration in which the extension part EXU is disposed at a position between the semiconductor chip CHP1 and the semiconductor chip CHP2, even when moisture penetrates up to the extension part EXU of the clip CLP, the extension part EXU does not overlap the semiconductor chip CHP1 and the semiconductor chip CHP2 when seen in a plan view. Therefore, it is possible to reduce the potential that the penetrated moisture reaches the emitter electrode pad EP formed on the front surface of the semiconductor chip CHP1 and the anode electrode pad ADP formed on the front surface of the semiconductor chip CHP2 (third point).

Therefore, in the configuration in which the extension part EXU is disposed at a position between the semiconductor chip CHP1 and the semiconductor chip CHP2, the advantage of the third point can be obtained in addition to the above-described first and second points. Thus, in particular, in the configuration in which the extension part EXU is disposed at a position between the semiconductor chip CHP1 and the semiconductor chip CHP2, it is possible to effectively suppress the corrosion of the electrode pads due to the penetration of moisture from the outside to the inside of the semiconductor device PAC1. Namely, from the viewpoint of suppressing the degradation in the reliability of the semiconductor device PAC1 due to the moisture penetrated up to the semiconductor chip CHP1 or the semiconductor chip CHP2, the configuration in which the extension part EXU is disposed at a position between the semiconductor chip CHP1 and the semiconductor chip CHP2 is more advantageous.

As illustrated in FIG. 14(a), in the semiconductor device PAC1 according to the first embodiment, the region where the support part SPU overlaps the extension part EXU is enclosed in the sealing member MR when seen in a plan view. The connection structure of the support part SPU and the extension part EXU is as follows.

FIG. 14(b) is a cross-sectional view taken along a line A-A of FIG. 14(a). As illustrated in FIG. 14(b), a projection part PJU is provided in the clip CLP, and the projection part PJU is pressed to a side surface of the support part SPU. Also, the clip CLP is mounted on the support part SPU in a state in which the projection part PJU is pressed to the side surface (inner surface) of the support part SPU. In this manner, in the semiconductor device PAC1 according to the first embodiment, the position of the clip CLP can be fixed by pressing the projection part PJU to the side surface of the support part SPU, and the support part SPU can support the clip CLP by mounting the clip CLP on the support part SPU.

<Manufacturing Method of Semiconductor Device in First Embodiment>

Next, the manufacturing method of the semiconductor device according to the first embodiment will be described with reference to the drawings.

1. Process of Preparing Chip Mounting Part

Figure 15:
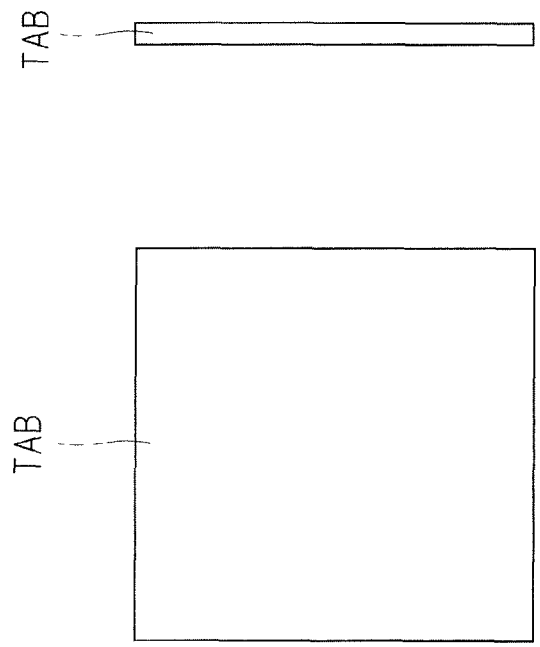
FIG. 15 is a diagram illustrating a manufacturing process of a semiconductor device according to the first embodiment.

First, as illustrated in FIG. 15, the chip mounting part TAB is prepared. The chip mounting part TAB has, for example, a rectangular shape and is made of a material containing copper as a main component.

2. Chip Mounting Process

Figure 16:
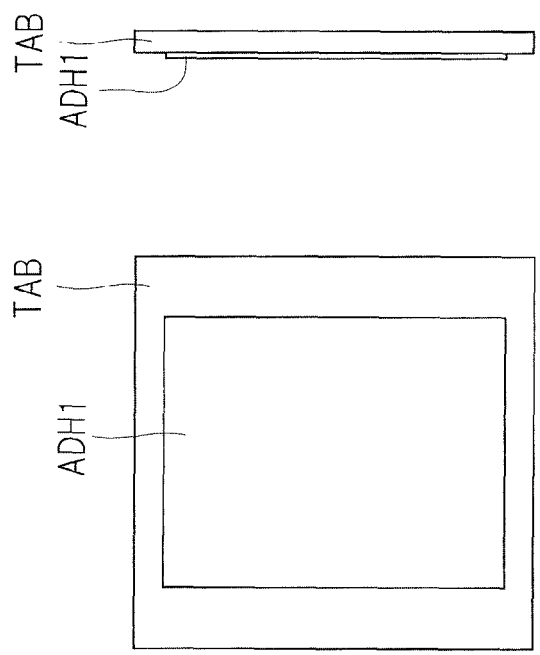
FIG. 16 is a diagram illustrating the manufacturing process of a semiconductor device continued from FIG. 15.
Figure 17:
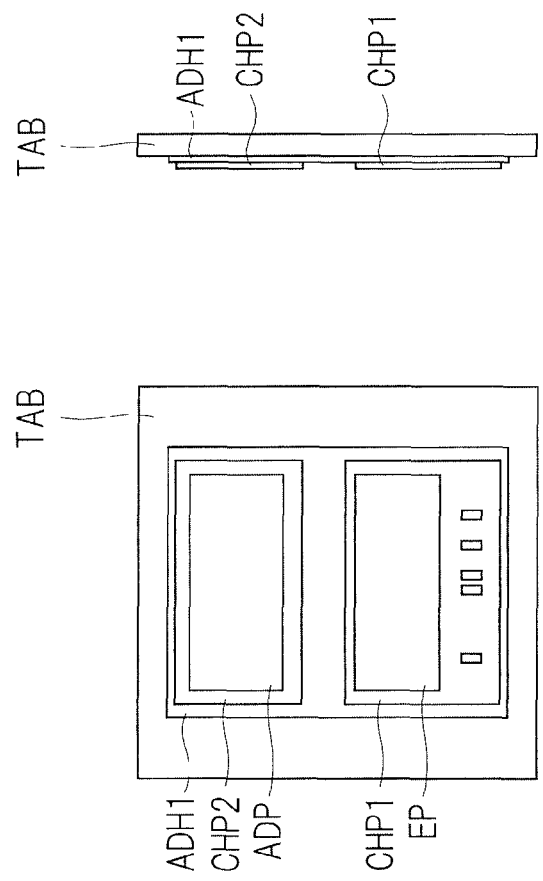
FIG. 17 is a diagram illustrating the manufacturing process of a semiconductor device continued from FIG. 16.

Next, as illustrated in FIG. 16, for example, the conductive adhesive ADH1 is formed on the chip mounting part TAB. As the conductive adhesive ADH1, for example, a silver paste or a high-melting-point solder can be used. Subsequently, as illustrated in FIG. 17, the semiconductor chip CHP1 in which an IGBT is formed and the semiconductor chip CHP2 in which a diode is formed are mounted on the chip mounting part TAB.

Here, the semiconductor chip CHP2 in which the diode is formed is disposed so that a cathode electrode pad formed on the rear surface of the semiconductor chip CHP2 comes into contact with the chip mounting part TAB via the conductive adhesive ADH1. As a result, the anode electrode pad ADP formed on the front surface of the semiconductor chip CHP2 is directed upward.

On the other hand, the semiconductor chip CHP1 in which the IGBT is formed is disposed so that a collector electrode pad formed on the rear surface of the semiconductor chip CHP1 comes into contact with the chip mounting part TAB via the conductive adhesive ADH1. In this manner, the cathode electrode pad of the semiconductor chip CHP2 and the collector electrode pad of the semiconductor chip CHP1 are electrically connected to each other through the chip mounting part TAB. In addition, the emitter electrode pad EP and the plurality of electrode pads (plurality of signal electrode pads) formed on the front surface of the semiconductor chip CHP1 are directed upward.

Regarding the mounting order of the semiconductor chip CHP1 in which the IGBT is formed and the semiconductor chip CHP2 in which the diode is formed, the semiconductor chip CHP1 may be mounted before the semiconductor chip CHP2, or the semiconductor chip CHP1 may be mounted after the semiconductor chip CHP2.

Thereafter, when the conductive adhesive ADH1 is a silver paste, a heat treatment (bake process) is performed.

3. Process of Arranging Lead Frame

Figure 18:
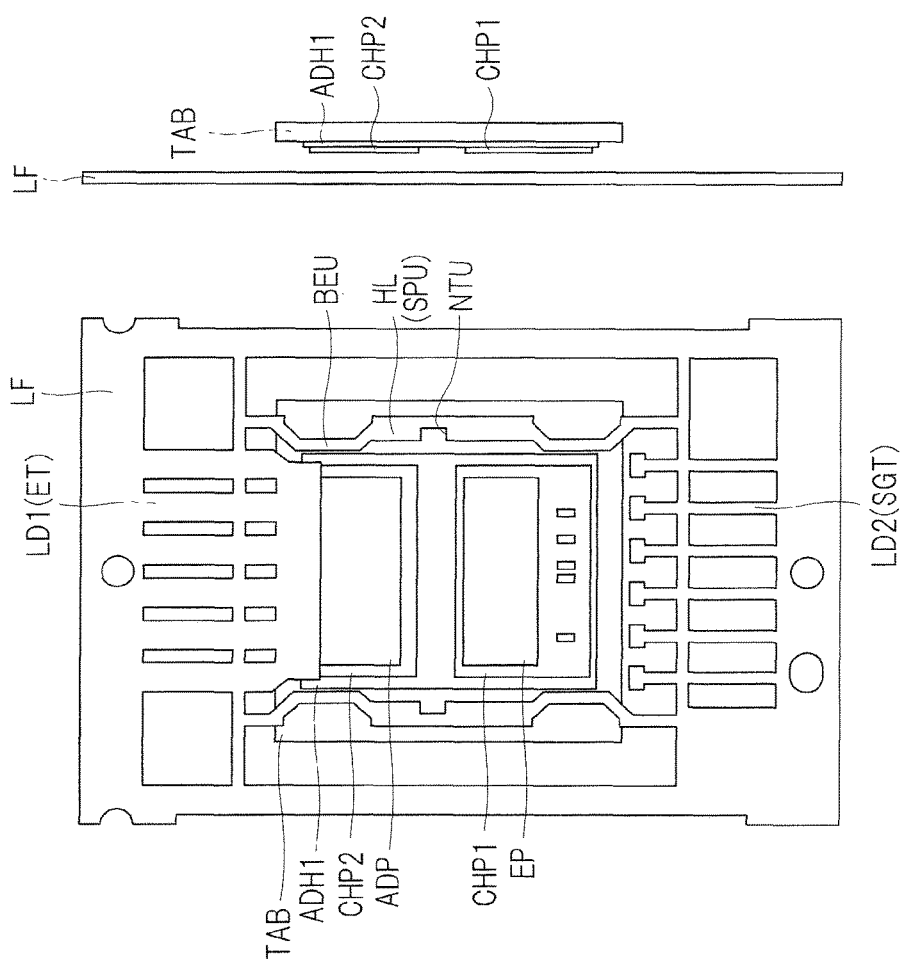
FIG. 18 is a diagram illustrating the manufacturing process of a semiconductor device continued from FIG. 17.

Next, as illustrated in FIG. 18, a lead frame LF is prepared. Here, as illustrated in FIG. 18, a thickness of the chip mounting part TAB is larger than a thickness of the lead frame LF. In addition, a plurality of leads LD1, a plurality of leads LD2 and hanging parts HL functioning as a pair of support parts SPU are formed in the lead frame LF. In the hanging part HL, a bent part BEU is formed and a notch part NTU is formed.

Thereafter, as illustrated in FIG. 18, the lead frame LF is disposed above the chip mounting part TAB on which the semiconductor chip CHP1 and the semiconductor chip CHP2 are mounted. At this time, the semiconductor chip CHP1 in which the IGBT is formed is disposed at a position close to the lead LD2, and the semiconductor chip CHP2 in which the diode is formed is disposed at a position close to the lead LD1. Specifically, when seen in a plan view, the semiconductor chip CHP2 is mounted so as to be sandwiched between the lead LD1 and the semiconductor chip CHP1, and the semiconductor chip CHP1 is disposed so as to be sandwiched between the lead LD2 and the semiconductor chip CHP2. Then, in the semiconductor chip CHP1 in which the IGBT is formed, the emitter electrode pad EP is disposed on the side close to the lead LD1, and the plurality of electrode pads (signal electrode pads) are disposed on the side close to the lead LD2. Furthermore, when seen in a plan view, the hanging part HL is disposed so as to partially overlap the chip mounting part TAB and so as not to overlap the semiconductor chip CHP1 and the semiconductor chip CHP2. In the arrangement relationship like this, the lead frame LF is disposed above the chip mounting part TAB on which the semiconductor chip CHP1 and the semiconductor chip CHP2 are mounted.

4. Electrical Connecting Process

Figure 19:
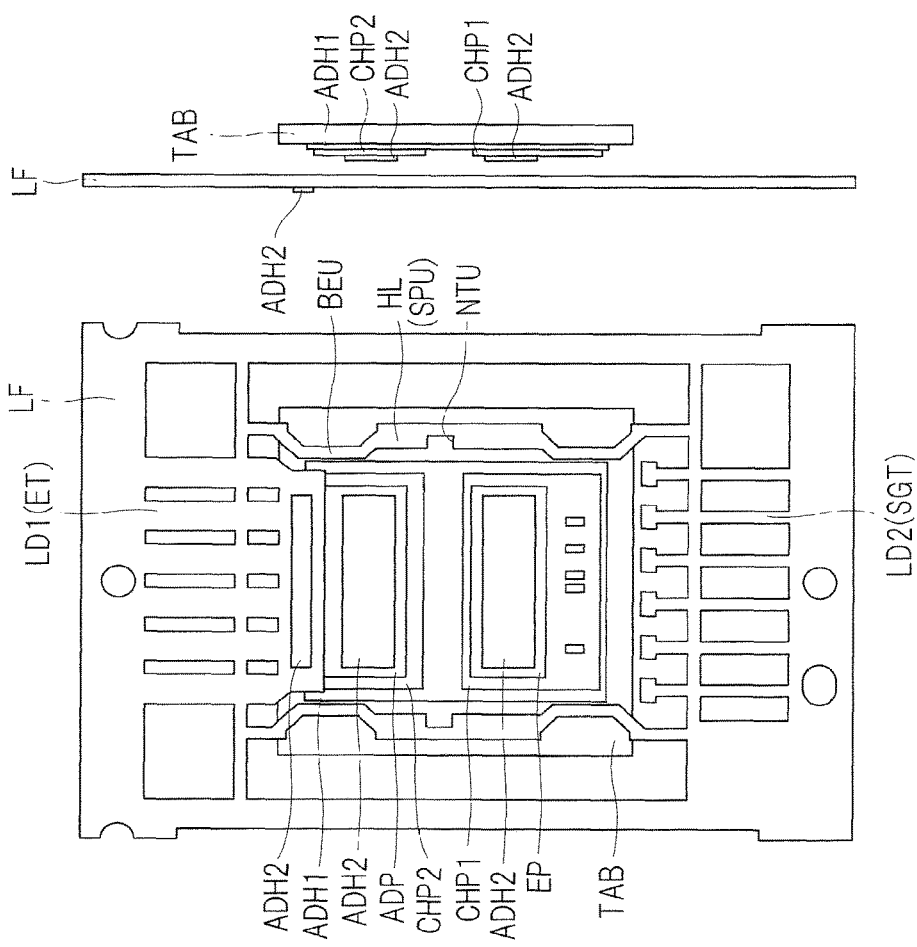
FIG. 19 is a diagram illustrating the manufacturing process of a semiconductor device continued from FIG. 18.

Subsequently, as illustrated in FIG. 19, the conductive adhesive ADH2 made of, for example, a silver paste or a high-melting-point solder is formed on the anode electrode pad ADP of the semiconductor chip CHP2. Thereafter, the conductive adhesive ADH2 made of, for example, a silver paste or a high-melting-point solder is formed also on the emitter electrode pad EP of the semiconductor chip CHP1. Furthermore, as illustrated in FIG. 19, the conductive adhesive ADH2 made of, for example, a silver paste or a high-melting-point solder is formed also on a part of a region of the lead LD1. A material component of the conductive adhesive ADH2 formed at this time may be the same as or different from a material component of the above-described conductive adhesive ADH1.

Thereafter, as illustrated in FIG. 20, the clip CLP having the main body part BDU and the extension part EXU is prepared, and the clip CLP is mounted over the lead LD1, the semiconductor chip CHP2 and the semiconductor chip CHP1. Specifically, the main body part BDU of the clip CLP is disposed so as to lie astride the lead LD1, the semiconductor chip CHP2 and the semiconductor chip CHP1 via the conductive adhesive ADH2, and the extension part EXU of the clip CLP is disposed on the hanging part HL of the lead frame LF. In other words, when seen in a plan view, the main body part BDU of the clip CLP is disposed via the conductive adhesive ADH2 so as to overlap the emitter electrode pad EP of the semiconductor chip CHP1, the anode electrode pad ADP of the semiconductor chip CHP2 and a part of the lead LD1, and the extension part EXU of the clip CLP is disposed on the hanging part HL of the lead frame LF. At this time, as illustrated in FIG. 20, when seen in a plan view, the extension part EXU of the clip CLP is enclosed in the chip mounting part TAB. Then, the hanging part HL of the lead frame LF extends in an extending direction of the lead LD1, and the extension part EXU of the clip CLP extends in a direction intersecting with an extending direction of the lead LD2.

Figure 14:
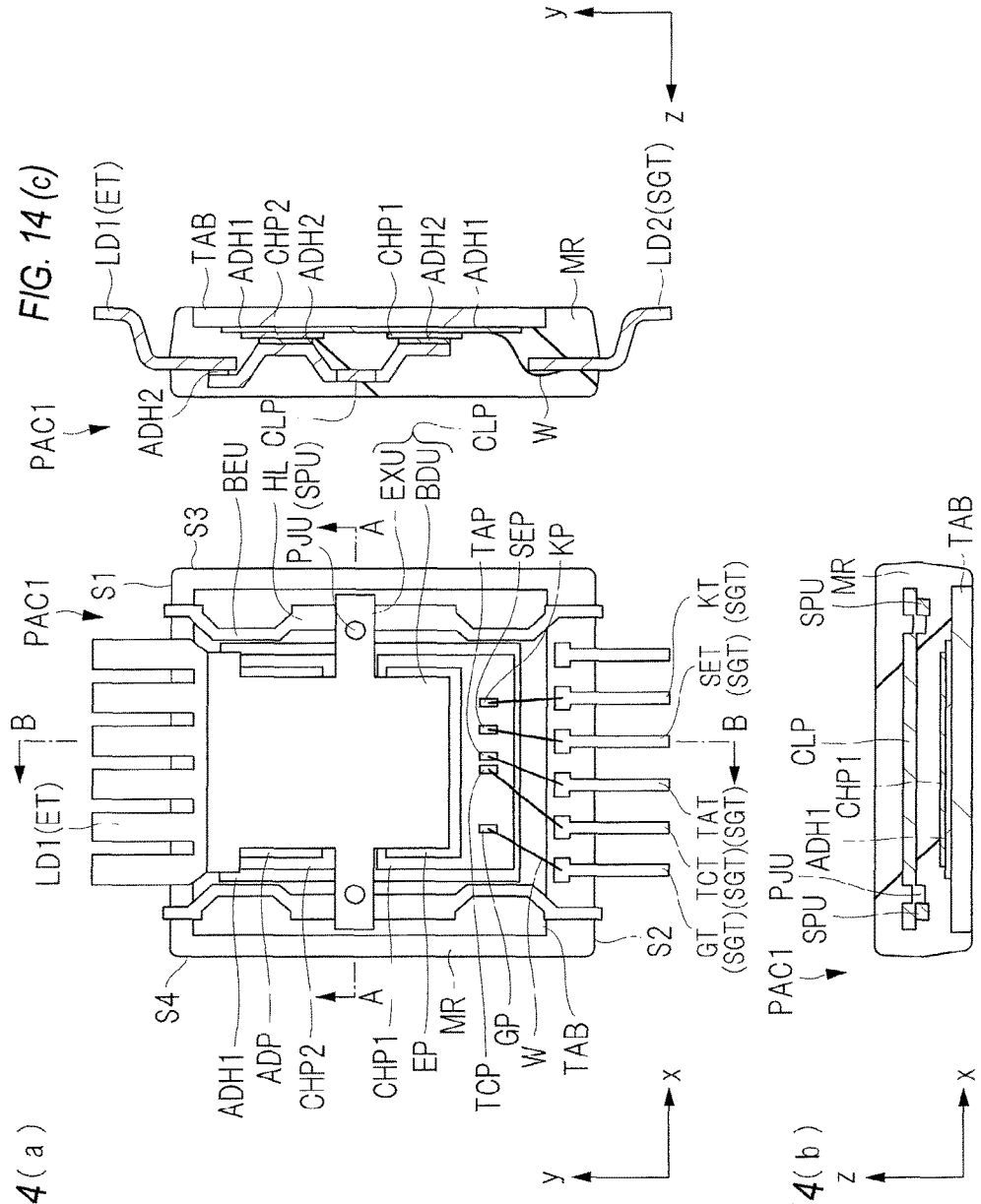
FIG. 14(a) is a plan view illustrating an internal structure of a sealing member of the semiconductor device according to the first embodiment.
FIG. 14(b) is a cross-sectional view taken along a line A-A of FIG. 14(a)
FIG. 14(c) is a cross-sectional view taken along a line B-B of FIG. 14(a)

From the above, the lead LD1, the anode electrode pad ADP formed in the semiconductor chip CHP2 and the emitter electrode pad EP formed in the semiconductor chip CHP1 are electrically connected to one another by the clip CLP. In addition, the clip CLP is supported by three points of the lead LD1 and the pair of the hanging parts HL. Specifically, the extension part EXU of the clip CLP is supported by the hanging part HL of the lead frame LF. In other words, the extension part EXU of the clip CLP is fixed to the hanging part HL of the lead frame LF. Furthermore, the extension part EXU of the clip CLP is supported to the hanging part HL of the lead frame LF by the intersecting portion of the hanging part HL and the extension part EXU. In this way, the three-point support structure of the clip CLP is realized. As illustrated in FIG. 20, when seen in a plan view, the intersecting portion of the hanging part HL and the extension part EXU is enclosed in the chip mounting part TAB. Then, as illustrated in FIGS. 14(*a*) to 14(*c*), when seen in a plan view, the chip mounting part TAB is enclosed in the sealing member MR that is formed in a process to be described below. Therefore, in the first embodiment, the intersecting portion of the hanging part HL and the extension part EXU is enclosed in the sealing member MR that is formed in the process to be described below.

Figure 21A:
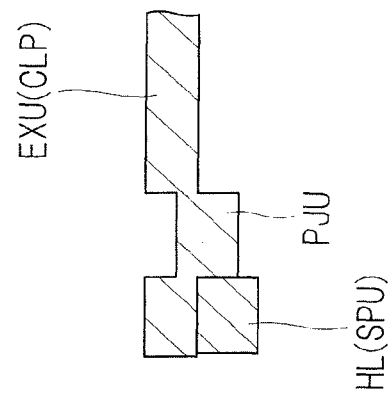
FIG. 21(a) is a plan view illustrating an arrangement structure of a hanging part of a lead frame and an extension part of a clip.
Figure 21B:
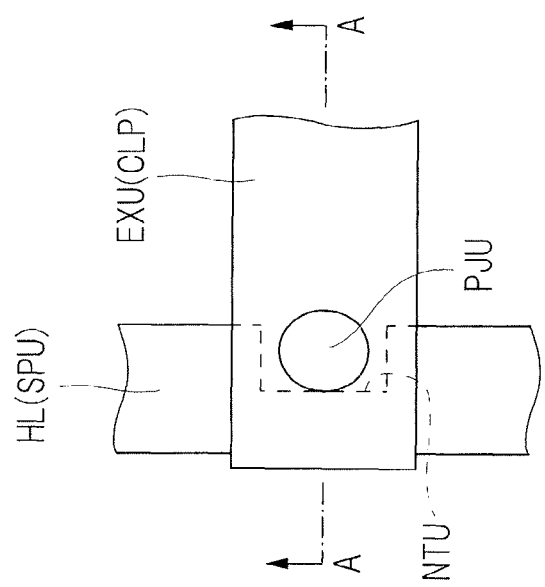
FIG. 21(b) is a cross-sectional view taken along a line A-A of FIG. 21(a)

FIGS. 21(a) and 21(b) are diagrams to illustrate an arrangement structure of the hanging part HL of the lead frame LF and the extension part EXU of the clip CLP according to the first embodiment. In particular, FIG. 21(a) is a plan view illustrating the arrangement structure of the hanging part HL of the lead frame LF and the extension part EXU of the clip CLP, and FIG. 21(b) is a cross-sectional view taken along a line A-A of FIG. 21(a).

As illustrated in FIGS. 21(a) and 21(b), the notch part NTU is provided in the hanging part HL of the lead frame LF, and the projection part PJU is provided in the extension part EXU of the clip CLP. Then, the extension part EXU of the clip CLP is disposed on the hanging part HL of the lead frame LF in a state in which the projection part PJU is pressed to the inside of the notch part NTU. In this manner, the extension part EXU of the clip CLP is fixed to the hanging part HL of the lead frame LF. In this manner, the arrangement structure of the hanging part HL of the lead frame LF and the extension part EXU of the clip CLP according to the first embodiment is realized.

However, the arrangement structure of the hanging part HL of the lead frame LF and the extension part EXU of the clip CLP is not limited thereto, and the following arrangement structure can be adopted. FIG. 22(a) is a plan view illustrating the arrangement structure of the hanging part HL of the lead frame LF and the extension part EXU of the clip CLP, and FIG. 22(b) is a cross-sectional view taken along a line A-A of FIG. 22(a).

Figure 22B:
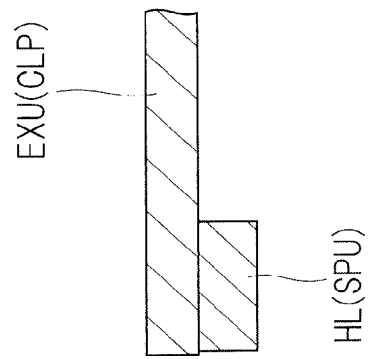
FIG. 22(b) is a cross-sectional view taken along a line A-A of FIG. 22(a)
Figure 22A:
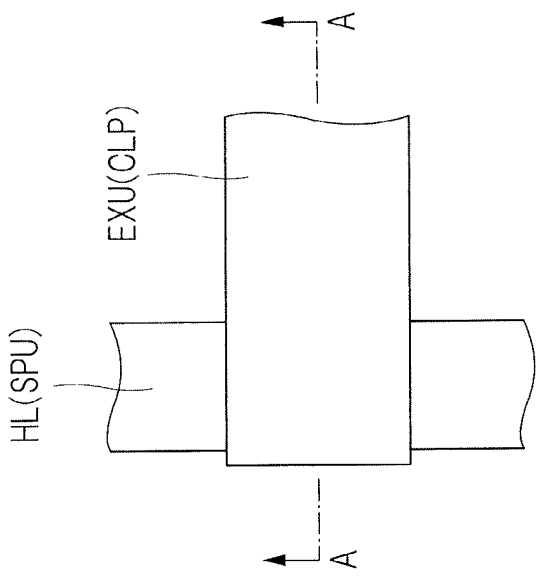
FIG. 22(a) is a plan view illustrating an arrangement structure of a hanging part of a lead frame and an extension part of a clip.

As illustrated in FIGS. 22(a) and 22(b), the notch part NTU is not provided in the hanging part HL of the lead frame LF, and the projection part PJU is not provided in the extension part EXU of the clip CLP. Therefore, the extension part EXU of the clip CLP is simply disposed on the hanging part HL of the lead frame LF. Also in this manner, the arrangement structure of the hanging part HL of the lead frame LF and the extension part EXU of the clip CLP can be realized.

Figure 23B:
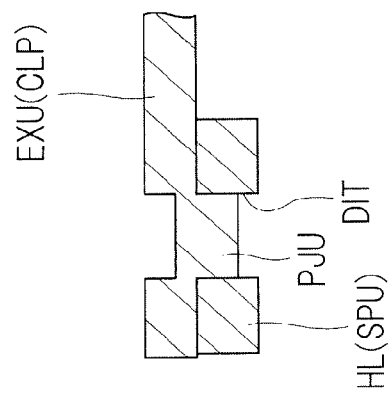
FIG. 23(b) is a cross-sectional view taken along a line A-A of FIG. 23(a)
Figure 23A:
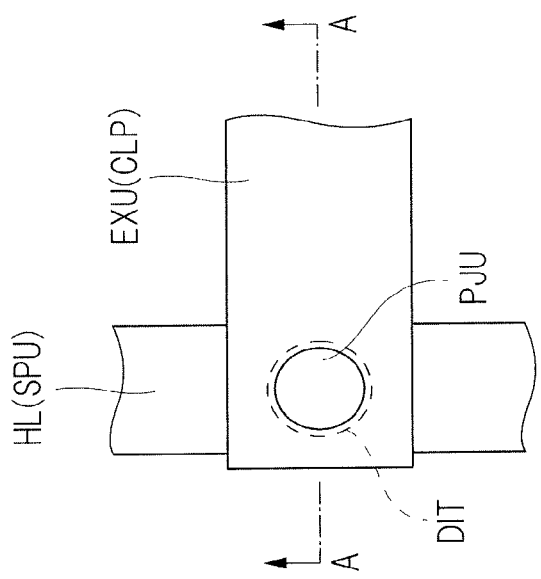
FIG. 23(a) is a plan view illustrating an arrangement structure of a hanging part of a lead frame and an extension part of a clip.

Furthermore, FIG. 23(a) is a plan view illustrating the arrangement structure of the hanging part HL of the lead frame LF and the extension part EXU of the clip CLP, and FIG. 23(b) is a cross-sectional view taken along a line A-A of FIG. 23(a).

As illustrated in FIGS. 23(a) and 23(b), a groove part DIT is provided in the hanging part HL of the lead frame LF, and a projection part PJU is provided in the extension part EXU of the clip CLP. Then, the extension part EXU of the clip CLP is disposed on the hanging part HL of the lead frame LF in a state in which the projection part PJU is inserted into the groove part DIT. Thus, the extension part EXU of the clip CLP is fixed to the hanging part HL of the lead frame LF. Also in this manner, the arrangement structure of the hanging part HL of the lead frame LF and the extension part EXU of the clip CLP can be realized.

As described above, the main body part BDU of the clip CLP is disposed so as to lie astride the lead LD1, the semiconductor chip CHP2 and the semiconductor chip CHP1 via the conductive adhesive ADH2, and the extension part EXU of the clip CLP is disposed on the hanging part HL of the lead frame LF. Thereafter, a heat treatment is performed. Specifically, when the conductive adhesive ADH2 is a silver paste, the bake process is performed. On the other hand, when the conductive adhesive ADH2 is a high-melting-point solder, the reflow process is performed. In particular, when both of the conductive adhesive ADH1 and the conductive adhesive ADH2 are the high-melting-point solder, a batch reflow process is performed on the conductive adhesive ADH1 and the conductive adhesive ADH2 in this process.

The processes so far are performed by using an assembly jig, and the chip mounting part TAB on which the semiconductor chip CHP1 and the semiconductor chip CHP2 are mounted and the lead frame LF are connected to each other by the clip CLP having the three-point support structure, thereby forming an integrated structure. After the integrated structure is formed, for example, the integrated structure is taken out from the assembly jig and is conveyed to a wire bonding apparatus, and a wire bonding process to connect the semiconductor chip CHP1 and the lead LD2 by wires W is performed.

Specifically, as illustrated in FIGS. 24(a) and 24(b), the bent part BEU is provided in the hanging part HL of the lead frame LF, and a space SPC is ensured at four corners of the chip mounting part TAB by the bent part BEU. Namely, in the hanging part HL of the lead frame LF, the bent part BEU for ensuring the space SPC is formed in a region that partially overlaps the chip mounting part TAB. Then, the chip mounting part TAB is fixed with the jig JG by pressing the jig JG to the space SPC ensured by the bent part BEU.

Next, the signal electrode pad formed on the front surface of the semiconductor chip CHP1 and the lead LD2 (signal lead) formed in the lead frame LF are connected to each other by the wire W in a state in which the chip mounting part TAB is fixed with the jig JG. In this manner, since the chip mounting part TAB does not move, the wire bonding process can be reliably performed. At this time, in the first embodiment, since the lead LD2 is disposed on an opposite side of the lead LD1 to which the clip CLP is connected, the wire bonding process can be performed without considering interference due to the clip CLP. Thereafter, as illustrated in FIG. 25, the jig JG is removed and the wire bonding process is completed.

5. Sealing (Molding) Process

Subsequently, FIG. 26(a) is a plan view illustrating a sealing process, and FIG. 26(b) is a cross-sectional view taken along a line A-A of FIG. 26(a). As illustrated in FIGS. 26(a) and 26(b), the semiconductor chip CHP1, the semiconductor chip CHP2, a part of the chip mounting part TAB, a part of the lead LD1, a part of each of the plurality of leads LD2, the clip CLP and the wire W2 are sealed, thereby forming the sealing member MR.

At this time, the sealing member MR has an upper surface, a bottom surface on an opposite side of the upper surface, a first side surface disposed between the upper surface and the bottom surface in a thickness direction thereof, and a second side surface facing the first side surface. In FIG. 26(a), a side S1 of the first side surface and a side S2 of the second side surface are illustrated. Furthermore, in the sealing member MR, the lead LD1 projects from the first side surface (side S1) of the sealing member MR and the plurality of leads LD2 project from the second side surface (side S2) of the sealing member MR.

Here, in the sealing process according to the first embodiment, as illustrated in FIG. 26(b), the sealing member MR is formed while pressing the chip mounting part TAB by the pressing pin PN. As a result, according to the first embodiment, it is possible to suppress the entrance of the resin below the bottom surface of the chip mounting part TAB. Consequently, the bottom surface of the chip mounting part TAB can be exposed from the sealing member MR.

6. Exterior Plating Process

Thereafter, as illustrated in FIG. 27, a tie bar provided in the lead frame LF is cut. In the sealing process illustrated in FIGS. 26(a) and 26(b), since the sealing member MR is formed while pressing the chip mounting part TAB by the pressing pin PN, pin marks PM are formed in the sealing member MR as illustrated in FIG. 27. Then, as illustrated in FIG. 28, a plating layer (tin film) that is a conductive film is formed on the chip mounting part TAB exposed from the bottom surface of the sealing member MR, a surface of a part of the lead LD1 and a surface of apart of the lead LD2. Namely, the plating layer is formed on a portion of the lead LD1 exposed from the sealing member MR, portions of the plurality of leads LD2 exposed from the sealing member MR and the bottom surface of the chip mounting part TAB.

7. Marking Process

Then, information (mark), for example, a product name or a model number is formed on the front surface of the sealing member MR made of a resin. As the method of forming the mark, a printing method or an engraving method of forming the mark by irradiating the surface of the sealing member with a laser can be used.

8. Singulation Process

Subsequently, the lead LD1 and the plurality of leads LD2 are separated from the lead frame LF by cutting a part of the lead LD1 and a part of each of the plurality of leads LD2. Thus, the semiconductor device PAC1 according to the first embodiment can be manufactured. Thereafter, the lead LD1 and each of the plurality of leads LD2 are processed into desired shapes. Then, for example, after a test process for testing electrical characteristics is performed, the semiconductor device PAC1 determined as a non-defective product is shipped (see FIGS. 13(a) to 13(c)). As described above, the semiconductor device PAC1 according to the first embodiment can be manufactured.

<Characteristics in Manufacturing Method>

Here, the characteristic points in the manufacturing method of the semiconductor device according to the first embodiment will be described. As described above, the first characteristic point according to the first embodiment is that the pair of the extension parts EXU is mounted and supported on the pair of the hanging parts HL on the assumption that the pair of the hanging parts HL is provided in the lead frame LF and the clip CLP includes the main body part BDU and the pair of the extension parts EXU as illustrated in FIG. 20. Thus, the clip CLP is mounted on the lead LD1 (one point) and the pair of the hanging parts HL (two points), and the clip CLP is supported by the three points. Namely, in the manufacturing method of the semiconductor device according to the first embodiment, by performing the clip mounting process, the chip mounting part TAB on which the semiconductor chip CHP1 and the semiconductor chip CHP2 are mounted and the lead frame LF are connected to each other by the clip CLP having the three-point support structure, so that the integrated structure is formed. Thereafter, for example, the integrated structure is taken out from the assembly jig and is conveyed to the wire bonding apparatus, and the wire bonding process of connecting the semiconductor chip CHP1 and the lead LD2 by the wire W is performed. At this time, according to the first embodiment, the chip mounting part TAB on which the semiconductor chip CHP1 and the semiconductor chip CHP2 are mounted and the lead frame LF are connected to each other by the clip CLP having the three-point support structure. Accordingly, even when impact and vibration are applied to the integrated structure in the conveyance process to the wire bonding apparatus, since the connection strength is improved by the three-point support structure of the clip CLP, it is possible to suppress the damage applied to the joint portion between the clip CLP and the semiconductor chip CHP1 and the joint portion between the clip CLP and the semiconductor chip CHP2. In addition, it is also possible to suppress the deformation of the clip CLP itself. As a result, according to the first characteristic point of the first embodiment that realizes the three-point support structure of the clip CLP, the manufacturing yield of the semiconductor device can be improved and thus the high-reliability semiconductor device can be manufactured.

Subsequently, the second characteristic point of the first embodiment is that the projection part PJU provided in the extension part EXU of the clip CLP is pressed and fixed to the notch part NTU provided in the hanging part HL of the lead frame as illustrated in FIGS. 21(a) and 21(b). Accordingly, since the position of the clip CLP is fixed, it is possible to suppress the planar positional shift of the clip CLP, and thus, it is possible to suppress the electrical connection failure caused by the planar positional shift of the clip CLP. In particular, according to the second characteristic point of the first embodiment, it is possible to suppress the positional shift of the clip CLP even when the solder connection is used for the connection between the clip CLP and the semiconductor chip CHP1 and between the clip CLP and the semiconductor chip CHP2. Specifically, according to the second characteristic point of the first embodiment, even when the clip CLP is to slide in a predetermined direction in accordance with a spread state of the melted solder at the time of the reflow, since the position of the clip CLP is fixed, it is possible to suppress the planar positional shift of the clip CLP. In particular, according to the first embodiment, each of the projection parts PJU provided in the pair of the extension parts EXU is pressed and fixed to each of the notch parts NTU provided in the pair of the hanging parts HL. Therefore, according to the first embodiment, the clip CLP is fixed by two points having a symmetrical relationship, and thus it is possible to effectively prevent the planar positional shift of the clip CLP.

Next, the third characteristic point of the first embodiment will be described. FIG. 29 is a cross-sectional view taken along a line A-A of FIG. 25. As illustrated in FIG. 29, the clip CLP according to the first embodiment is mounted on the hanging part HL of the lead frame LF. This means that it is possible to ensure a gap between the clip CLP and the semiconductor chip CHP1 in a thickness direction and a gap between the clip CLP and the semiconductor chip CHP2 in a thickness direction as illustrated in FIG. 29. Namely, according to the first embodiment, it is possible to suppress the loss of height uniformity of the clip CLP due to the load applied to the clip CLP and the weight of the clip CLP itself in the clip mounting process. In other words, according to the first embodiment, since the clip CLP is supported on the hanging part HL of the lead frame LF, the uneven sinking of the clip CLP due to the load applied to the clip CLP and the weight of the clip CLP itself is less likely occur. As a result, as illustrated in FIG. 29, since the height of the clip CLP becomes uniform, it is possible to prevent the thickness of the conductive adhesive ADH2 connecting the clip CLP and the semiconductor chip CHP1 and the conductive adhesive ADH2 connecting the clip CLP and the semiconductor chip CHP2 from being reduced and becoming uneven. Thus, in the semiconductor device manufactured by the manufacturing method according to the first embodiment, it is possible to prevent the deterioration of thermal fatigue resistance such as the temperature cycle characteristic and the power cycle characteristic due to the reduced thickness and the uneven thickness of the conductive adhesive ADH2.

From the above, it can be understood that it is possible to eliminate the first to third rooms for improvement existing in the related art by providing the first characteristic point, the second characteristic point and the third characteristic point according to the first embodiment.

Next, the fourth characteristic point of the first embodiment will be described. The fourth characteristic point of the first embodiment is that the bent part BEU is formed in the hanging part HL provided in the lead frame LF as illustrated in FIGS. 24(*a*) and 24(*b*). In this way, even though the hanging part HL is provided in the lead frame LF, the space SPC can be provided in the chip mounting part TAB. In this case, for example, as illustrated in FIGS. 24(*a*) and 24(*b*), the wire bonding process can be performed while pressing the jig JG to the space SPC ensured by the bent part BEU without being obstructed by the hanging part HL provided in the lead frame LF. Thus, according to the first embodiment, since the chip mounting part TAB does not move, the wire bonding process can be reliably performed, so that the connection reliability of the wire W can be improved. Furthermore, according to the fourth characteristic point of the first embodiment, for example, it is possible to form the sealing member in a state in which the pressing pin PN is pressed to the space SPC ensured in the chip mounting part TAB. Therefore, according to the first embodiment, it is possible to suppress the entrance of the resin below the bottom surface of the chip mounting part TAB, so that it is possible to expose the bottom surface of the chip mounting part TAB from the sealing member MR. As described above, the fourth characteristic point of the first embodiment in which the bent part BEU is provided in the hanging part HL of the lead frame LF has the technical significance of ensuring the space SPC at four corners of the chip mounting part TAB even when the hanging part HL is provided in the lead frame LF, and this technical significance is particularly exerted in the wire bonding process and the sealing process.

Furthermore, the fifth characteristic point according to the first embodiment is that most of the hanging part HL formed in the lead frame LF and the extension part EXU of the clip CLP are enclosed in the sealing member MR and the intersecting portion of the hanging part HL and the extension part EXU of the clip CLP is disposed inside the sealing member MR as illustrated in FIGS. 25 and 26. Thus, according to the first embodiment, it is possible to simplify the structure of the molding die used in the sealing process.

<Configuration of Electronic Device in First Embodiment>

In the semiconductor device according to the first embodiment, one IGBT Q1 and one diode FWD to be constituent elements of the inverter circuit INV illustrated in FIG. 3 are provided in a single package. Therefore, the electronic device (power module) serving as the three-phase inverter circuit INV is configured by using six semiconductor devices according to the first embodiment. In the following, the configuration of the electronic device will be described with reference to the drawings.

FIGS. 30(*a*) and 30(*b*) are diagrams to illustrate the configuration of the electronic device EA according to the first embodiment. Specifically, FIG. 30(*a*) is a plan view illustrating the configuration of the electronic device EA according to the first embodiment, and FIG. 30(*b*) is a side view seen from the lower side of FIG. 30(*a*).

As illustrated in FIG. 30(*a*), the electronic device EA according to the first embodiment includes a wiring board WB, and six semiconductor devices PAC1(A) to PAC1(F) are mounted on the wiring board WB.

The wiring board WB is made of, for example, an insulated metal substrate (IMS). The insulated metal substrate includes a resin insulating layer formed on an Al base made of aluminum and a copper foil constituting a wiring on the resin insulating layer. The six semiconductor devices PAC1(A) to PAC1(F) are connected to the wirings made of a copper foil formed on the surface of the insulated metal substrate by solder. In the first embodiment, thermal resistance can be reduced by using the insulated metal substrate as the wiring board WB. This is because, since the resin insulating layer is thin and the Al base having high thermal conductivity is thick in the insulated metal substrate, it is possible to improve the heat dissipation efficiency. As a result, it is possible to suppress the increase in temperature of the electronic device EA according to the first embodiment, so that it is possible to improve the reliability of the electronic device EA.

In the electronic device EA according to the first embodiment, for example, as illustrated in FIG. 30(*a*), the semiconductor device PAC1(A) and the semiconductor device PAC1(B) are arranged in the y direction, the semiconductor device PAC1(C) and the semiconductor device PAC1(D) are arranged in the y direction, and the semiconductor device PAC1(E) and the semiconductor device PAC1(F) are arranged in the y direction.

At this time, the semiconductor device PAC1(A) constitutes the upper arm of the first leg LG1 illustrated in FIG. 3, and the semiconductor device PAC1(B) constitutes the lower arm of the first leg LG1 illustrated in FIG. 3. Similarly, the semiconductor device PAC1(C) constitutes the upper arm of the second leg LG2 illustrated in FIG. 3, and the semiconductor device PAC1(D) constitutes the lower arm of the second leg LG2 illustrated in FIG. 3. In addition, the semiconductor device PAC1(E) constitutes the upper arm of the third leg LG3 illustrated in FIG. 3, and the semiconductor device PAC1(F) constitutes the lower arm of the third leg LG3 illustrated in FIG. 3.

Also, as illustrated in FIG. 30(*a*) or 30(*b*), the semiconductor device PAC1(A), the semiconductor device PAC1(C) and the semiconductor device PAC1(E) are arranged in the x direction, and the semiconductor device PAC1(B), the semiconductor device PAC1(D) and the semiconductor device PAC1(F) are arranged in the x direction. Therefore, in the electronic device EA according to the first embodiment, each of the three semiconductor devices PAC1(A), PAC1(C) and PAC1(E) arranged in a lower side of the wiring board WB along the x direction becomes the constituent element of the upper arm of each of the first to third legs LG1 to LG3, and each of the three semiconductor devices PAC1(B), PAC1(D) and PAC1(F) arranged in an upper side of the wiring board WB along the x direction becomes the constituent element of the lower arm of each of the first to third legs LG1 to LG3.

At this time, for example, when focusing on the semiconductor device PAC1(A) and the semiconductor device PAC1(B), the semiconductor device PAC1(A) and the semiconductor device PAC1(B) are arranged along the y direction so that the leads LD1 thereof face each other when seen in a plan view. Similarly, the semiconductor device PAC1(C) and the semiconductor device PAC1(D) are arranged along the y direction so that the leads LD1 thereof face each other, and the semiconductor device PAC1(E) and the semiconductor device PAC1(F) are arranged along the y direction so that the leads LD1 thereof face each other.

On the other hand, for example, when focusing on the semiconductor device PAC1(A), the semiconductor device PAC1(C) and the semiconductor device PAC1(E) arranged in the x direction, the semiconductor device PAC1(A), the semiconductor device PAC1(C) and the semiconductor device PAC1(E) are arranged along the x direction so that the leads LD1 thereof are directed in the same direction (+y direction) when seen in a plan view. Similarly, the semiconductor device PAC1(B), the semiconductor device PAC1(D) and the semiconductor device PAC1(F) are arranged along the x direction so that the leads LD1 thereof are directed in the same direction (−y direction) when seen in a plan view.

Here, for example, as illustrated in FIG. 30(a), in the y direction that is the first direction, the lead LD1 (emitter terminal) of the semiconductor device PAC1(A) projecting in the +y direction is electrically connected to a wiring WL1(U) of the wiring board WB. Meanwhile, the lead LD2 (signal terminal) of the semiconductor device PAC1(A) projecting in the −y direction is electrically connected to a wiring WL2 of the wiring board WB. Also, the bottom surface (collector terminal) of the semiconductor device PAC1(A) is electrically connected to a wiring WL3(P) of the wiring board WB extending in the x direction perpendicular to the y direction.

In addition, in FIG. 30(a), the wiring WL1(U) formed on the wiring board WB is electrically connected to the bottom surface (collector terminal) of the semiconductor device PAC1(B). Also, the lead LD2 (signal terminal) of the semiconductor device PAC1(B) projects in the +y direction and is electrically connected to the wiring WL2 of the wiring board WB. In addition, the lead LD1 (emitter terminal) of the semiconductor device PAC1(B) projects in the −y direction and is electrically connected to a wiring WL4(N1) of the wiring board WB.

Furthermore, in FIG. 30(a), the wiring WL3(P) of the wiring board WB is electrically connected to the bottom surface (collector terminal) of the semiconductor device PAC1(C). Also, the lead LD1 (emitter terminal) of the semiconductor device PAC1(C) projects in the +y direction and is electrically connected to a wiring WL1(V) of the wiring board WB. In addition, the lead LD2 (signal terminal) of the semiconductor device PAC1(C) projects in the −y direction and is electrically connected to the wiring WL2 of the wiring board WB.

In addition, in FIG. 30(a), the wiring WL1(V) formed on the wiring board WB is electrically connected to the bottom surface (collector terminal) of the semiconductor device PAC1(D). Also, the lead LD2 (signal terminal) of the semiconductor device PAC1(D) projects in the +y direction and is electrically connected to the wiring WL2 of the wiring board WB. In addition, the lead LD1 (emitter terminal) of the semiconductor device PAC1(D) projects in the −y direction and is electrically connected to a wiring WL4(N2) of the wiring board WB.

Furthermore, in FIG. 30(a), the wiring WL3(P) of the wiring board WB is electrically connected to the bottom surface (collector terminal) of the semiconductor device PAC1(E). Also, the lead LD1 (emitter terminal) of the semiconductor device PAC1(E) projects in the +y direction and is electrically connected to a wiring WL1(W) of the wiring board WB. In addition, the lead LD2 (signal terminal) of the semiconductor device PAC1(E) projects in the −y direction and is electrically connected to the wiring WL2 of the wiring board WB.

In addition, in FIG. 30(a), the wiring WL1(W) formed on the wiring board WB is electrically connected to the bottom surface (collector terminal) of the semiconductor device PAC1(F). Also, the lead LD2 (signal terminal) of the semiconductor device PAC1(F) projects in the +y direction and is electrically connected to the wiring WL2 of the wiring board WB. In addition, the lead LD1 (emitter terminal) of the semiconductor device PAC1(F) projects in the −y direction and is electrically connected to a wiring WL4(N3) of the wiring board WB.

Note that the wiring WL1(U) illustrated in FIG. 30(a) is electrically connected to the U-phase of the three-phase induction motor MT illustrated in FIG. 3, and the wiring WL1(V) illustrated in FIG. 30(a) is electrically connected to the V-phase of the three-phase induction motor MT illustrated in FIG. 3. In addition, the wiring WL1(W) illustrated in FIG. 30(a) is electrically connected to the W-phase of the three-phase induction motor MT illustrated in FIG. 3, and the wiring WL2 illustrated in FIG. 30(a) is electrically connected to the gate control circuit GCC illustrated in FIG. 3 and the control circuit (not illustrated) including the current detection circuit and the temperature detection circuit. Furthermore, the wiring WL3(P) illustrated in FIG. 30(a) is electrically connected to the positive potential terminal PT illustrated in FIG. 3, and the wiring WL4(N1), the wiring WL4(N2) and the wiring WL4(N3) illustrated in FIG. 30(a) are electrically connected to the negative potential terminal NT illustrated in FIG. 3. In this way, the electronic device EA (power module) according to the first embodiment is mounted so as to configure the three-phase inverter circuit INV.

Here, when the electronic device EA according to the first embodiment is to be miniaturized, for example, an x-direction distance between the semiconductor device PAC1(A) and the semiconductor device PAC1(C) adjacent to each other in FIG. 30(a) is reduced. In this regard, in the semiconductor device PAC1 according to the first embodiment, for example, as illustrated in FIGS. 13(a) to 13(c), the support part SPU is exposed not from the side S3 or the side S4 but from the side S1 and the side S2. Therefore, for example, in FIG. 30(a), even when the x-direction distance between the semiconductor device PAC1(A) and the semiconductor device PAC1(C) adjacent to each other is reduced, the support parts SPU thereof are not exposed from the sides facing each other, and thus, it is possible to obtain an advantage that an insulation distance between the semiconductor device PAC1(A) and the semiconductor device PAC1(C) can be secured.

Modification Example 1

Next, a modification example 1 of the first embodiment will be described. FIGS. 31(a) and 31(b) are diagrams to illustrate an external configuration of a semiconductor device PAC2 according to the modification example 1. Specifically, FIG. 31(a) is a top view illustrating the external configuration of the semiconductor device PAC2 according to the modification example 1, and FIG. 31(b) is a side view.

Since the configuration of the semiconductor device PAC2 according to the modification example 1 is substantially identical to the configuration of the semiconductor device PAC1 according to the first embodiment, the difference will be mainly described below.

As illustrated in FIGS. 31(a) and 31(b), in the semiconductor device PAC2 according to the modification example 1, an end portion of the extension part EXU of the clip CLP is exposed from the third side surface (side S3) and is exposed also from the fourth side surface (side S4).

FIGS. 32(a) to 32(c) are diagrams to illustrate an internal structure of the sealing member MR of the semiconductor device PAC2 according to the modification example 1. Specifically, FIG. 32(a) is a plan view, FIG. 32(b) is a cross-sectional view taken along a line A-A of FIG. 32(a), and FIG. 32(c) is a cross-sectional view taken along a line B-B of FIG. 32(a).

In FIG. 32(a), the clip CLP includes the main body part BDU and the pair of extension parts EXU, and end portions of the extension parts EXU are exposed from the sealing member MR.

FIG. 33 is a diagram illustrating a state after a clip mounting process and a wire bonding process are performed in a manufacturing method of a semiconductor device according to the modification example 1. In FIG. 33, the outline of the sealing member formed in a subsequent sealing process is illustrated by a two-dot chain line. As illustrated in FIG. 33, in the modification example 1, the extension part EXU of the clip CLP extends up to the outside of the sealing member, and the extension part EXU of the clip CLP is mounted on a framework FM of the lead frame LF. Namely, in the modification example 1, the framework FM of the lead frame LF functions as the hanging part HL. As a result, in the modification example 1, the intersecting portion of the hanging part HL (framework FM) of the lead frame LF and the extension part EXU of the clip CLP exists outside the sealing member. Specifically, in the modification example 1, the extension part EXU of the clip CLP partially protrudes from the chip mounting part TAB when seen in a plan view, and the hanging part HL (framework FM) of the lead frame LF is configured so as not to overlap the chip mounting part TAB when seen in a plan view. In this manner, in the modification example 1, the framework FM is used as the hanging part HL and the intersecting portion of the hanging part HL and the extension part EXU is provided outside the sealing member, so that the structure of the lead frame LF and the internal structure of the semiconductor device can be simplified. Furthermore, according to the modification example 1, it is possible to ensure a space SPC at four corners of the chip mounting part TAB. Therefore, in the wire bonding process and the sealing process, the space SPC can be used as a pressing part for fixing the chip mounting part TAB.

Modification Example 2

Next, a modification example 2 of the first embodiment will be described. FIGS. 34(a) and 34(b) are diagrams to illustrate an external configuration of a semiconductor device PAC3 according to the modification example 2. Specifically, FIG. 34(a) is a top view illustrating the external configuration of the semiconductor device PAC3 according to the modification example 2, and FIG. 34(b) is a side view. Since the configuration of the semiconductor device PAC3 according to the modification example 2 is substantially identical to the configuration of the semiconductor device PAC1 according to the first embodiment, the difference will be mainly described below.

As illustrated in FIGS. 34(a) and 34(b), in the semiconductor device PAC3 according to the modification example 2, an end portion of a support part SPU is exposed from a third side surface (side S3) and is exposed also from a fourth side surface (side S4).

FIGS. 35(a) to 35(c) are diagrams to illustrate an internal structure of a sealing member MR of the semiconductor device PAC3 according to the modification example 2. Specifically, FIG. 35(a) is a plan view, FIG. 35(b) is a cross-sectional view taken along a line A-A of FIG. 35(a), and FIG. 35(c) is a cross-sectional view taken along a line B-B of FIG. 35(a).

In FIG. 35(a), the clip CLP includes a main body part BDU and a pair of extension parts EXU, and each of the pair of the extension parts EXU is mounted on each of a pair of support parts SPU. Each of the pair of the support parts SPU has a bent shape including a part extending in a y direction and a part extending in an x direction, and end portions of the part extending in the x direction are exposed from the third side surface (side S3) and the fourth side surface (side S4) of the sealing member.

FIG. 36 is a diagram illustrating a state after a clip mounting process and a wire bonding process are performed in a manufacturing method of a semiconductor device according to the modification example 2. In FIG. 36, the outline of the sealing member formed in a subsequent sealing process is illustrated by a two-dot chain line. As illustrated in FIG. 36, in the modification example 2, the extension part EXU of the clip CLP is located inside the sealing member. On the other hand, in each of the pair of the hanging parts HL (support parts SPU) supporting each of the pair of the extension parts EXU, the part extending in the y direction is located inside the sealing member, while the bent part extending in the x direction extends up to the outside of the sealing member and is connected to the framework of the lead frame LF. As a result, in the modification example 2, the intersecting portion of the hanging part HL (support part SPU) of the lead frame LF and the extension part EXU of the clip CLP exists inside the sealing member. Specifically, the extension part EXU of the clip CLP is enclosed in the chip mounting part TAB when seen in a plan view, and the hanging part HL of the lead frame LF is configured to include a region that overlaps the chip mounting part TAB and a region that does not overlap the chip mounting part TAB when seen in a plan view. According to the modification example 2 configured as described above, the hanging part HL of the lead frame LF is bent, and thus, it is possible to ensure the space SPC at four corners of the chip mounting part TAB. Accordingly, in the wire bonding process and the sealing process, the space SPC can be used as a pressing part for fixing the chip mounting part TAB.

Second Embodiment

The second embodiment is a technical idea related to a power module including an inverter circuit that controls a switched reluctance motor (hereinafter, simply referred to as an SR motor). Here, conceptually, an entire power module corresponds to an electronic device and an electronic component including a semiconductor chip among constituent components constituting the power module corresponds to a semiconductor device.

<Configuration of Inverter Circuit>

FIG. 37 is a circuit diagram in which an inverter circuit INV is disposed between a DC power source E and an SR motor MT. As illustrated in FIG. 37, the inverter circuit INV includes a first leg LG1, a second leg LG2 and a third leg LG3 which are connected in parallel to a DC power source E. The first leg LG1 includes an upper arm UA(U) and a lower arm BA(U) connected in series, the second leg LG2 includes an upper arm UA(V) and a lower arm BA(V) connected in series, and the third leg LG3 includes an upper arm UA(W) and a lower arm BA(W) connected in series. Also, the upper arm UA(U) includes an IGBT Q1 and a diode FWD1, and the lower arm BA(U) includes an IGBT Q2 and a diode FWD2. At this time, the IGBT Q1 of the upper arm UA(U) and the diode FWD2 of the lower arm BA(U) are both connected to the terminal TE(U1), and the IGBT Q1 and the diode FWD2 are connected in series.

Meanwhile, the diode FWD1 of the upper arm UA(U) and the IGBT Q2 of the lower arm BA(U) are both connected to the terminal TE(U2), and the diode FWD1 and the IGBT Q2 are connected in series. Furthermore, the terminal TE(U1) is connected to the terminal U' of the SR motor and the terminal TE(U2) is connected to the terminal U of the SR motor. Namely, a coil L(U) existing between the terminal U and the terminal U' of the SR motor MT is connected between the terminal TE(U1) and the terminal TE(U2) of the inverter circuit INV.

Similarly, the upper arm UA(V) includes an IGBT Q1 and a diode FWD1, and the lower arm BA(V) includes an IGBT Q2 and a diode FWD2. At this time, the IGBT Q1 of the upper arm UA(V) and the diode FWD2 of the lower arm BA(V) are both connected to the terminal TE(V1), and the IGBT Q1 and the diode FWD2 are connected in series. Meanwhile, the diode FWD1 of the upper arm UA(V) and the IGBT Q2 of the lower arm BA(V) are both connected to the terminal TE(V2), and the diode FWD1 and the IGBT Q2 are connected in series. Furthermore, the terminal TE(V1) is connected to the terminal V' of the SR motor and the terminal TE(V2) is connected to the terminal V of the SR motor. Namely, a coil L(V) existing between the terminal V and the terminal V' of the SR motor MT is connected between the terminal TE(n) and the terminal TE(V2) of the inverter circuit INV.

In addition, the upper arm UA(W) includes an IGBT Q1 and a diode FWD1, and the lower arm BA(W) includes an IGBT Q2 and a diode FWD2. At this time, the IGBT Q1 of the upper arm UA(W) and the diode FWD2 of the lower arm BA(W) are both connected to the terminal TE(W1), and the IGBT Q1 and the diode FWD2 are connected in series. Meanwhile, the diode FWD1 of the upper arm UA(W) and the IGBT Q2 of the lower arm BA(W) are both connected to the terminal TE(W2), and the diode FWD1 and the IGBT Q2 are connected in series. Furthermore, the terminal TE(W1) is connected to the terminal W' of the SR motor and the terminal TE(W2) is connected to the terminal W of the SR motor. Namely, a coil L(W) existing between the terminal W and the terminal W' of the SR motor MT is connected between the terminal TE(W1) and the terminal TE(W2) of the inverter circuit INV.

Next, a gate electrode of the IGBT Q1, which is a constituent element of each of the upper arm UA(U), the upper arm UA(V) and the upper arm UA(W), is electrically connected to the gate control circuit GCC. Then, the on/off operation (switching operation) of the IGBT Q1 of each of the upper arm UA(U), the upper arm UA(V) and the upper arm. UA(W) is controlled by a gate control signal from the gate control circuit GCC. Similarly, a gate electrode of the IGBT Q2, which is a constituent element of each of the lower arm BA(U), the lower arm BA(V) and the lower arm BA(W), is also electrically connected to the gate control circuit GCC, and the on/off operation of the IGBT Q2 of each of the lower arm BA(U), the lower arm BA(V) and the lower arm. BA(W) is controlled by a gate control signal from the gate control circuit GCC.

The inverter circuit INV according to the second embodiment includes the first to third legs LG1 to LG3 connected in parallel to one another, and each of the first to third legs LG1 to LG3 includes two IGBTs (IGBT Q1 and IGBT Q2) and two diodes (diode FWD1 and diode FWD2). Accordingly, the inverter circuit INV according to the second embodiment includes six IGBTs and six diodes. In the inverter circuit INV configured as described above, the SR motor MT can be rotated by controlling the on/off operations (switching operations) of the three IGBTs Q1 and the three IGBTs Q2 by the gate control circuit GCC. In the following, the operation of the inverter circuit INV for rotating the SR motor MT will be described with reference to the drawings.

<Operation of Inverter Circuit>

FIG. 38 is a diagram for describing the operation of the inverter circuit INV according to the second embodiment. The inverter circuit INV illustrated in FIG. 38 is a circuit for rotationally driving the SR motor MT and includes the first to third legs LG1 to LG3. At this time, for example, the first leg LG1 is a circuit that controls a current flowing through the coil L(U) provided between the terminal U and the terminal U' (between U and U') of the SR motor MT, and the second leg LG2 is a circuit that controls a current flowing through the coil L(V) provided between the terminal V and the terminal V' (between V and V') of the SR motor MT. Similarly, the third leg LG3 is a circuit that controls a current flowing through the coil L(W) provided between the terminal W and the terminal W' (between W and W') of the SR motor MT. Namely, the inverter circuit INV illustrated in FIG. 38 controls the current flowing through the coil L(U) by the first leg LG1, controls the current flowing through the coil L(V) by the second leg LG2, and controls the current flowing through the coil L(W) by the third leg LG3. In the inverter circuit INV illustrated in FIG. 38, since the current control for the coil L(U) by the first leg LG1, the current control for the coil L(V) by the second leg LG2 and the current control for the coil L(W) by the third leg LG3 are equally performed with changing the timing, the current control for the coil L(V) by the second leg LG2 is taken as an example in the following description.

In FIG. 38, first, when the current starts to flow through the coil L(V) of the SR motor MT, the IGBT Q1 is turned on and the IGBT Q2 is also turned on as illustrated in an excitation mode. At this time, the current is supplied from the terminal TE(V1) to the coil L(V) through the IGBT Q1 that is turned on from the DC power source E. Then, the current is returned to the DC power source E via the turned-on IGBT Q2 from the coil L(V) through the terminal TE(V2). In this manner, the current can flow through the coil L(V). As a result, an electromagnet is formed between V and V' of a stator ST of the SR motor MT, and an attraction force by the electromagnet is applied to the rotor RT. Thereafter, in order to maintain the attraction force by the electromagnet, the current flowing through the coil L(V) of the SR motor MT is maintained. Specifically, as illustrated in a free wheel mode of FIG. 38, the IGBT Q1 is turned off and the IGBT Q2 remains turned on. In this case, as illustrated in the free wheel mode of FIG. 38, a closed circuit is formed from the coil L(V), the turned-on IGBT Q2 and the diode FWD2, and the current is kept flowing in the closed circuit. Consequently, the current flowing through the coil L(V) is maintained, and the attraction force from the electromagnet caused by the coil L(V) is kept applied to the rotor RT. Subsequently, the current flowing through the coil L(V) is made to disappear. Specifically, as illustrated in a demagnetization mode of FIG. 38, the IGBT Q1 is turned off and the IGBT Q2 is also turned off. In this case, as illustrated in the demagnetization mode of FIG. 38, residual power of the coil L(V) in the closed circuit formed from the coil L(V), the turned-on IGBT Q2 and the diode FWD2 disappears through the diode FWD1 by turning off the IGBT Q2. As a result, the current flowing through the coil L(V) is reduced and stopped, so that a magnetic force generated in the electromagnet caused by the current flowing through the coil L(V) is lost. Accordingly, the attraction force applied from the electromagnet to the rotor RT caused by the current flowing through the coil L(V) disappears. The rotor RT of the SR motor MT can be rotated by repeating these operations with changing the timings for the first to third legs LG1 to LG3. As described above, it can be understood that the SR motor MT can be rotated by the current control of the inverter circuit INV according to the second embodiment.

<Difference from Inverter Circuit for PM Motor>

Next, a difference between the inverter circuit for the SR motor according to the second embodiment and the inverter circuit for the PM motor used commonly will be described. FIGS. 39(a) and 39(b) are diagrams for describing a difference between the inverter circuit for the PM motor and the inverter circuit for the SR motor. Specifically, FIG. 39(a) is a diagram illustrating a part of the inverter circuit for the PM motor, and FIG. 39(b) is a diagram illustrating a part of the inverter circuit for the SR motor.

FIG. 39(a) illustrates a part of the inverter circuit electrically connected to a terminal U (U-phase) of the PM motor. Specifically, an IGBT Q1 and a diode FWD1 constituting an upper arm are connected in antiparallel, and an IGBT Q2 and a diode FWD2 constituting a lower arm are connected in antiparallel. Further, one terminal TE(U) is provided between the upper arm and the lower arm, and the terminal TE(U) and the terminal U of the PM motor are connected to each other. In the inverter circuit for the PM motor thus configured, as illustrated in FIG. 39(a), a U-phase coil, a V-phase coil and a W-phase coil of the PM motor are three-phase connected (for example, star connection), and the elements of the arm that drive each coil are controlled so as not to simultaneously perform an up-and-down operation. Therefore, the inverter circuit for the PM motor is controlled so as to be driven with the two phases in pairs, that is: U-phase+V-phase→V-phase+W-phase→W-phase+U-phase. From the above, in the inverter circuit for the PM motor, when the IGBT is turned on to make the current flow through the coil and then the IGBT is turned off for the phase conversion, a regenerative current caused by the residual power flows to the diode in the arm, and the residual power disappears. Therefore, in the inverter circuit for the PM motor, the IGBT and the diode need to be configured in a pair. As a result, in the inverter circuit for the PM motor, one terminal TE(U) is provided between the upper arm and the lower arm as illustrated in FIG. 39(a).

Meanwhile, FIG. 39(b) illustrates a part of the inverter circuit electrically connected to a terminal U and a terminal U' of the SR motor. Specifically, an IGBT Q1 constituting an upper arm and a diode FWD2 constituting a lower arm are connected in series, and a terminal TE(U1) is provided between the IGBT Q1 constituting the upper arm and the diode FWD2 constituting the lower arm. In addition, a diode FWD1 constituting the upper arm and an IGBT Q2 constituting the lower arm are connected in series, and a terminal TE(U2) is provided between the diode FWD1 constituting the upper arm and the IGBT Q2 constituting the lower arm. Further, the terminal TE(U1) of the inverter circuit is connected to the terminal U' of the SR motor, and the terminal TE(U2) of the inverter circuit is connected to the terminal U of the SR motor. The inverter circuit for the SR motor configured as described above constitutes a closed circuit including the coil of each phase of the SR motor and an H-bridge circuit. Therefore, for example, as illustrated in FIG. 39(b), when the current is made to flow through the coil disposed between U and U' of the SR motor by turning on the IGBT Q1 of the upper arm and the IGBT Q2 of the lower arm arranged in crisscross (see the excitation mode of FIG. 3) and then the IGBT Q1 and the IGBT Q2 are turned off for the phase conversion, it is necessary to make the residual power of the coil disappear within the above-described closed circuit. In this case, it is unnecessary to make the residual power of the coil disappear in the above-described closed circuit, and the residual power of the coil is made to disappear in a closed circuit different from the above-described closed circuit in the inverter circuit for the SR motor (demagnetization mode of FIG. 3). Specifically, in the inverter circuit for the SR motor, as illustrated in the demagnetization mode of FIG. 3, another closed circuit that makes the residual power of the coil disappear can be configured by the diode FWD1 and the diode FWD2 which allow the current to pass in only one direction instead of the IGBT Q1 and the IGBT Q2 serving as the switching elements. As described above, the inverter circuit for the SR motor has the characteristic that the closed circuit in the excitation mode of FIG. 3 and the closed circuit in the demagnetization mode of FIG. 3 are different circuits, and because of this characteristic, the inverter circuit for the SR motor has two terminals, that is, the terminal TE(U1) and the terminal TE(U2) as illustrated in FIG. 39(b). From the above, the inverter circuit for the SR motor includes the two terminals, that is, the terminal TE(U1) and the terminal TE(U2) between the upper arm and the lower arm as illustrated in FIG. 39(b), and is different in this point from the inverter circuit for the PM motor including one terminal, that is, the terminal TE(U) disposed between the upper arm and the lower arm as illustrated in FIG. 39(a).

From the above, because of the difference of the inverter circuit, the configuration of the semiconductor device that realizes the inverter circuit for the SR motor according to the second embodiment differs from the configuration of the semiconductor device that realizes the inverter circuit for the PM motor according to the first embodiment. In the second embodiment, the semiconductor device that realizes the inverter circuit for the SR motor will be described while focusing on the SR motor whose needs have been rapidly expanded from the viewpoint of the cost reduction.

<Mounting Configuration of Semiconductor Device in Second Embodiment>

FIGS. 40(a) to 40(c) are diagrams to illustrate an external configuration of a semiconductor device PAC4 according to the second embodiment. Specifically, FIG. 40(a) is a top view illustrating the external configuration of the semiconductor device PAC4 according to the second embodiment, FIG. 40(b) is a side view, and FIG. 40(c) is a bottom view.

In FIG. 40(a), in the semiconductor device PAC4 according to the second embodiment, the end portion of the support part SPU2 is exposed from the first side surface (side S1) and the end portion of the support part SPU1 is exposed from the second side surface (side S2).

Subsequently, as illustrated in FIG. 40(c), in the semiconductor device PAC4 according to the second embodiment, a chip mounting part TAB1 and a chip mounting part TAB2 are exposed from the bottom surface of the sealing member MR. The chip mounting part TAB1 and the chip mounting part TAB2 are disposed to be physically separated from each other by the sealing member MR, and thus the chip mounting part TAB1 and the chip mounting part TAB2 are electrically separated from each other. Namely, the semiconductor device PAC4 according to the second embodiment includes the chip mounting part TAB1 and the chip mounting part TAB2 electrically separated from each other by the sealing member MR, and the bottom surface of the chip mounting part TAB1 and the bottom surface of the chip mounting part TAB2 are exposed from the bottom surface of the sealing member MR. As described above, in the semiconductor device PAC4 according to the second embodiment, the chip mounting part TAB1 and the chip mounting part TAB2 electrically separated from each other are provided for the two terminals, that is, the terminal TE(U1) and the terminal TE(U2) illustrated in FIG. 39(b).

Next, the internal structure of the semiconductor device PAC4 according to the second embodiment will be described. FIGS. 41(a) to 41(c2) are diagrams to illustrate the internal structure of the semiconductor device PAC4 according to the second embodiment. Specifically, FIG. 41(a) is a plan view, FIG. 41(b1) is a cross-sectional view taken along a line A1-A1 of FIG. 41(a), and FIG. 41(b2) is a cross-sectional view taken along a line A2-A2 of FIG. 41(a). In addition, FIG. 41(c1) is a cross-sectional view taken along a line B1-B1 of FIG. 41(a) and FIG. 41(c2) is a cross-sectional view taken along a line B2-B2 of FIG. 41(a).

First, in FIG. 41(a), a lead LD1A serving as an emitter terminal ET includes apart (first part) sealed by the sealing member MR and a part (second part) exposed from the sealing member MR, and the second part of the lead LD1A is divided into a plurality of parts by the slits formed therein. Similarly, a lead LD1B serving as an anode terminal AT includes a part (third part) sealed by the sealing member MR and a part (fourth part) exposed from the sealing member MR, and the fourth part of the lead LD1B is divided into a plurality of parts by the slits formed therein.

Next, in FIG. 41(a), the rectangular chip mounting part TAB1 and the rectangular chip mounting part TAB2 are disposed inside the sealing member MR, and the chip mounting part TAB1 and the chip mounting part TAB2 are separated from each other. These chip mounting part TAB1 and chip mounting part TAB2 function also as heat spreaders for increasing the heat dissipation efficiency and are made of, for example, a material containing copper having a high thermal conductivity as a main component.

The semiconductor chip CHP1 in which the IGBT is formed is mounted on the chip mounting part TAB1 via the conductive adhesive ADH1. Meanwhile, the semiconductor chip CHP2 in which the diode is formed is mounted on the chip mounting part TAB2 via the conductive adhesive ADH1.

Subsequently, as illustrated in FIGS. 41(a) and 41(c1), a clip CLP1 which is a conductive member is disposed on an emitter electrode pad EP of the semiconductor chip CHP1 via the conductive adhesive. The clip CLP1 is connected to the emitter terminal ET via the conductive adhesive. Therefore, the emitter electrode pad EP of the semiconductor chip CHP1 is electrically connected to the emitter terminal ET through the clip CLP1.

Meanwhile, as illustrated in FIGS. 41(a) and 41(c2), a clip CLP2 which is a conductive member is disposed on an anode electrode pad ADP of the semiconductor chip CHP2 via the conductive adhesive. The clip CLP2 is connected to the anode terminal AT via the conductive adhesive. Therefore, the anode electrode pad ADP of the semiconductor chip CHP2 is electrically connected to the anode terminal AT through the clip CLP2.

Here, also in the second embodiment, the support part SPU1 is provided inside the sealing member MR, and the clip CLP1 is supported by the support part SPU1. Specifically, as illustrated in FIG. 41(a), a pair of support parts SPU1 is provided so as to sandwich the semiconductor chip CHP1, and each of the pair of support parts SPU1 extends in a y direction parallel to the projecting direction of the lead LD2. In the second embodiment, the clip CLP1 includes a main body part BDU1 and a pair of extension parts EXU1. The main body part BDU1 connects the lead LD1A and the semiconductor chip CHP1, and the pair of the extension parts EXU1 is connected to the main body part BDU1 and extends in an x direction. At this time, as illustrated in FIG. 41(a), each of the pair of the extension parts EXU1 is mounted on each of the pair of the support parts SPU1, and the clip CLP1 is thus supported by the pair of the support parts SPU1. Namely, in the second embodiment, the clip CLP1 is mounted on the lead LD1A (one point) and the pair of the support parts SPU1 (two points), and the clip CLP1 is supported by the three points. In particular, as illustrated in FIG. 41(b2), a projection part PJU1 is provided in the clip CLP1 according to the second embodiment, and the clip CLP1 is fixed to the support part SPU1 by pressing the projection part PJU1 to the support part SPU1.

Similarly, the support part SPU2 is provided inside the sealing member MR, and the clip CLP2 is supported by the support part SPU2. Specifically, as illustrated in FIG. 41(a), a pair of support parts SPU2 is provided so as to sandwich the semiconductor chip CHP2, and each of the pair of the support parts SPU2 extends in a y direction parallel to the projecting direction of the lead LD1A and the lead LD1B. In the second embodiment, the clip CLP2 includes a main body part BDU2 and a pair of extension parts EXU2. The main body part BDU2 connects the lead LD1B and the semiconductor chip CHP2, and the pair of the extension parts EXU2 is connected to the main body part BDU2 and extends in an x direction. At this time, as illustrated in FIG. 41(a), each of the pair of the extension parts EXU2 is mounted on each of the pair of the support parts SPU2, and the clip CLP2 is thus supported by the pair of the support parts SPU2. Namely, in the second embodiment, the clip CLP2 is mounted on the lead LD1B (one point) and the pair of the support parts SPU2 (two points), and the clip CLP2 is supported by the three points. In particular, as illustrated in FIG. 41(b1), a projection part PJU2 is provided in the clip CLP2 according to the second embodiment, and the clip CLP2 is fixed to the support part SPU2 by pressing the projection part PJU2 to the support part SPU2.

Also in the semiconductor device PAC4 configured as described above according to the second embodiment, since each of the clip CLP1 and the clip CLP2 has the three-point support structure, it is possible to obtain the same effects as those of the semiconductor device PAC1 according to the first embodiment.

<Manufacturing Method of Semiconductor Device in Second Embodiment>

Next, the manufacturing method of the semiconductor device according to the second embodiment will be described with reference to the drawings.

1. Process of Preparing Chip Mounting Part

First, as illustrated in FIG. 42, the chip mounting part TAB1 and the chip mounting part TAB2 are prepared. The chip mounting part TAB1 and the chip mounting part TAB2 have, for example, a rectangular shape and are made of a material containing copper as a main component.

2. Chip Mounting Process

Next, as illustrated in FIG. 43, for example, the conductive adhesive ADH1 is formed on the chip mounting part TAB1 and the chip mounting part TAB2. As the conductive adhesive ADH1, for example, a silver paste or a high-melting-point solder can be used.

Subsequently, as illustrated in FIG. 44, the semiconductor chip CHP1 in which an IGBT is formed is mounted on the chip mounting part TAB1, and the semiconductor chip CHP2 in which a diode is formed is mounted on the chip mounting part TAB2.

Here, the semiconductor chip CHP2 in which the diode is formed is disposed so that a cathode electrode pad formed onto the rear surface of the semiconductor chip CHP2 comes into contact with the chip mounting part TAB2 via the conductive adhesive ADH1. As a result, an anode electrode pad ADP formed on the front surface of the semiconductor chip CHP2 is directed upward.

On the other hand, the semiconductor chip CHP1 in which the IGBT is formed is disposed so that a collector electrode pad formed on the rear surface of the semiconductor chip CHP1 comes into contact with the chip mounting part TAB1 via the conductive adhesive ADH1. In addition, an emitter electrode pad EP and a plurality of electrode pads (plurality of signal electrode pads) formed on the front surface of the semiconductor chip CHP1 are directed upward.

Thereafter, when the conductive adhesive ADH1 is a silver paste, a heat treatment (bake process) is performed.

3. Process of Arranging Lead Frame

Next, as illustrated in FIG. 45, a lead frame LF is prepared. Here, as illustrated in FIG. 45, a thickness of the chip mounting part TAB1 and a thickness of the chip mounting part TAB2 are larger than a thickness of the lead frame LF. In addition, the leads LD1A, the leads LD1B, the plurality of leads LD2, hanging parts HL1 functioning as a pair of support parts SPU1 and hanging parts HL2 functioning as a pair of support parts SPU2 are formed in the lead frame LF.

In the hanging part HL1, a bent part BEU1 is formed and a notch part NTU1 is formed. Similarly, in the hanging part HL2, a bent part BEU2 is formed and a notch part NTU2 is formed.

Thereafter, as illustrated in FIG. 45, the lead frame LF is disposed above the chip mounting part TAB1 on which the semiconductor chip CHP1 is mounted and the chip mounting part TAB2 on which the semiconductor chip CHP2 is mounted. At this time, the semiconductor chip CHP1 in which the IGBT is formed is disposed at a position close to the lead LD2, and the semiconductor chip CHP2 in which the diode is formed is disposed at a position close to the lead LD1A and the lead LD1B. Specifically, when seen in a plan view, the semiconductor chip CHP2 is mounted so as to be sandwiched between the lead LD1A (lead LD1B) and the semiconductor chip CHP1, and the semiconductor chip CHP1 is disposed so as to be sandwiched between the lead LD2 and the semiconductor chip CHP2. Then, in the semiconductor chip CHP1 in which the IGBT is formed, the emitter electrode pad EP is disposed on the side close to the lead LD1A, and the plurality of electrode pads (signal electrode pads) are disposed on the side close to the lead LD2. Furthermore, when seen in a plan view, the hanging part HL1 is disposed so as to partially overlap the chip mounting part TAB1 and so as not to overlap the semiconductor chip CHP1. Similarly, when seen in a plan view, the hanging part HL2 is disposed so as to partially overlap the chip mounting part TAB2 and so as not to overlap the semiconductor chip CHP2. In the arrangement relationship like this, the lead frame LF is disposed above the chip mounting part TAB1 on which the semiconductor chip CHP1 is mounted and the chip mounting part TAB2 on which the semiconductor chip CHP2 is mounted.

4. Electrical Connecting Process

Subsequently, as illustrated in FIG. 46, the conductive adhesive ADH2 made of, for example, a silver paste or a high-melting-point solder is formed on the anode electrode pad ADP of the semiconductor chip CHP2. Similarly, the conductive adhesive ADH2 made of, for example, a silver paste or a high-melting-point solder is formed also on the emitter electrode pad EP of the semiconductor chip CHP1. Furthermore, as illustrated in FIG. 46, the conductive adhesive ADH2 made of, for example, a silver paste or a high-melting-point solder is formed also on a part of a region of the lead LD1A and a part of a region of the lead LD1B. A material component of the conductive adhesive ADH2 formed at this time may be the same as or different from a material component of the above-described conductive adhesive ADH1.

Thereafter, as illustrated in FIG. 47, the clip CLP2 having the main body part BDU2 and the extension part EXU2 is prepared, and the clip CLP2 is mounted over the lead LD1B and the semiconductor chip CHP2. Specifically, the main body part BDU2 of the clip CLP2 is disposed so as to lie astride the lead LD1B and the semiconductor chip CHP2 via the conductive adhesive ADH2, and the extension part EXU2 of the clip CLP2 is disposed on the hanging part HL2 of the lead frame LF. At this time, as illustrated in FIG. 47, when seen in a plan view, the extension part EXU2 of the clip CLP2 is enclosed in the chip mounting part TAB2. Then, the hanging part HL2 of the lead frame LF extends in an extending direction of the lead LD1B, and the extension part EXU2 of the clip CLP2 extends in a direction intersecting with an extending direction of the hanging part HL2.

From the above, the lead LD1B and the anode electrode pad ADP formed in the semiconductor chip CHP2 are electrically connected to each other by the clip CLP2. In addition, the clip CLP2 is supported by three points of the lead LD1B and the pair of the hanging parts HL2. Specifically, the extension part EXU2 of the clip CLP2 is supported by the hanging part HL2 of the lead frame LF. In other words, the extension part EXU2 of the clip CLP2 is fixed to the hanging part HL2 of the lead frame LF. Furthermore, the extension part EXU2 of the clip CLP2 is supported to the hanging part HL2 of the lead frame LF by the intersecting portion of the hanging part HL2 and the extension part EXU2. In this way, the three-point support structure of the clip CLP2 is realized. As illustrated in FIG. 47, when seen in a plan view, the intersecting portion of the hanging part HL2 and the extension part EXU2 is enclosed in the chip mounting part TAB2.

Subsequently, as illustrated in FIG. 47, the clip CLP1 having the main body part BDU1 and the extension part EXU1 is prepared, and the clip CLP1 is mounted over the lead LD1A and the semiconductor chip CHP1. Specifically, the main body part BDU1 of the clip CLP1 is disposed over the clip CLP2 so as to lie astride the lead LD1A and the semiconductor chip CHP1 via the conductive adhesive ADH2, and the extension part EXU1 of the clip CLP1 is disposed on the hanging part HL1 of the lead frame LF. At this time, as illustrated in FIG. 47, when seen in a plan view, the extension part EXU1 of the clip CLP1 is enclosed in the chip mounting part TAB1. The hanging part HL1 of the lead frame LF extends in an extending direction of the lead LD1A, and the extension part EXU1 of the clip CLP1 extends in a direction intersecting with an extending direction of the hanging part HL1.

From the above, the lead LD1A and the emitter electrode pad EP formed in the semiconductor chip CHP1 are electrically connected to each other by the clip CLP1. In addition, the clip CLP1 is supported by three points of the lead LD1A and the pair of the hanging parts HL1. Specifically, the extension part EXU1 of the clip CLP1 is supported by the hanging part HL1 of the lead frame LF. In other words, the extension part EXU1 of the clip CLP1 is fixed to the hanging part HL1 of the lead frame LF. Furthermore, the extension part EXU1 of the clip CLP1 is supported to the hanging part HL1 of the lead frame LF by the intersecting portion of the hanging part HL1 and the extension part EXU1. In this way, the three-point support structure of the clip CLP1 is realized. As illustrated in FIG. 47, when seen in a plan view, the intersecting portion of the hanging part HL1 and the extension part EXU1 is enclosed in the chip mounting part TAB1.

Thereafter, a heat treatment is performed. Specifically, when the conductive adhesive ADH2 is a silver paste, a bake process is performed. Meanwhile, when the conductive adhesive ADH2 is a high-melting-point solder, a reflow process is performed. In particular, when both of the conductive adhesive ADH1 and the conductive adhesive ADH2 are the high-melting-point solder, a batch reflow process is performed on the conductive adhesive ADH1 and the conductive adhesive ADH2 in this process.

The processes so far are performed by using an assembly jig, and the chip mounting part TAB1 on which the semiconductor chip CHP1 is mounted, the chip mounting part TAB2 on which the semiconductor chip CHP2 is mounted and the lead frame LF are connected to one another by the clip CLP1 and the clip CLP2 having the three-point support structure, thereby forming an integrated structure. After the integrated structure is formed, for example, the integrated structure is taken out from the assembly jig and is conveyed to a wire bonding apparatus, and the semiconductor chip CHP1 is connected to the lead LD2 by a wire W.

Specifically, as illustrated in FIG. 48, a bent part BEU1 is provided in the hanging part HL1 of the lead frame LF, and a space is ensured at a corner of the chip mounting part TAB1 by the bent part BEU1. Similarly, a bent part BEU2 is provided in the hanging part HL2 of the lead frame LF, and a space is ensured at a corner of the chip mounting part TAB2 by the bent part BEU2. Namely, in the hanging part HL1 of the lead frame LF, the bent part BEU1 for ensuring the space is formed in a region that partially overlaps the chip mounting part TAB1. Similarly, in the hanging part HL2 of the lead frame LF, the bent part BEU2 for ensuring the space is formed in a region that partially overlaps the chip mounting part TAB2. Then, the chip mounting part TAB1 and the chip mounting part TAB2 are fixed with the jig by pressing the jig to the space ensured by each of the bent part BEU1 and the bent part BEU2.

Next, the signal electrode pad formed on the front surface of the semiconductor chip CHP1 and the lead LD2 (signal lead) formed in the lead frame LF are connected to each other by the wire W in a state in which the chip mounting part TAB1 and the chip mounting part TAB2 are fixed with the jig. Thus, since the chip mounting part TAB1 and the chip mounting part TAB2 do not move, the wire bonding process can be reliably performed. At this time, in the second embodiment, since the lead LD2 is disposed on an opposite side of the lead LD1A to which the clip CLP1 is connected, the wire bonding process can be performed without considering interference due to the clip CLP1.

Thereafter, like in the first embodiment, the semiconductor device PAC4 according to the second embodiment illustrated in FIGS. 40(a) to 40(c) can be manufactured through a sealing process, an exterior plating process, a marking process and a singulation process. At this time, since the semiconductor device according to the second embodiment also has the same characteristic points (first to fifth characteristic points) as the semiconductor device according to the first embodiment, it is possible to obtain the same effects as those of the first embodiment. As a result, the manufacturing method of the semiconductor device according to the second embodiment can also eliminate the rooms for improvement existing in the related art.

Modification Example

Next, a modification example of the second embodiment will be described. FIGS. 49(a) and 49(b) are diagrams to illustrate an external configuration of a semiconductor device PAC5 according to the modification example. Specifically, FIG. 49(a) is a top view illustrating the external configuration of the semiconductor device PAC5 according to the modification example, and FIG. 49(b) is a side view.

Since the configuration of the semiconductor device PAC5 according to this modification example is substantially identical to the configuration of the semiconductor device PAC4 according to the second embodiment, the difference will be mainly described below.

As illustrated in FIGS. 49(a) and 49(b), in the semiconductor device PAC5 according to the modification example, an end portion of the extension part EXU1 of the clip CLP1 is exposed from the third side surface (side S3) and is exposed also from the fourth side surface (side S4). Similarly, in the semiconductor device PAC5 according to the modification example, an end portion of the extension part EXU2 of the clip CLP2 is exposed from the third side surface (side S3) and is exposed also from the fourth side surface (side S4).

FIGS. 50(a) to 50(c2) are diagrams to illustrate an internal structure of the sealing member MR of the semiconductor device PAC5 according to this modification example. FIG. 50(a) is a plan view, FIG. 50(b1) is a cross-sectional view taken along a line A-A of FIG. 50(a), and FIG. 50(b2) is a cross-sectional view taken along a line A2-A2 of FIG. 50(a). In addition, FIG. 50(c1) is a cross-sectional view taken along a line B1-B1 of FIG. 50(a) and FIG. 50(c2) is a cross-sectional view taken along a line B2-B2 of FIG. 50(a).

In FIG. 50(a), the clip CLP1 includes the main body part BDU1 and the pair of extension parts EXU1, and end portions of the extension parts EXU1 are exposed from the sealing member MR. Similarly, the clip CLP2 includes the main body part BDU2 and the pair of extension parts EXU2, and end portions of the extension parts EXU2 are exposed from the sealing member MR.

FIG. 51 is a diagram illustrating a state after a clip mounting process and a wire bonding process are performed in a manufacturing method of a semiconductor device according to the modification example. In FIG. 51, the outline of the sealing member formed in a subsequent sealing process is illustrated by a two-dot chain line. As illustrated in FIG. 51, in this modification example, the extension part EXU1 of the clip CLP1 extends up to the outside of the sealing member, and the extension part EXU1 of the clip CLP1 is mounted on a framework FM of the lead frame LF. Similarly, in this modification example, the extension part EXU2 of the clip CLP2 extends up to the outside of the sealing member, and the extension part EXU2 of the clip CLP2 is mounted on the framework FM of the lead frame LF. Namely, in this modification example, the framework FM of the lead frame LF functions as the hanging part HL. As a result, in this modification example, the intersecting portion of the hanging part HL (framework FM) of the lead frame LF and the extension part EXU1 of the clip CLP1 and the intersecting portion of the hanging part HL (framework FM) of the lead frame LF and the extension part EXU2 of the clip CLP2 exist outside the sealing member. Specifically, in this modification example, the extension part EXU1 of the clip CLP1 partially protrudes from the chip mounting part TAB1 when seen in a plan view, and the hanging part HL (framework FM) of the lead frame LF is configured so as not to overlap the chip mounting part TAB1 when seen in a plan view. Similarly, in this modification example, the extension part EXU2 of the clip CLP2 partially protrudes from the chip mounting part TAB2 when seen in a plan view, and the hanging part HL (framework FM) of the lead frame LF is configured so as not to overlap the chip mounting part TAB2 when seen in a plan view. In this manner, in this modification example, the framework FM is used as the hanging part HL and the intersecting portion of the hanging part HL and the extension part EXU1 and the intersecting portion of the hanging part HL and the extension part EXU2 are provided outside the sealing member, so that the structure of the lead frame LF and the internal structure of the semiconductor device can be simplified. Furthermore, according to this modification example, it is possible to ensure spaces at a corner of the chip mounting part TAB1 and a corner of the chip mounting part TAB2. Accordingly, in the wire bonding process and the sealing process, the spaces can be used as pressing parts for fixing the chip mounting part TAB1 and the chip mounting part TAB2.

In the foregoing, the invention made by the inventors of the present invention has been concretely described based on the embodiments. However, it is needless to say that the present invention is not limited to the foregoing embodiments and various modifications and alterations can be made within the scope of the present invention.

In the embodiments described above, the example in which a pair of hanging parts is provided in a lead frame and a pair of extension parts is provided in a clip has been described, but the technical idea of the embodiments described above is not limited thereto, and it is also possible to adopt the configuration in which one hanging part is provided in the lead frame, one extension part is provided in the clip, and the extension part is supported by the hanging part.

What is claimed is:

1. A semiconductor device comprising:
    a first semiconductor chip having a first front surface on which a first electrode pad is formed;
    a first chip mounting part on which the first semiconductor chip is mounted;
    a first lead arranged in a region around the first semiconductor chip;
    a first conductive member which is electrically connected to the first electrode pad of the first semiconductor chip via a first conductive adhesive, and is electrically connected to the first lead;
    a first support part arranged over the first chip mounting part and supporting the first conductive member; and
    a sealing member that seals the first semiconductor chip, the first conductive member and a portion of the first lead,
    wherein the first conductive member includes a main body part and a first extension part which is continuous to the main body part and extends from the main body part in plan view,
    wherein a first portion of the first extension part is disposed in the sealing member so as to overlap a first portion of the first support part in the sealing member in plan view,
    wherein an end portion of the first support part is exposed from the sealing member,
    wherein the sealing member has a first side extending along a first direction,
    wherein a second portion of the first lead projects from the first side of the sealing member in plan view,
    wherein the end portion of the first support part is exposed from the first side of the sealing member,
    wherein the sealing member has a second side extending along a second direction intersecting with the first direction, and
    wherein the first support part includes a bent part arranged between the end portion of the first support part and the first portion of the first support part, such that the bent part is bent closer to the main body part of the first conductive member than to the second side of the sealing member in plan view.

2. The semiconductor device according to claim 1,
    wherein the first support part includes a recess,
    wherein the first extension part of the first conductive member includes a projection, and
    wherein the first extension part of the first conductive member is fixed by inserting the projection of the first extension part into the recess of the first support part.

3. The semiconductor device according to claim 1,
    wherein the first extension part of the first conductive member is enclosed by the first chip mounting part in plan view, and
    wherein the first support part partially overlaps the first chip mounting part in plan view.

4. The semiconductor device according to claim 1, further comprising:
    a second semiconductor chip having a second front surface on which a second electrode pad and a signal electrode pad are formed, and mounted on the first chip mounting part;
    a second lead arranged in a region around the second semiconductor chip; and
    a wire which is electrically connected to the signal electrode pad of the second semiconductor chip and the second lead,
    wherein the first conductive member is electrically connected to the second electrode pad of the second semiconductor chip via a second conductive adhesive,
    wherein the sealing member seals the second semiconductor chip, the wire and a portion of the second lead, and has a third side opposite the first side in plan view,
    wherein a second portion of the second lead projects from the third side of the sealing member in plan view, and
    wherein the first extension part of the first conductive member is continuous to a portion of the main body part arranged between a first connection part of the first conductive member connected to the first electrode pad via the first conductive adhesive and a second connection part of the first conductive member connected to the second electrode pad via the second conductive adhesive.

5. The semiconductor device according to claim 4, further comprising:
    a second support part arranged opposite the first support part via the main body part of the first conductive member in plan view, and supporting the first conductive member,
    wherein the first conductive member includes a second extension part which is continuous to the main body part of the first conductive member and extends from the main body part in plan view,
    wherein a first portion of the second extension part is disposed in the sealing member so as to overlap a first portion of the second support part in the sealing member in plan view, and wherein an end portion of the second support part is exposed from the sealing member.

6. The semiconductor device according to claim 5,
wherein the second support part includes a recess,
wherein the second extension part of the first conductive member includes a projection, and
wherein the second extension part of the first conductive member is fixed by inserting the projection part of the second extension part into the recess of the second support part.

7. The semiconductor device according to claim 5,
wherein the second extension part of the first conductive member is continuous to a portion of the main body part of the first conductive member which is arranged between the first connection part and the second connection part.

8. The semiconductor device according to claim 1, further comprising:
a second semiconductor chip having a second front surface on which a second electrode pad and a signal electrode pad are formed;
a second chip mounting part on which the second semiconductor chip is mounted;
a second lead arranged in a region around the second semiconductor chip;
a third lead arranged the region around the first semiconductor chip and separated from the first lead;
a wire which is electrically connected to the signal electrode pad of the second semiconductor chip and the second lead;
a second conductive member which is electrically connected to the second electrode pad of the second semiconductor chip and the third lead via a second conductive adhesive; and
a second support part arranged over the second chip mounting part and supporting the second conductive member,
wherein the sealing member seals the second semiconductor chip, the wire, a portion of the second lead and a portion of the third lead, and has a third side opposite the first side in plan view,
wherein a second portion of the second lead projects from the third side of the sealing member in plan view,
wherein a second portion of the third lead projects from the first side of the sealing member in plan view,
wherein the second conductive member includes a main body part and a first extension part which is continuous to the main body part of the second conductive member and extends from the main body part of the second conductive member in plan view,
wherein a first portion of the first extension part of the second conductive member is disposed in the sealing member so as to overlap a first portion of the second support part in the sealing member in plan view, and
wherein an end portion of the second support part is exposed from the sealing member.

9. The semiconductor device according to claim 8,
wherein the end portion of the second support part is exposed from the third side of the sealing member.

10. The semiconductor device according to claim 9,
wherein the second support part includes a recess,
wherein the first extension part of the second conductive member includes a projection, and
wherein the first extension part of the second conductive member is fixed by inserting the projection of the first extension part of the second conductive member into the recess of the second support part.

11. The semiconductor device according to claim 10,
wherein the first extension part of the second conductive member is enclosed by the second chip mounting part in plan view, and
wherein the second support part partially overlaps the second chip mounting part in plan view.

* * * * *